(12) United States Patent
Takei et al.

(10) Patent No.: US 7,842,620 B2
(45) Date of Patent: Nov. 30, 2010

(54) METHOD FOR MANUFACTURING SEMICONDUCTOR DEVICE USING QUADRUPLE-LAYER LAMINATE

(75) Inventors: Satoshi Takei, Toyama (JP); Makoto Nakajima, Toyama (JP); Yasushi Sakaida, Toyama (JP); Hikaru Imamura, Toyama (JP); Keisuke Hashimoto, Toyama (JP); Takahiro Kishioka, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 12/311,742

(22) PCT Filed: Oct. 12, 2007

(86) PCT No.: PCT/JP2007/069973

§ 371 (c)(1),
(2), (4) Date: Jun. 3, 2009

(87) PCT Pub. No.: WO2008/047715

PCT Pub. Date: Apr. 24, 2008

(65) Prior Publication Data

US 2010/0022089 A1    Jan. 28, 2010

(30) Foreign Application Priority Data

Oct. 12, 2006  (JP) .............................. 2006-279060

(51) Int. Cl.
    *H01L 21/31* (2006.01)
(52) U.S. Cl. ..................................................... 438/761
(58) Field of Classification Search .................. None
    See application file for complete search history.

(56) References Cited

U.S. PATENT DOCUMENTS

| | | | | |
|---|---|---|---|---|
| 5,767,018 | A * | 6/1998 | Bell | 438/696 |
| 5,986,344 | A * | 11/1999 | Subramanion et al. | 257/760 |
| 6,103,456 | A * | 8/2000 | Tobben et al. | 430/317 |
| 6,207,573 | B1 * | 3/2001 | Lee | 438/700 |
| 6,287,752 | B1 | 9/2001 | Yoshikawa | |
| 6,309,955 | B1 * | 10/2001 | Subramanian et al. | 438/618 |
| 6,444,584 | B1 * | 9/2002 | Hsiao | 438/706 |
| 6,638,871 | B2 * | 10/2003 | Wang et al. | 438/694 |
| 6,797,610 | B1 * | 9/2004 | Gambino et al. | 438/637 |
| 6,878,646 | B1 * | 4/2005 | Tsai et al. | 438/756 |
| 6,890,448 | B2 * | 5/2005 | Pavelchek | 216/16 |
| 7,005,386 | B1 * | 2/2006 | Bell et al. | 438/709 |
| 7,015,133 | B2 * | 3/2006 | Su et al. | 438/618 |
| 7,078,350 | B2 * | 7/2006 | Kim et al. | 438/717 |
| 7,176,571 | B2 * | 2/2007 | Cheng et al. | 257/750 |
| 7,211,519 | B2 * | 5/2007 | Takigawa et al. | 438/736 |
| 2004/0137711 | A1 | 7/2004 | Deguchi | |
| 2004/0197709 | A1 | 10/2004 | Arase et al. | |
| 2004/0247900 | A1 | 12/2004 | Ogihara et al. | |
| 2006/0024945 | A1 | 2/2006 | Kim et al. | |
| 2006/0290429 | A1 | 12/2006 | Kishioka et al. | |
| 2007/0142617 | A1 | 6/2007 | Jung | |
| 2007/0154839 | A1 | 7/2007 | Jung | |

FOREIGN PATENT DOCUMENTS

| | | |
|---|---|---|
| JP | A-11-258813 | 9/1999 |
| JP | A-2000-232107 | 8/2000 |
| JP | A-2001-53068 | 2/2001 |
| JP | A-2002-47430 | 2/2002 |
| JP | A-2002-128847 | 5/2002 |
| JP | A-2003-297920 | 10/2003 |
| JP | A-2004-152997 | 5/2004 |
| JP | A-2005-15779 | 1/2005 |
| JP | A-2005-18054 | 1/2005 |
| JP | A-2005-55893 | 3/2005 |
| JP | A-2006-41486 | 2/2006 |
| JP | A-2007-161985 | 6/2007 |
| JP | A-2007-193308 | 8/2007 |
| WO | WO 02/05035 A1 | 1/2002 |
| WO | WO 03/017002 A1 | 2/2003 |
| WO | WO 2004/034148 A1 | 4/2004 |
| WO | WO 2005/098542 A1 | 10/2005 |
| WO | WO 2006/115074 A1 | 11/2006 |

OTHER PUBLICATIONS

Patterson et al., "Polymers for 157 nm Photoresist Applications: A Progress Report," Proceedings of SPIE, 2000, pp. 365-374, vol. 3999.
Crawford et al., "New Materials for 157 nm Photoresists: Characterization and Properties," Proceedings of SPIE, 2000, pp. 357-364, vol. 3999.
Schmaljohann et al., "Design Strategies for 157 nm Single-Layer Photoresists: Lithographic Evaluation of a Poly (α-trifluoromethyl vinyl alcohol) Copolymer," Proceedings of SPIE, 2000, pp. 330-334, vol. 3999.

* cited by examiner

*Primary Examiner*—Scott B Geyer
(74) *Attorney, Agent, or Firm*—Oliff & Berridge, PLC

(57) ABSTRACT

There is provided a laminate used as an underlayer layer for a photoresist in a lithography process of a semiconductor device and a method for manufacturing a semiconductor device by using the laminate. The method comprising: laminating each layer of an organic underlayer film (layer A), a silicon-containing hard mask (layer B), an organic antireflective film (layer C) and a photoresist film (layer D) in this order on a semiconductor substrate. The method also comprises: forming a resist pattern in the photoresist film (layer D); etching the organic antireflective film (layer C) with the resist pattern; etching the silicon-containing hard mask (layer B) with the patterned organic antireflective film (layer C); etching the organic underlayer film (layer A) with the patterned silicon-containing hard mask (layer B); and processing the semiconductor substrate with the patterned organic underlayer film (layer A).

10 Claims, No Drawings

METHOD FOR MANUFACTURING SEMICONDUCTOR DEVICE USING QUADRUPLE-LAYER LAMINATE

TECHNICAL FIELD

The present invention relates to a laminate used as an underlayer layer for a photoresist in a lithography process of a semiconductor device and a method for manufacturing a semiconductor device by using the laminate.

BACKGROUND ART

In the manufacture of a semiconductor device, micro processing by lithography using a photoresist has been performed. The micro processing is a processing method including forming a thin film of a photoresist on a semiconductor substrate such as silicon wafer, irradiating actinic rays such as ultra violet rays through a mask pattern on which a pattern for a semiconductor device is depicted to develop, and etching the substrate by using an obtained photoresist pattern as a protective film, thereby forming fine unevenness corresponding to the pattern on the surface of the substrate. However, in recent progress in high integration of semiconductor devices, shorter wavelength actinic rays tend to be used. For example, an ArF excimer laser (193 nm) has been taking place of a KrF excimer laser (248 nm). Along with this change, influence of reflection of actinic rays from a semiconductor substrate has become a serious problem. Accordingly, a method to provide an antireflective film (bottom anti-reflective coating) between the photoresist and the substrate has been widely studied to resolve the problem. For the anti-reflective coating, many studies have been made on an organic antireflective film made of a polymer having light absorption groups or the like due to the easiness of use or the like. For example, an acrylic resin type antireflective film having hydroxyl groups as cross-linking reaction groups and light absorption groups in the same molecule, a novolac resin type antireflective film having hydroxyl groups as cross-linking reaction groups and light absorption groups in the same molecule and the like are included.

As properties required for an antireflective film, the film has large absorption to light and radiation rays; the film causes no intermixing with a photoresist (insoluble in a photoresist solvent); the film does not cause diffusion of low molecular weight substances from the antireflective film to the upper layer of a photoresist during heating and baking; the film has a higher dry etching rate than that of a photoresist; and the like.

In recent years, in order to solve wiring delay which has become clear in accordance with miniaturization in a pattern rule of semiconductor devices, it has been considered to use copper as a wiring material. With the consideration, applying a dual damascene process as a wiring forming method on a semiconductor substrate has also been considered. In a dual damascene process, an antireflective film is formed on a substrate in which via holes are formed and which has a high aspect ratio. Therefore, the antireflective film used in this process is required to have filling property by which holes can be filled without gap, flattening property by which a flat coating is formed on the surface of a substrate, and the like.

However, it is difficult to apply materials for an organic-based antireflective film on a substrate having a high aspect ratio, and in recent years, materials with a particular emphasis on filling property or flattening property have been developed (see, for example, Patent Document 1, Patent Document 2, and Patent Document 3).

In addition, in recent years, a film known as a hard mask containing metal elements such as silicon and titanium has been used as an underlayer film disposed between a semiconductor substrate and a photoresist (see, for example, Patent Document 4, Patent Document 5, Patent Document 6 and Patent Document 7). In this case, since a photoresist and a hard mask have large difference in their constituent components, their removing rates by dry etching significantly depend on a type of gas used in the dry etching. The hard mask can be removed by dry etching without significant decrease of the film thickness of the photoresist by selecting an adequate type of gas. Therefore, it is considered that when the photoresist and the hard mask are used, sufficient film thickness as a protective film (which is formed with the photoresist and the hard mask) for semiconductor substrate processing can be ensured, even if the photoresist is a thin film.

Various polymers are used as a resist underlayer film in a lithography process (see, for example, Patent Document 8, Patent Document 9, Patent Document 10, and Patent Document 11).

[Patent Document 1]
  Japanese Patent Application Publication No. JP-A-2002-47430

[Patent Document 2]
  WO 02/05035 pamphlet

[Patent Document 3]
  Japanese Patent Application Publication No. JP-A-2002-128847

[Patent Document 4]
  Japanese Patent Application Publication No. JP-A-11-258813

[Patent Document 5]
  Japanese Patent Application Publication No. JP-A-2001-53068

[Patent Document 6]
  Japanese Patent Application Publication No. JP-A-2005-55893

[Patent Document 7]
  Japanese Patent Application Publication No. JP-A-2005-15779

[Patent Document 8]
  WO 03/017002 pamphlet

[Patent Document 9]
  WO 04/034148 pamphlet

[Patent Document 10]
  WO 05/098542 pamphlet

[Patent Document 11]
  WO 06/115074 pamphlet

DISCLOSURE OF THE INVENTION

Problem to be Solved by the Invention

The present invention provides a method for manufacturing a semiconductor device by using a laminate including each layer of an organic foundation layer, a silicon-containing hard mask, an organic antireflective film and a photoresist in this order on a semiconductor substrate.

In a method for manufacturing a semiconductor device according to the present invention, a semiconductor substrate is processed by using fine and precise resist patterns in a manner that diffusion of an acid during exposure of the photoresist is eliminated; a focus depth margin of a photoresist is improved; and a shape of a resist pattern is set to rectangle.

Means for Solving the Problem

According to a first aspect of the present invention, a method for manufacturing a semiconductor device that includes laminating each layer of an organic underlayer film (layer A), a silicon-containing hard mask (layer B), an organic antireflective film (layer C), and a photoresist film (layer D) in this order on a semiconductor substrate;

according to a second aspect, a method for manufacturing a semiconductor device that includes forming an organic underlayer film (layer A) on a semiconductor substrate, forming a silicon-containing hard mask (layer B) on the top thereof, forming an organic antireflective film (layer C) on the top thereof, and forming a photoresist film (layer D) on the top thereof, forming a resist pattern in the photoresist film (layer D) by exposure and development, etching the organic antireflective film (layer C) with the resist pattern, etching the silicon-containing hard mask (layer B) with the patterned organic antireflective film (layer C), etching the organic underlayer film (layer A) with the patterned silicon-containing hard mask (layer B), and processing the semiconductor substrate with the patterned organic underlayer film (layer A);

according to a third aspect, in the method for manufacturing a semiconductor device according to the first or the second aspect, the organic underlayer film (layer A) has a film thickness of 50 to 500 nm; the silicon-containing hard mask (layer B) has a film thickness of 50 to 200 nm; the organic antireflective film (layer C) has a film thickness of 10 to 100 nm; and a film thickness ratio of layer A:layer B:layer C is a ratio of 1 to 10:1 to 5:1;

according to a fourth aspect, in the method for manufacturing a semiconductor device according to any one of the first to the third aspect, the organic underlayer film (layer A) is a layer including a polymer having an aromatic condensed ring in a main chain or a side chain bonded to the main chain;

according to a fifth aspect, in the method for manufacturing a semiconductor device according to any one of the first to the fourth aspect, the organic underlayer film (layer A) is a layer including a polymer having a naphthalene ring in a main chain or a side chain bonded to the main chain;

according to a sixth aspect, in the method for manufacturing a semiconductor device according to any one of the first to the fifth aspect, the silicon-containing hard mask (layer B) has a silicon content of 15 to 45% by mass in the silicon-containing hard mask (layer B);

according to a seventh aspect, in the method for manufacturing a semiconductor device according to any one of the first to the sixth aspect, the silicon-containing hard mask (layer B) is a layer including a polymer containing a polysilane, a polysiloxane, a polycarbosilane or a combination thereof;

according to an eighth aspect, in the method for manufacturing a semiconductor device according to any one of the first to the seventh aspect, the silicon-containing hard mask (layer B) is a layer including a polymer containing a polycarbosilane, and a polysilane, a polysiloxane or a combination thereof;

according to a ninth aspect, in the method for manufacturing a semiconductor device according to any one of the first to the eighth aspect, the organic antireflective film (layer C) includes a polymer in which a molecular structure of the polymer contained in the organic antireflective film (layer C) is similar to a molecular structure of a polymer contained in the photoresist film (layer D);

according to a tenth aspect, in the method for manufacturing a semiconductor device according to any one of the first to the ninth aspect, the organic antireflective film (layer C) is a layer including a polymer having a benzene ring, a heterocyclic ring or a combination thereof in a main chain constituting the polymer or a side chain bonded to the main chain;

according to an eleventh aspect, in the method for manufacturing a semiconductor device according to the tenth aspect, the heterocyclic ring contained in the polymer of the organic antireflective film (layer C) is a lactone ring; and according to a twelfth aspect, in the method for manufacturing a semiconductor device according to any one of the first to the eleventh aspect, the organic antireflective film (layer C) includes a polymer having a content ratio of the benzene ring of 30 to 70% by mass.

EFFECTS OF THE INVENTION

In a method for manufacturing a semiconductor device according to the present invention including laminating each layer of an organic underlayer film (layer A), a silicon-containing hard mask (layer B), an organic antireflective film (layer C) and a photoresist film (layer D) in this order on a semiconductor substrate, at least four layers described above are laminated. In the micro processing using a KrF excimer laser (wave length: 248 nm), an ArF excimer laser (wave length: 193 nm), and the like, since a wiring width becomes narrow, pattern collapse of a photoresist (or simply referred to as a resist) occurs. In order to avoid the pattern collapse of the resist, a thickness of the resist layer has become thinner with decrease of the wiring width. When such a thin resist film is used, the dry etching rate of the resist underlayer film is also required to be further enhanced. However, for an organic based resist underlayer film to an organic based resist, a dry etching gas (for example, a fluorine type gas or oxygen gas) for the organic based resist underlayer film causes decrease of a thickness of the organic based resist film. On the other hand, in the case of a silicon-containing hard mask layer is used for a foundation layer of an organic based resist film, when the silicon-containing hard mask (layer B) is dry etched with a fluorine type gas, decrease of a thickness of the organic based resist film (resist-pattern formed resist film (layer D)) is small in the case of using a fluorine type gas. As a result, the resist pattern according to the thin resist film can be precisely transferred to the silicon-containing hard mask (layer B). Furthermore, when the organic underlayer film (layer A) is dry etched with an oxygen-type dry etching gas, decrease of a thickness of the silicon-containing hard mask (layer B) is small and the resist pattern can be precisely transferred to the organic underlayer film (layer A). A semiconductor substrate can be processed with a fluorine type gas by using the organic underlayer film (layer A) to which the resist pattern is transferred.

However, a triple-layer laminate formed by laminating an organic underlayer film (layer A), a silicon-containing hard mask (layer B), and a resist film (layer D) in this order on a semiconductor substrate as described above has two problems. One is that adherence between the silicon-containing hard mask (layer B) and the resist film (layer D) thereon is not sufficient. The other problem is that a resist shape is not formed in rectangle, because acid generated from a photoacid generator during exposure of the resist film is diffused into the silicon-containing hard mask (layer B). In the manufacture of a semiconductor device using such a triple-layer laminate, the above-described problems can be solved in a manner that an organic antireflective film (layer C) is disposed between the silicon-containing hard mask (layer B) and the resist film (layer D). That is, the adherence between the organic antireflective film (layer C) and the resist film (layer D) is significantly improved in a manner that the organic antireflective film (layer C) is made to have a chemical structure that is quite similar to the resist film (for example, a polymer of the organic antireflective film (layer C) has benzene rings or lactone rings which are specific for a polymer of the resist film (layer D)), and whereby a focus depth margin during exposure of the resist film can be significantly improved. In addition, the diffusion of an acid generated from a photoacid generator during exposure of the resist film to the silicon-containing hard mask (layer B) can be prevented in a manner that the organic antireflective film (layer C) is disposed between the silicon-containing hard mask (layer B) and the resist film (layer D). As a result, a resist pattern can be formed in rectangle. Moreover, since the organic antireflective film (layer C) is thinner than the organic underlayer film (layer A) or the silicon-containing hard mask (layer B), the decrease of a thickness of the resist film does not occur when the resist film (layer D) in which the resist pattern is formed is dry etched (for example, a dry etching using a fluorine type gas or oxygen gas), and the resist pattern can be precisely transferred to the organic antireflective film (layer C).

According to the present invention, processing of a semiconductor substrate having a fine wiring width becomes possible by using such a quadruple-layer laminate.

BEST MODES FOR CARRYING OUT THE INVENTION

The present invention includes a method for manufacturing a semiconductor device by using a laminate including each layer of an organic underlayer film (layer A), a silicon-containing hard mask (layer B), an organic antireflective film (layer C) and a photoresist film (layer D) in this order on a semiconductor substrate.

The organic underlayer film (layer A) used in the present invention is a layer including a polymer having aromatic condensed rings in a main chain or a side chain bonded to the main chain constituting the polymer. The aromatic condensed ring includes a naphthalene ring and an anthracene ring.

This organic underlayer film (layer A) is a layer including a polymer having naphthalene rings in a main chain or a side chain bonded to the main chain. Particularly, a layer including a polymer having naphthalene rings in the side chain bonded to the main chain is preferable.

The organic underlayer film (layer A) is obtained in a manner that an organic underlayer film (layer A) forming composition including a polymer (a) having naphthalene rings in the side chain bonded to the main chain and a solvent, and as necessary including a cross-linking agent, an acid, an acid generator, a surfactant is applied on a semiconductor substrate and the solvent is removed. A solid content in the organic underlayer film (layer A) forming composition is 0.1 to 70% by mass, or 1 to 50% by mass, or 5 to 40% by mass, or 10 to 30% by mass. The solid content means components in which the solvent component is removed from the total components of the organic underlayer film (layer A) forming composition. In the entire solid content, the polymer (a) is contained in 10% by mass or more, for example, 30 to 99% by mass, or 50 to 99% by mass, or 65 to 99% by mass.

The polymer (a) has a weight average molecular weight of 100 to 1000000, preferably 1000 to 200000.

The polymer (a) is a polymer in which each ratio of a unit structure (number) of the formula (a1) and a unit structure (number) of the formula (a2) to the total unit structures (number) constituting the polymer is 0.02 or more, preferably 0.05 or more,

[Chemical Formula 1]

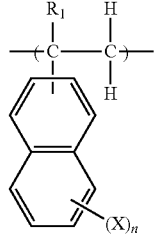

Formula (a1)

(where $R_1$ represents a hydrogen atom or a methyl group; X is a halogen atom, a hydroxyl group, an alkyl group, an alkoxy group, a thiol group, a cyano group, a carboxyl group, an amino group, an amide group, an alkoxycarbonyl group or a thioalkyl group substituted on a naphthalene ring; and n represents an integer of 0 to 7, when n is other than 7, part(s) of the naphthalene ring which is not substituted with X are substituted with hydrogen atom(s)), and

[Chemical Formula 2]

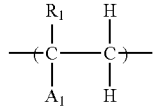

Formula (a2)

(where $R_1$ means the same as $R_1$ defined in the formula (a1), and $A_1$ is an organic group containing an aromatic hydroxyl group or a hydroxyl group containing ester).

In the polymer containing the unit structure of the formula (a1) and the unit structure of the formula (a2), sum of ratios of each unit structure (number) to the total unit structures (number) constituting the polymer is 1.00. It is required that each ratio of a unit structure (number) of the formula (a1) and a unit structure (number) of the formula (a2) to the total unit structures (number) constituting the polymer is 0.02 or more, preferably 0.05 or more. Other monomers can be copolymerized as long as these monomers can be copolymerized with monomers of unit structures of the formula (a1) and the formula (a2). In this case, sum of ratios of each unit structure (number) to the total unit structures (number) constituting the polymer is also 1.00.

When the ratios of the unit structure (number) of the formula (a1) and the formula (a2) in the entire polymer satisfy the requirement, the above-described polymer may be a block copolymer, an alternating copolymer or a random copolymer.

In a unit structure of the formula (a1), $R_1$ represents a hydrogen atom or a methyl group; X is a halogen atom, a hydroxyl group, an alkyl group, an alkoxy group, a thiol group, a cyano group, a carboxyl group, an amino group, an amide group, an alkoxycarbonyl group or a thioalkyl group substituted on a naphthalene ring; n represents an integer 0 to 7; when n is other than 7, the remaining part(s) are hydrogen atom(s). The unit structure of the formula (a1) is preferably 2-vinyl naphthalene or a condensation product of derivatives of the 2-vinyl naphthalene.

For X, a fluorine atom, a chlorine atom, a bromine atom and an iodine atom can be used as the halogen atom. Examples of alkyl groups include alkyl groups having a linear or branched chain and having carbon atom(s) of 1 to 6, and they may be substituted with halogen atoms or the like. For example, a methyl group, an ethyl group, a propyl group, an isopropyl group, a butyl group, a t-butyl group, an n-hexyl group, and a chloromethyl group are included. Examples of alkoxy groups include alkoxy groups having carbon atom(s) of 1 to 6. For example, a methoxy group, an ethoxy group, and an isopropoxy group are included. Examples of amide groups include amide having carbon atom(s) of 1 to 12. For example, a formamide group, an acetamide group, a propionamide group, an isobutylamide group, a benzamide group, a naphthylamide group, and an acrylamide group are included. Examples of alkoxycarbonyl groups include alkoxycarbonyl groups having carbon atom(s) of 1 to 12. For example, a methoxycarbonyl group, an ethoxycarbonyl group, and a benzyloxycarbonyl group are included. Examples of thioalkyl groups include thioalkyl groups having carbon atom(s) of 1 to 6. For example, a methylthio group, an ethylthio group, a butylthio group, and a hexylthio group are included.

The unit structure of the formula (a1) in the polymer shows a high etching resistance during processing and the unit structure of the formula (a2) forms a cross-linking bond of hydrogen groups or between a hydrogen group and a cross-linkable compound. Selecting ratio of a dry etching rate of the polymer that is smaller compared to a semiconductor substrate can be obtained in a manner that a ratio of the unit structure (number) of the formula (a1) in the total unit structures (number) constituting the polymer is set to 0.4 to 0.98, and a ratio of the unit structure (number) of the formula (a2) in those is set to 0.02 to 0.6. That is, a dry etching resistance is improved.

Specific examples of these unit structures of the formula (a1) are shown below.

[Chemical Formula 3]

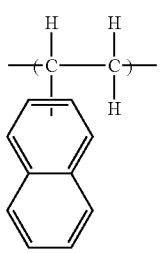

Formula (a1-1)

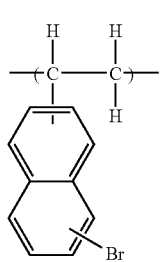

Formula (a1-2)

-continued

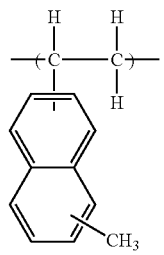

Formula (a1-3)

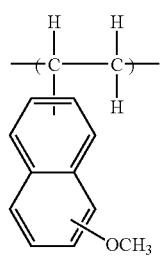

Formula (a1-4)

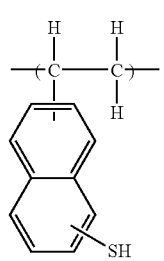

Formula (a1-5)

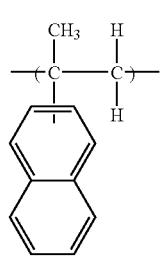

Formula (a1-6)

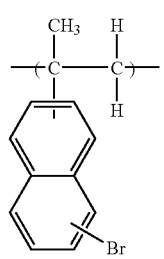

Formula (a1-7)

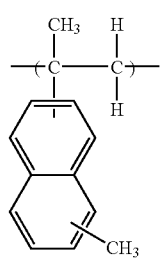

Formula (a1-8)

-continued
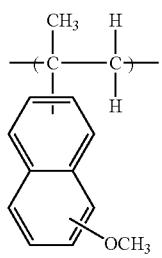
Formula (a1-9)
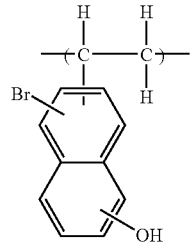
Formula (a1-15)
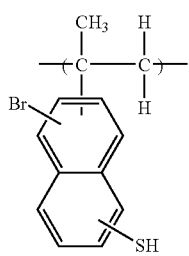
Formula (a1-10)
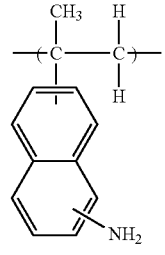
Formula (a1-16)
[Chemical Formula 4]
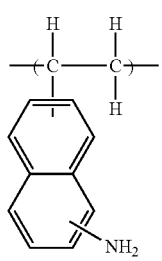
Formula (a1-11)
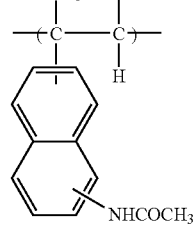
Formula (a1-17)
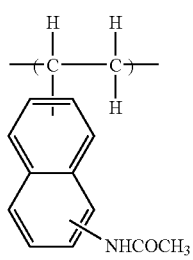
Formula (a1-12)
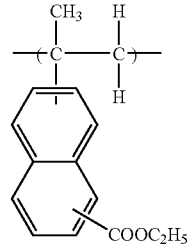
Formula (a1-18)
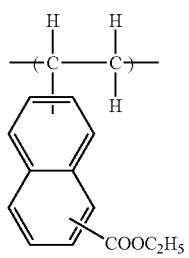
Formula (a1-13)
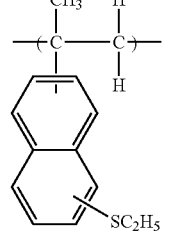
Formula (a1-19)
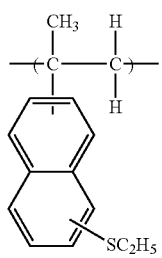
Formula (a1-14)
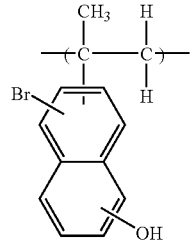
Formula (a1-20)
For the unit structure of the formula (a2), $R_1$ means the same $R_1$ as defined in the formula (a1), and $A_1$ is an organic group including an aromatic hydroxyl group or an organic group including a hydroxyl group containing ester. $A_1$ is preferably an organic group including a hydroxyl group containing ester.

For $A_1$, examples of organic groups having an aromatic hydroxyl group include organic groups containing an aromatic ring having 1 to 4 hydroxyl group(s), and examples of the aromatic ring include a benzene ring, a naphthalene ring, an anthracene ring, an imidazole ring, a pyridine ring, and a thiophene ring. Examples of organic groups having a hydroxyl group containing ester group include organic groups having a hydroxyl group containing ester generated by the reaction of a carboxyl group containing resin with an aliphatic polyalcohol, an alicyclic polyalcohol, or an aromatic polyalcohol; organic groups having a hydroxyl group containing ester formed by hydrolysis of an epoxy resin obtained by the reaction of a carboxyl group containing resin with epichlorohydrins; and organic groups obtained by further reaction of an aromatic carboxylic acid and an alicyclic carboxylic acid with an epoxy resin obtained by the reaction of a carboxyl group containing resin with epichlorohydrins. The unit structure of the formula (a2) is preferably a polymer of 2-hydroxyethyl acrylate or 2-hydroxyethyl methacrylate.

Specific examples of the unit structures of the formula (a2) are shown below.

[Chemical Formula 5]

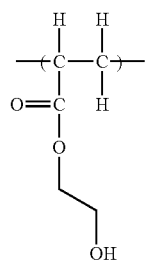

Formula (a2-1)

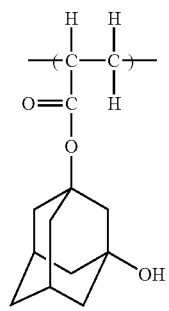

Formula (a2-2)

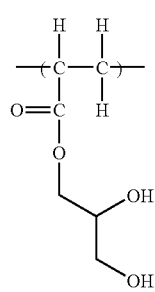

Formula (a2-3)

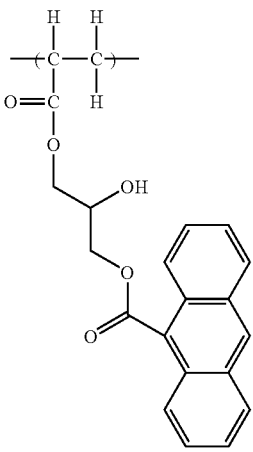

Formula (a2-4)

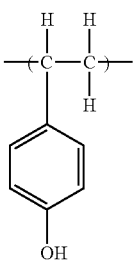

Formula (a2-5)

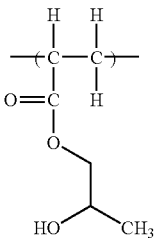

Formula (a2-6)

[Chemical Formula 6]

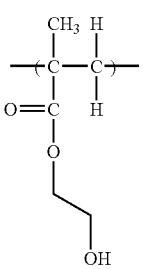

Formula (a2-7)

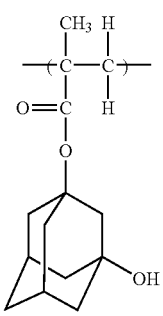

Formula (a2-8)

-continued

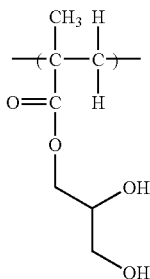

Formula (a2-9)

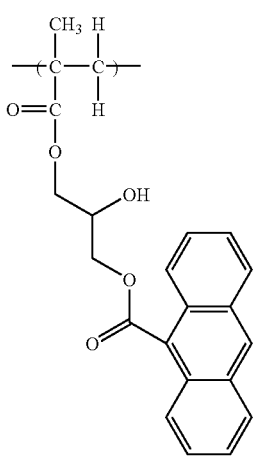

Formula (a2-10)

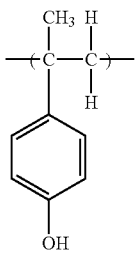

Formula (a2-11)

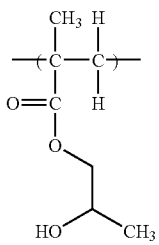

Formula (a2-12)

In addition, a polymer in which each ratio of a unit structure (number) of the formula (a1), a unit structure (number) of the formula (a2) and a unit structure (number) of the formula (a3) in the total unit structures (number) constituting the polymer is 0.02 or more can be used as an organic underlayer film (A) forming composition. Light absorbance of the underlayer film can be adjusted without significant decrease of a dry etching resistance by introducing the unit structure of the formula (a3):

[Chemical Formula 7]

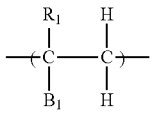

Formula (a3)

(where $R_1$ means the same as $R_1$ defined in the formula (a1), and $B_1$ is an organic group including an aliphatic cyclic compound containing ester or an aromatic compound containing ester).

For $B_1$, an organic group including an aliphatic cyclic compound containing ester or an aromatic compound containing ester is, for example, an organic group obtained by the reaction of a carboxyl group containing resin with an alcohol of an aliphatic cyclic compound or an aromatic compound.

Examples of aliphatic cyclic compounds contained in aliphatic cyclic compound containing esters include compounds such as cycloalkanes and cycloalkenes having carbon atoms of 3 to 20, norbornene derivatives, and adamantine derivatives.

Examples of cycloalkanes include a substituted or unsubstituted cyclopropane, cyclobutane, cyclohexane, and cyclononane. Examples of cycloalkenes include a substituted or unsubstituted cyclopropene, cyclobutene, cyclohexene, and cyclonenane. Examples of norbornene derivatives include a substituted or unsubstituted norbornene. Examples of adamantine derivatives include a substituted or unsubstituted adamantine, diamantine, and triamantine.

Moreover, examples of aromatic compounds contained in aromatic compound containing esters include a substituted or unsubstituted benzene ring and anthracene ring. Examples of substituents in the aromatic compounds include X as defined above, and the substituents X can be substituted up to a maximum substitutionable number in each of a benzene ring, an anthracene ring and the like.

In the polymer containing a unit structure of the formula (a1), a unit structure of the formula (a2) and a unit structure of the formula (a3), sum of ratios of each unit structure (number) to the total unit structures (number) constituting the polymer is 1.00. It is required that each ratio of a unit structure (number) of the formula (a1), a unit structure (number) of the formula (a2) and a unit structure (number) of the formula (a3) to the total unit structures (number) constituting the polymer is 0.02 or more, and other monomers can be copolymerized as long as these monomers can be copolymerized with monomers of unit structures of the formula (a1), the formula (a2) and the formula (a3). In this case, sum of ratios of each unit structure (number) to the total unit structures (number) constituting the polymer is 1.00.

When the ratios of the unit structure (number) of the formula (a1), the formula (a2) and the formula (a3) in the entire polymer satisfy the requirement, the above-described polymer may be a block copolymer, an alternating copolymer or a random copolymer.

A polymer in which the ratios of the unit structure (number) of the formula (a1), the formula (a2) and the formula (a3) to the total unit structures (number) constituting the polymer are set to 0.4 to 0.96, 0.02 to 0.58 and 0.02 to 0.58, respectively, can be formed.

In the formula of the formula (a3), $R_1$ means the same as $R_1$ defined in the formula (a1), and $B_1$ is an organic group including an aliphatic cyclic compound containing ester or an aromatic compound containing ester.

For $B_1$, for example, the organic group including the aliphatic cyclic compound containing ester or the aromatic compound containing ester is an organic group obtained by the reaction of a carboxyl group containing resin with an alcohol of aliphatic cyclic compound or an aromatic compound.

Specific examples of the unit structures of the formula (a3) are shown below.

[Chemical Formula 8]

Formula (a3-1)

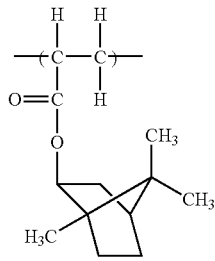

Formula (a3-2)

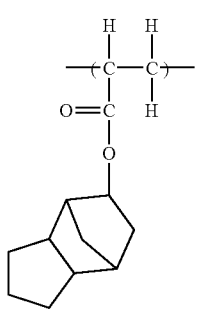

Formula (a3-3)

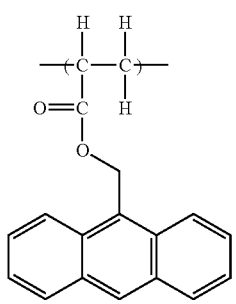

Formula (a3-4)

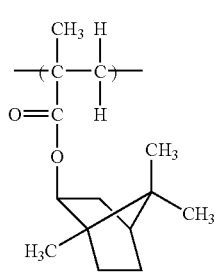

Formula (a3-5)

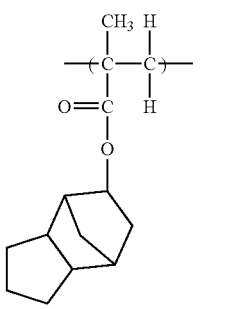

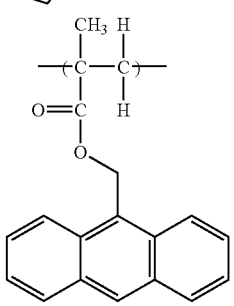

In addition, a polymer in which each ratio of a unit structure (number) of the formula (a1), a unit structure (number) of the formula (a2) and a unit structure (number) of a formula (a4) in the total unit structures (number) constituting the polymer is 0.02 or more can be used as an organic underlayer film forming composition. Light absorbance of an underlayer film can be adjusted without significant decrease of a dry etching resistance by introducing the unit structure of the formula (a4):

[Chemical Formula 9]    Formula (a4)

(where $R_1$ means the same as $R_1$ defined in the formula (a1), and $B_2$ is a substituted or unsubstituted benzene ring or an anthracene ring).

In the polymer including a unit structure of the formula (a1), a unit structure of the formula (a2) and a unit structure of the formula (a4), sum of ratios of each unit structure (number) to the total unit structures (number) constituting the polymer is 1.00. It is required that each ratio of the unit structure (number) of the formula (a1), the unit structure (number) of the formula (a2) and the unit structure (number) of the formula (a4) to the total unit structures (number) constituting the polymer is 0.02 or more, and other monomers can be copolymerized as long as these monomers can be copolymerized with monomers of unit structures of the formula (a1), the formula (a2) and the formula (a4). In this case, sum of ratios of each unit structure (number) to the total unit structures (number) constituting the polymer is 1.00.

When the ratios of the unit structure (number) of the formula (a1), the formula (a2) and the formula (a4) in the entire polymer satisfy the requirement, the above-described polymer may be a block copolymer, an alternating copolymer or a random copolymer.

A polymer in which the ratios of the unit structure (number) of the formula (a1), the formula (a2), and the formula (a4) to the total unit structures (number) constituting the polymer are set to 0.4 to 0.96, 0.02 to 0.58 and 0.02 to 0.58, respectively, can be formed.

In the formula of the formula (a4), $R_1$ means the same $R_1$ as defined in the formula (a1), and $B_2$ is a substituted or unsubstituted benzene ring or an anthracene ring Examples of substituents in a benzene ring or an anthracene ring include X as described above, and the substituents X can be substituted up to a maximum substitutionable number in each of a benzene ring and an anthracene ring.

Specific examples of the unit structures of the formula (a4) are shown below.

[Chemical Formula 10]

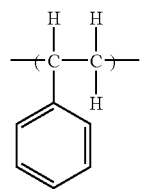

Formula (a4-1)

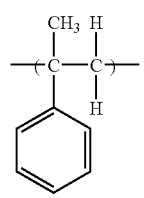

Formula (a4-2)

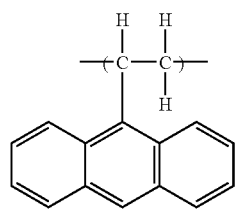

Formula (a4-3)

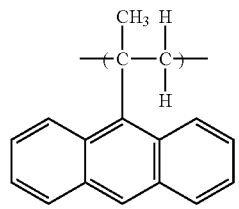

Formula (a4-4)

For the polymer constituted as described above, specific examples can be shown as follows.

That is, examples of the polymer include a polymer in which a ratio of a unit structure (number) between the formula (a1-1) and the formula (a2-1) in the polymer is 0.9:0.1;

a polymer in which a ratio of a unit structure (number) between the formula (a1-1) and the formula (a2-8) in the polymer is 0.4:0.6;

a polymer in which a ratio of a unit structure (number) between the formula (a1-1) and the formula (a2-10) in the polymer is 0.9:0.1;

a polymer in which a ratio of a unit structure (number) between the formula (a1-1), the formula (a2-7) and the formula (a3-6) in the polymer is 0.4:0.2:0.4; and a polymer in which a ratio of a unit structure (number) between the formula (a1-1), the formula (a2-5) and the formula (a4-1) in the polymer is 0.6:0.2:0.2.

A polymer in which substituents in the unit structure of the formula (a1) are 2-vinylnaphthalene or 2-isopropenylnaphthalene; the unit structure of the formula (a2) are 2-hydroxyalkyl acrylate or 2-hydroxyalkyl methacrylate; a ratio of the unit structure (number) of the formula (a1) in the total unit structures (number) constituting the polymer is 0.9; and the unit structure (number) of the formula (a2) to the total unit structure (number) constituting the polymer is 0.1 can be mentioned as preferable examples.

For the organic underlayer film (A) forming composition used in the present invention, since the composition is preferably cross-linked by heating after application for the purpose of avoiding intermixing to a silicon-containing hard mask that is overcoated, the organic underlayer film (A) forming composition can further contain a cross-linking agent component. Examples of the cross-linking agents include a melamine type, a substituted urea type, and a polymer type thereof. Preferably, the cross-linking agents are cross-linking agents having at least two cross-link forming substituents which are compounds such as methoxymethylated glycoluryl, butoxymethylated glycoluryl, methoxymethylated melamine, butoxymethylated melamine, methoxymethylbenzoguanamine, butoxymethylbenzoguanamine, methoxymethylurea, butoxymethylurea, methoxymethylthiourea or butoxymethylthiourea. In addition, condensates of these compounds can also be used. Although an added amount of the cross-linking agent varies depending on an application solvent used, a substrate used, a required solution viscosity, a required film shape and the like, the amount to the total solid content is 0.001 to 80% by mass, preferably 0.01 to 50% by mass, and more preferably 0.05 to 40% by mass. These cross-linking agents may cause cross-linking reaction due to self-condensation. However, when crosslinkable substituents exist in the above-described polymer according to the present invention, these agents can cause cross-linking reaction with these crosslinkable substituents.

For catalysts promoting the above-described cross-linking reaction, acidic compounds such as p-toluenesulfonic acid, trifluoromethanesulfonic acid, pyridinium p-toluenesulfonic acid, salicylic acid, sulfosalicylic acid, citric acid, benzoic acid, hydroxybenzoic acid and naphthalene carboxylic acid and/or heat acid generators such as 2,4,4,6-tetrabromocyclohexadienone, benzoin tosylate, 2-nitrobenzyl tosylate and other organic alkyl sulfonate esters can be formulated. Formulation amount to the total solid content is 0.0001 to 20% by mass, preferably 0.0005 to 10% by mass.

Photoacid generators can be added to the organic underlayer film (A) forming composition used in the present invention. Examples of preferable photoacid generators include onium salt type photoacid generators such as bis(4-t-butylphenyl)iodonium trifluoromethanesulfonate and triphenylsulfonium trifluoromethanesulfonate, halogen containing compound type photoacid generators such as phenyl-bis(trichloromethyl)-s-triazine, sulfonic acid type photoacid generators such as benzoin tosylate and N-hydroxysuccinimide trifluoromethanesulfonate. A content of the photoacid generators to the total solid content is 0.2 to 10% by mass, preferably 0.4 to 5% by mass.

For solvents dissolving the polymers (a), cross-linking agent components, cross-linking catalysts and the like, ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate and the like can be used. These organic solvents can be used singly or in combination of two or more types.

Moreover, high boiling point solvents such as propylene glycol monobutyl ether and propylene glycol monobutyl ether acetate can be used by mixing. In these solvents, propylene glycol monomethyl ether, propylene glycol monomethyl ether acetate, ethyl lactate, butyl lactate, cyclohexanone and the like are preferable for improving leveling property.

In a silicon-containing hard mask (layer B) used in the present invention, a silicon content of the silicon-containing hard mask (layer B) is 15 to 45% by mass. A silicon component is derived from a silicon-containing polymer (b).

As the silicon-containing polymer (b), a polysilane (b1), a polysiloxane (b2) or a polycarbosilane (b3) can be used singly or in combination thereof.

This silicon-containing hard mask (layer B) includes a silicon-containing polymer (b) having a polysilane (b1), a polysiloxane (b2), a polycarbosilane (b3) or a combination thereof. In addition, the silicon-containing hard mask (layer B) can contain a silicon-containing polymer (b) having a polycarbosilane (b3) and a polysilane (b1), a polysiloxane (b2) or a combination thereof.

For the silicon-containing hard mask (layer B), the silicon-containing hard mask (layer B) is formed in a manner that a silicon-containing hard mask (layer B) forming composition is applied on an organic underlayer film (layer A) and the solvent therein is removed by drying.

The silicon-containing hard mask (layer B) forming composition contains the silicon-containing polymer (b), a cross-linking catalyst and a solvent.

Although a ratio of the solid content in the silicon-containing hard mask (layer B) forming composition used in the present invention is not particularly limited as long as each component is uniformly dissolved, the content is, for example, 1 to 50% by mass, or 5 to 40% by mass, or 10 to 30% by mass. Here, the solid content means components in which the solvent component is removed from the total components of the silicon-containing hard mask (layer B) forming composition.

In the silicon-containing hard mask (layer B) forming composition, a content of the silicon-containing polymer (b) per the solid content is 10% by mass or more, for example, 30% by mass to 99% by mass, or for example, 50% by mass to 99% by mass, or for example, 65% by mass to 99% by mass.

When a polycarbosilane is contained in the silicon-containing polymer (b), a mass ratio of a polysilane (b1), a polysiloxane (b2) or a total amount of a combination thereof (b1+b2) to a polycarbosilane (b3) is a ratio of 1 to 10000 parts by mass of (b11+b2) to 100 parts by mass of (b3). In addition, 1 to 10000 parts by mass of (b2) is formulated relative to 100 parts by mass of (b1).

The polysilane resin (b11) has a formula (b1-1):

[Chemical Formula 11]

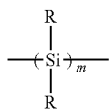

Formula (b1-1)

(where each R independently represents a hydrogen atom, a hydroxyl group, a cyclic or chain alkyl group having carbon atom(s) of 1 to 10, an alkoxy group having carbon atom(s) of 1 to 10, an aralkyl group having carbon atoms of 7 to 15, an aryl group having carbon atoms of 6 to 14, an aryloxyalkyl group having carbon atoms of 7 to 15, an alkenyl group having carbon atoms of 2 to 10 or an alkoxyalkyl group having carbon atoms of 2 to 10, and m is the number of repeating units and represents 10 to 300), a formula (b1-2):

[Chemical Formula 12]

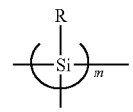

Formula (b1-2)

(where R and m mean the same as defined in the formula (b1-1)), or a combination thereof.

In the formula (b1-1) and the formula (b1-2), each R independently represents a hydrogen atom, a hydroxyl group, a cyclic or chain alkyl group having carbon atom(s) of 1 to 10, an alkoxy group having carbon atom(s) of 1 to 10, an aralkyl group having carbon atoms of 7 to 15, an aryl group having carbon atoms of 6 to 14, an aryloxyalkyl group having carbon atoms of 7 to 15, an alkenyl group having carbon atoms of 2 to 10, an alkoxyalkyl group having carbon atoms of 2 to 10.

Alkyl groups include a cyclic or chain alkyl group.

Examples of cyclic alkyl groups having carbon atom(s) of 1 to 10 include cyclopropyl, cyclobutyl, 1-methyl-cyclopropyl, 2-methyl-cyclopropyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl.

Chain alkyl groups having carbon atom(s) of 1 to 10 are alkyl groups having a linear chain or a branched chain and include, for example, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Examples of alkoxy groups having carbon atom(s) of 1 to 10 include methoxy, ethoxy, n-propoxy, i-propoxy, n-butoxy, i-butoxy, s-butoxy, t-butoxy, n-pentoxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy, and 1-ethyl-2-methyl-n-propoxy.

Examples of aralkyl groups having carbon atoms of 7 to 15 include a benzyl group, an o-methylbenzyl group, a m-methylbenzyl group, a p-methylbenzyl group, an o-chlorobenzyl group, a m-chlorobenzyl group, a p-chlorobenzyl group, an o-fluorobenzyl group, a p-fluorobenzyl group, an o-methoxybenzyl group, a p-methoxybenzyl group, a p-nitrobenzyl group, a p-cyanobenzyl group, a phenethyl group, an o-methylphenethyl group, a m-methylphenethyl group, a p-methylphenethyl group, an o-chlorophenethyl group, a m-chlorophenethyl group, a p-chlorophenethyl group, an o-fluorophenethyl group, a p-fluorophenethyl group, an o-methoxyphenethyl group, a p-methoxyphenethyl group, a p-nitrophenethyl group, a p-cyanophenethyl group, a 3-phenylpropyl group, a 4-phenylbutyl group, a 5-phenylpentyl group, a 6-phenylhexyl group, an α-naphthylmethyl group, a β-naphthylmethyl group, an o-biphenylylmethyl group, a m-biphenylylmethyl group, a p-biphenylylmethyl group, a 1-anthrylmethyl group, a 2-anthrylmethyl group, a 9-anthrylmethyl group, a 1-phenanthrylmethyl group, a 2-phenanthrylmethyl group, a 3-phenanthrylmethyl group, a 4-phenanthrylmethyl group, a 9-phenanthrylmethyl group, an α-naphthylethyl group, a β-naphthylethyl group, an o-biphenylylethyl group, a m-biphenylylethyl group, a p-biphenylylethyl group, a 1-anthrylethyl group, a 2-anthrylethyl group, a 9-anthrylethyl group, a 1-phenanthrylethyl group, a 2-phenanthrylethyl group, a 3-phenanthrylethyl group, a 4-phenanthrylethyl group, and a 9-phenanthrylethyl group.

Examples of aryl groups having carbon atoms of 6 to 14 include a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of aryloxyalkyl groups having carbon atoms of 7 to 15 include a phenyloxymethyl group, an o-methyl-phenyloxyethyl group, a m-methyl-phenyloxymethyl group, a p-methyl-phenyloxypropyl group, an o-chlorophenyloxymethyl group, a m-chlorophenyloxyethyl group, a p-chlorophenyloxy isopropyl group, an o-fluorophenyloxyethyl group, a p-fluorophenyloxybutoxy group, an o-methoxyphenyloxy-n-pentyl group, a p-methoxyphenyloxy-t-butyl group, a p-nitrophenyloxymethyl group, a p-cyanophenyloxy-s-butyl group, an α-naphthyloxymethyl group, a β-naphthyloxyethyl group, an o-biphenylyloxymethyl group, a m-biphenylyloxymethyl group, a p-biphenylyloxymethyl group, a 1-anthryloxymethyl group, a 2-anthryloxymethyl group, a 9-anthryoxymethyll group, a 1-phenanthryloxymethyl group, a 2-phenanthryloxymethyl group, a 3-phenanthryloxymethyl group, a 4-phenanthryloxymethyl group, and a 9-phenanthryloxymethyl group.

Examples of alkenyl groups having carbon atoms of 2 to 10 include ethenyl, 1-propenyl, 2-propenyl, 1-methyl-1-ethenyl, 1-butenyl, 2-butenyl, 3-butenyl, 2-methyl-1-propenyl, 2-methyl-2-propenyl, 1-ethylethenyl, 1-methyl-1-propenyl, 1-methyl-2-propenyl, 1-pentenyl, 2-pentenyl, 3-pentenyl, 4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl-1-propenyl, 1,2-dimethyl-2-propenyl, 1-cyclopentenyl, 2-cyclopentenyl, 3-cyclopentenyl, 1-hexenyl, 2-hexenyl, 3-hexenyl, 4-hexenyl, 5-hexenyl, 1-methyl-1-pentenyl, 1-methyl-2-pentenyl, 1-methyl-3-pentenyl, 1-methyl-4-pentenyl, 1-n-butylethenyl, 2-methyl-1-pentenyl, 2-methyl-2-pentenyl, 2-methyl-3-pentenyl, 2-methyl-4-pentenyl, 2-n-propyl-2-propenyl, 3-methyl-1-pentenyl, 3-methyl-2-pentenyl, 3-methyl-3-pentenyl, 3-methyl-4-pentenyl, 3-ethyl-3-butenyl, 4-methyl-1-pentenyl, 4-methyl-2-pentenyl, 4-methyl-3-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1-methyl-2-ethyl-2-propenyl, 1-s-butylethenyl, 1,3-dimethyl-1-butenyl, 1,3-dimethyl-2-butenyl, 1,3-dimethyl-3-butenyl, 1-i-butylethenyl, 2,2-dimethyl-3-butenyl, 2,3-dimethyl-1-butenyl, 2,3-dimethyl-2-butenyl, 2,3-dimethyl-3-butenyl, 2-i-propyl-2-propenyl, 3,3-dimethyl-1-butenyl, 1-ethyl-1-butenyl, 1-ethyl-2-butenyl, 1-ethyl-3-butenyl, 1-n-propyl-1-propenyl, 1-n-propyl-2-propenyl, 2-ethyl-1-butenyl, 2-ethyl-2-butenyl, 2-ethyl-3-butenyl, 1,1,2-trimethyl-2-propenyl, 1-t-butylethenyl, 1-methyl-1-ethyl-2-propenyl, 1-ethyl-2-methyl-1-propenyl, 1-ethyl-2-methyl-2-propenyl, 1-i-propyl-1-propenyl, 1-i-propyl-2-propenyl, 1-methyl-2-cyclopentenyl, 1-methyl-3-cyclopentenyl, 2-methyl-1-cyclopentenyl, 2-methyl-2-cyclopentenyl, 2-methyl-3-cyclopentenyl, 2-methyl-4-cyclopentenyl, 2-methyl-5-cyclopentenyl, 2-methylene-cyclopentyl, 3-methyl-1-cyclopentenyl, 3-methyl-2-cyclopentenyl, 3-methyl-3-cyclopentenyl, 3-methyl-4-cyclopentenyl, 3-methyl-5-cyclopentenyl, 3-methylene-cyclopentyl, 1-cyclohexenyl, 2-cyclohexenyl, and 3-cyclohexenyl.

Examples of alkoxyalkyl groups having carbon atoms of 2 to 10 include methoxymethyl, ethoxymethyl, n-propoxyethyl, i-propoxymethyl, n-butoxymethyl, i-butoxyethyl, s-butoxymethyl, t-butoxyethyl, n-pentoxy-1-propyl, 1-methyl-n-butoxymethyl, 2-methyl-n-butoxyethyl, 3-methyl-n-butoxyethyl, 1,1-dimethyl-n-propoxymethyl, 1,2-dimethyl-n-propoxyethyl, 2,2-dimethyl-n-propoxyethyl, 1-ethyl-n-propoxy-t-butyl, n-hexyloxymethyl, 1-methyl-n-pentyloxymethyl, 2-methyl-n-pentyloxyethyl, 3-methyl-n-pentyloxypropyl, 4-methyl-n-pentyloxy-s-butyl, 1,1-dimethyl-n-butoxymethyl, 1,2-dimethyl-n-butoxyethyl, 1,3-dimethyl-n-butoxyethyl, 2,2-dimethyl-n-butoxy-1-propyl, 2,3-dimethyl-n-butoxyethyl, 3,3-dimethyl-n-butoxypropyl, 1-ethyl-n-butoxyethyl, 2-ethyl-n-butoxymethyl, 1,1,2-trimethyl-n-propoxy-t-butyl, 1,2,2-trimethyl-n-propoxyethyl, i-ethyl-1-methyl-n-propoxyethyl, and 1-ethyl-2-methyl-n-propoxymethyl.

In a resin having a structure of the formula (b1-1), m is the number of repeating units and represents an integer of 10 to 300. A weight average molecular weight of the resin having a structure of the formula (b1-1) is 400 to 12000 or 2000 to 12000.

In the resin having a structure of the formula (b1-2), R can be selected from a type of substituents shown in the formula (b1-1). In addition, m can be selected from the same range as shown in the formula (b1-1).

Examples of the polysilane resins (b1) include a polymer having a structure of the formula (b1-1), a polymer having a structure of the formula (b1-2) and a polymer having structures of the formula (b1-1) and the formula (b1-2). In the case of the polymer in which a structure of the formula (b1-1) or the formula (b1-2) is used singly, as well as in the case of the polymer in which structures of the formula (b1-1) and the formula (b1-2) are used in combination, the total of the numbers of repeating units m is 10 to 300, and a weight average molecular weight is 400 to 12000 or 2000 to 12000.

In the above-described polysilane, a ratio of m in the formula (b1-1): m in the formula (b1-2) is preferably 30% to 70%:70% to 30%.

In the polysilane (b1), hydroxy groups exist in both terminals of the resin. These hydroxy groups cause a condensation polymerization reaction by heat baking between the polymers of the formula (b1-1) and (b1-2), or between these polymers and a polysiloxane or a polycarbosilane, so that 3-dimensional cross-linking proceeds. As a result, the product becomes insoluble in a solvent.

A polysiloxane (b2) is a resin having, for example, structures represented by a formula (b2-1) to a formula (b2-3).

The polysiloxane (b2) is a resin of the formula (b2-1):

[Chemical Formula 13]

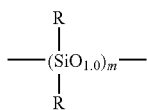

Formula (b2-1)

(where R and m mean the same as defined in the formula (b1-1)), a formula (b2-2):

[Chemical Formula 14]

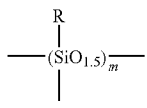

Formula (b2-2)

(where R and m mean the same as defined in the formula (b1-1)), the formula (b2-3):

[Chemical Formula 15]

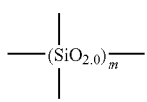

Formula (b2-3)

(where m means the same as defined in the formula (b1-1)), or a combination thereof. In the formula (b2-1) to the formula (b2-3), each R can be selected from a type of the substituents shown in the formula (b1-1). In addition, m can be selected from the same range as shown in the formula (b1-1). Examples of the polysiloxane (b2) include a polymer having a structure of the formula (b2-1), a polymer having a structure of the formula (b2-2), a polymer having a structure of the formula (b2-3), a polymer having structures of the formula (b2-1) and the formula (b2-2), a polymer having structures of the formula (b2-1) and the formula (b2-3), a polymer having structures of the formula (b2-2) and the formula (b2-3), and a polymer having structures of the formula (b2-1), the formula (b2-2) and the formula (b2-3).

For the polysiloxane resin (b2), in the case of a polymer in which structures of the formula (b2-1) to the formula (b2-3) are used singly, as well as of a polymer in which structures of the formula (b2-1) to the formula (b2-3) are used in combination, the total of the numbers of repeating units m represents an integer of 10 to 300, and a weight average molecular weight is 400 to 12000 or 2000 to 12000.

In the above-described polysiloxane, a ratio of mass of the structure of the formula (b2-2) in the entire polysiloxane is preferably 30% by mass or more, and more preferably 40% by mass or more.

Hydroxy groups exist in both terminals of the polymer having the structures of the formula (b2-1) to the formula (b2-3). These hydroxy groups cause a condensation polymerization reaction by heat baking between the polymers of the formula (b2-1) to (b2-3), or between these resins and a polysilane or a polycarbosilane, so that 3-dimensional cross-linking proceeds. As a result, the product becomes insoluble in a solvent.

A polycarbosilane resin (b3) is a polymer having, for example, structures represented by a formula (b3-1) and a formula (b3-2).

The polycarbosilane resin (b3) is a polymer of the formula (b3-1):

[Chemical Formula 16]

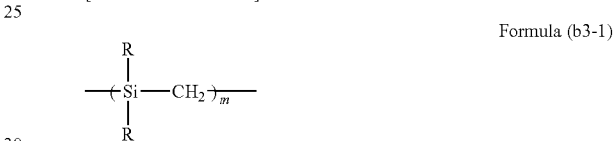

Formula (b3-1)

(where R and m mean the same as defined in the formula (b1-1)), the formula (b3-2):

[Chemical Formula 17]

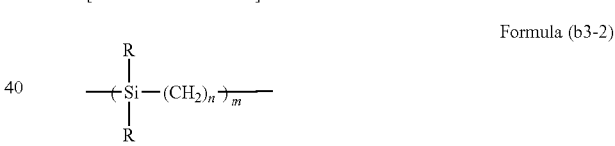

Formula (b3-2)

(where R and m mean the same as defined in the formula (b1-1), and n is the number of repeating units and represents 1 to 10), or a combination thereof.

In the formula (b3-1) and the formula (b3-2), each of R can be selected from a type of the substituents shown in the formula (b1-1). In addition, m can be selected from the same range as shown in the formula (b1-1). Examples of the polycarbosilanes (b3) include a polymer having a structure of the formula (b3-1), a polymer having a structure of the formula (b3-2) and a polymer having structures of the formula (b3-1) and the formula (b3-2). In the case of the polymer in which a structure of the formula (b3-1) or the formula (b3-2) is used singly, as well as in the case of the polymer in which structures of the formula (b3-1) and the formula (b3-2) are used in combination, the total of the numbers of repeating units m represents an integer of 10 to 300, and a weight average molecular weight is 400 to 12000 or 2000 to 12000.

Hydroxy groups exist in both terminals of the polymer having the structures of the formula (b3-1) and the formula (b3-2). These hydroxy groups cause a condensation polymerization reaction by heat baking between the resins of the formula (b3-1) and the formula (b3-2), or between these resins and a polysilane resin or a polysiloxane resin, so that 3-dimensional cross-linking proceeds. As a result, the product becomes insoluble in a solvent.

In the above-described polycarbosilane, a ratio of mass of the structure of the formula (b3-1) in the entire polycarbosilane is preferably 50% by mass or more, and more preferably 70% by mass or more.

For cross-linking catalysts used in a silicon-containing hard mask (layer B) forming composition, for example, proton acids can be used. For example, sulfonic acid compounds such as p-toluenesulfonic acid, trifluoromethanesulfonic acid, pyridinium p-toluenesulfonic acid, sulfosalicylic acid and camphorsulfonic acid, and carboxylic acid compounds such as salicylic acid, citric acid, benzoic acid and hydroxybenzoic acid are included. For cross-linking catalysts, aromatic sulfonic acid compounds can be preferably used. Specific examples of aromatic sulfonic acid compounds can include p-toluenesulfonic acid, pyridinium-p-toluenesulfonic acid, sulfosalicylic acid, 4-chlorobenzenesulfonic acid, 4-hydroxybenzenesulfonic acid, benzenedisulfonic acid, 1-naphthalenesulfonic acid, and pyridinium-1-naphthalenesulfonic acid.

The cross-linking catalysts can be used singly or also in combination of two or more types. A content of the cross-linking catalyst per 100 parts by mass of the silicon-containing polymer (b) is 0.1 to 10 parts by mass, or 0.5 to 5 parts by mass, or 1 to 3 part(s) by mass.

In addition to the above-described components, the silicon-containing hard mask (layer B) forming composition can contain a polymer compound, a photoacid generator, a surfactant and the like, as necessary.

By using the polymer compound, a dry etching rate (decrease amount of a film thickness in a unit time), attenuation coefficient, refractive index and the like of a film formed from the silicon-containing hard mask (layer B) forming composition used in the present invention can be adjusted.

Various polymers can be used as the polymer compound without particular limitation. A condensation polymerization polymer, an addition polymerization polymer and the like can be used. Condensation polymerization polymers and addition polymerization polymers such as polyester, polystyrene, polyimide, an acrylic polymer, a methacrylic polymer, polyvinylether, phenol-novolac, naphthol-novolac, polyether, polyamide and polycarbonate can be used. Polymers having structure of aromatic rings, which functions as a light absorption part, such as a benzene ring, a naphthalene ring, an anthracene ring, a triazine ring, a quinoline ring and a quinoxaline ring are preferably used.

Examples of such polymer compounds include, for example, addition polymerization polymers containing addition polymerizable monomers as their structure units, such as benzyl acrylate, benzyl methacrylate, phenyl acrylate, naphthyl acrylate, anthryl methacrylate, anthryl methyl methacrylate styrene, hydroxyl styrene, benzylvinylether and N-phenylmaleimide, and condensation polymerization polymers such as phenol-novolac and naphthol-novolac.

When addition polymerization polymers are used as the polymer compounds, these polymer compounds may be homopolymers or may be copolymers. For manufacture of addition polymerization polymers, addition polymerizable monomers are used. Examples of such addition polymerizable monomers include acrylic acid, methacrylic acid, acrylic ester compounds, methacrylic ester compounds, acrylamide compounds, methacrylamide compounds, vinyl compounds, styrene compounds, maleimide compounds, maleic anhydride, and acrylonitrile.

Examples of acrylic ester compounds include methyl acrylate, ethyl acrylate, normalhexyl acrylate, iso-propyl acrylate, cyclohexyl acrylate, benzyl acrylate, phenyl acrylate, anthryl methyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantlyacrylate, 5-acryloyloxy-6-hydroxynorbornene-2-carboxylic-6-lactone, 3-acryloxypropyl triethoxysilane, and glycidyl acrylate.

Examples of methacrylic ester compounds include methyl methacrylate, ethyl methacrylate, normalhexyl methacrylate, isopropyl methacrylate, cyclohexyl methacrylate, benzyl methacrylate, phenyl methacrylate, anthryl methyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl-methacrylate, 5-methacryloyloxy-6-hydroxynorbornene-2-carboxylic-6-lactone, 3-methacryloxypropyl triethoxysilane, glycidyl methacrylate, 2-phenylethyl methacrylate, hydroxyphenyl methacrylate, and bromophenyl methacrylate.

Examples of acrylamide compounds include acrylamide, N-methylacrylamide, N-ethylacrylamide, N-benzylacrylamide, N-phenylacrylamide, N,N-dimethylacrylamide, and N-anthrylacrylamide.

Examples of methacrylamide compounds include methacrylamide, N-methylmethacrylamide, N-ethylmethacrylamide, N-benzylmethacrylamide, N-phenylmethacrylamide, N,N-dimethylmethacrylamide, N-anthrylacrylamide and the like are included.

Examples of vinyl compounds include vinyl alcohol, 2-hydroxyethyl vinyl ether, methyl vinyl ether, ethyl vinyl ether, benzyl vinyl ether, vinyl acetate, vinyltrimethoxysilane, 2-chloroethyl vinyl ether, 2-methoxyethyl vinyl ether, vinylnaphthalene, and vinylanthracene.

Examples of styrene compounds include styrene, hydroxystyrene, chlorostyrene, bromostyrene, methoxystyrene, cyanostyrene, and acetylstyrene.

Examples of maleimide compounds include maleimide, N-methylmaleimide, N-phenylmaleimide, N-cyclohexylmaleimide, N-benzylmaleimide, and N-hydroxyethylmaleimide.

When condensation polymerization polymers are used as the polymers, examples of such polymers include, for example, condensation polymerization polymers of glycol compounds and dicarboxylic acid compounds. Examples of glycol compounds include diethylene glycol, hexamethylene glycol, and butylene glycol. Examples of dicarboxylic acid compounds include succinic acid, adipic acid, terephthalic acid, and maleic anhydride. In addition, for example, polyesters, polyamides and polyimides such as polypyromellitimide, poly(p-phenyleneterephthalimide), polybutyleneterephthalate, and polyethyleneterephthalate are included.

Specific examples of the polymer compounds can include polystyrene, poly(4-hydroxy)styrene, polymethyl methacrylate, a copolymer of methyl methacrylate and 4-hydroxystyrene, poly(2-hydroxypropyl) methacrylate, a copolymer of 2-hydroxypropyl methacrylate and anthrylmethyl methacrylate, a copolymer of vinyl ether and methyl vinyl ether, a copolymer of 2-hydroxypropyl methacrylate and benzyl methacrylate, a copolymer of 2-hydroxyethyl acrylate and maleimide, a copolymer of 2-hydroxypropyl methacrylate, styrene and methyl methacrylate, a copolymer of glycidyl methacrylate and 2-hydroxypropyl methacrylate, and a copolymer of styrene and 4-hydroxystyrene.

When hydroxyl groups are contained in the polymer compound, these hydroxyl groups can form cross-linking reaction with the silicon-containing polymer.

For the polymer compound, a polymer compound having a weight average molecular weight of, for example, 1000 to 1000000, or 3000 to 300000 or 5000 to 200000, or 10000 to 100000 can be used.

The polymer compound can be used singly or in combination of two or more types.

When the polymer compound is used for the silicon-containing hard mask (layer B) forming composition, a ratio of the polymer compound per 100 parts by mass of the silicon-containing polymer (b) is 1 to 200 part(s) by mass, or 5 to 100 parts by mass, or 10 to 50 parts by mass, or 20 to 30 parts by mass.

Photoacid generators generate acids during exposure of photoresist. Accordingly, an acidity of an underlayer film can be adjusted. This is one method for matching the acidity of the underlayer film with the acidity of a photoresist of the upper layer. In addition, a pattern shape of the photoresist formed in the upper layer can be adjusted by adjusting the acidity of the underlayer film.

Examples of photoacid generators contained in the silicon-containing hard mask (layer B) forming composition according to the present invention include onium salt compounds, sulfonimide compounds, and disulfonyl diazomethane compounds.

Examples of onium salt compounds include iodonium salt compounds such as diphenyliodonium hexafluorophosphate, diphenyliodonium trifluoromethanesulfonate, diphenyliodonium nonafluoro-normalbutanesulfonate, diphenyliodonium perfluoro-normaloctanesulfonate, diphenyliodonium camphorsulfonate, bis(4-tert-butylphenyl)iodonium camphorsulfonate and bis(4-tert-butylphenyl)iodonium trifluoromethanesulfonate, and sulfonium salt compounds such as triphenylsulfonium hexafluoroantimonate, triphenylsulfonium nonafluoro-normalbutanesulfonate, triphenylsulfonium camphorsulfonate and triphenylsulfonium trifluoromethanesulfonate.

Examples of sulfonimide compounds include N-(trifluoromethanesulfonyloxy)succinimide, N-(nonafluoro-normalbutanesulfonyloxy)succinimide, N-(camphorsulfonlyoxy)succinimide, and N-(trifluoromethanesulfonyloxy) naphthalimide.

Examples of disulfonyl diazomethane compounds include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

Photoacid generators can be used singly or in combination of two or more types.

When the photoacid generator is used for the silicon-containing hard mask (layer B) forming composition, a ratio of the photoacid generator per 100 parts by mass of the silicon-containing polymer (b) is 0.01 to 5 parts by mass, or 0.1 to 3 parts by mass, or 0.5 to 1 part(s) by mass.

For solvents used for the silicon-containing hard mask (layer B) forming composition according to the present invention, any solvents can be used without particular limitation as long as the solvents can dissolve the above-described solid content. Examples of such solvents can include methylcellosolve acetate, ethylcellosolve acetate, propylene glycol, propylene glycol monomethyl ether, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxylporpionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, and γ-butyrolactone. These solvents can be used singly or in combination of two or more types.

In the present invention, it is preferable to use an organic antireflective film (layer C) containing a polymer that has a molecular structure similar to a molecular structure of a polymer contained in a photoresist film (layer D).

The organic antireflective film (layer C) used in the present invention includes a polymer having benzene rings, heterocyclic rings or a combination thereof in a main chain or a side chain bonded to the main chain constituting the polymer. For the polymer, a polymer having benzene rings, heterocyclic rings or a combination thereof in a side chain bonded to the main chain constituting the polymer is preferable.

For heterocyclic rings contained in the polymer in the organic antireflective film (layer C), lactone rings or triazine rings is preferably exemplified.

In the organic antireflective film (layer C), a content rate of benzene rings in the polymer is preferably 30 to 70% by mass.

The above-described benzene rings include all benzene rings contained in the polymer, such as benzene rings derived from phenylene and the like contained in the polymer main chain, and benzene rings derived from phenyl groups or phenylene contained in the side chain bonded to the polymer main chain. The mass of the benzene rings do not include the mass of substituents bonded to benzene rings. In addition, the benzene rings do not include naphthalene rings or anthracene rings.

For the organic antireflective film (layer C), the organic antireflective film (layer C) is formed in a manner that an organic antireflective film (layer C) forming composition is applied on the upper side of the silicon-containing hard mask (layer B), and a solvent is removed by baking. The organic antireflective film (layer C) forming composition is made of a polymer (c), a cross-linking agent and a solvent, and contains a cross-linking catalyst and a surfactant as optional components. The solid content of the organic antireflective film (layer C) forming composition is 0.1 to 50% by mass, or 5 to 40% by mass, or 10 to 30% by mass. Here, the solid content means components in which the solvent component is removed from the total components of the organic antireflective film (layer C) forming composition.

In the organic antireflective film (layer C) forming composition, a content of the polymer (c) per solid content is 10% by mass or more, for example, 30% by mass to 99% by mass, or for example, 50% by mass to 99% by mass, or for example, 65% by mass to 99% by mass.

A resin (c1) containing a lactone structure (lactone ring) is preferable for the polymer forming the organic antireflective film (layer C). The polymer (c1) is a polymer in which a γ(gamma)-lactone structure forming a five-membered ring structure or a δ(delta)-lactone structure forming a six-membered ring structure being introduced to a main chain or a side chain bonded to the main chain.

Although a molecular weight of the polymer (c1) varies depending on an application solvent, a solution viscosity, a film shape and the like to be used, the molecular weight is 1000 to 1000000, preferably 1000 to 200000, and more preferably 1000 to 100000 as a weight average molecular weight.

γ-lactones used in the above-described polymer (c1) is lactones having a five-membered ring structure, and for example, substituted or unsubstituted lactones, such as γ-butyrolactone, γ-valerolactone, and tetronic acid can be mentioned asn examples.

In addition, δ-lactones is lactones having a six-membered ring structure, and for example, substituted or unsubstituted lactones, such as δ-valerolactone, and δ-caprolactone can be exemplified.

For the polymer (c1), for example, resins bonded to a compound having a lactone structure in a side chain bonded to the main chain can be used. These resins have at least a structure unit of a formula (c1-1):

[Chemical Formula 18]

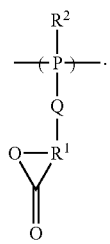

Formula (c1-1)

In the formula (c1-1), Q represents a bivalent linking group bonding P and $R^1$; $R^1$ represents a trivalent hydrocarbon group having two carbon atoms to four carbon atoms; P represents a bonding group constituting the main chain; $R^2$ represents a hydrogen atom, a methyl group or a halogen atom. The trivalent hydrocarbon groups having two carbon atoms to four carbon atoms represented by $R^1$ constitute lactone rings, and are bonded to P through Q in a portion of these hydrocarbon groups. These hydrocarbon groups may have substituents or may be non-substituted.

The polymer having the structure of the formula (c1-1) can be produced, for example, in a manner that acrylic type resins such as acrylic acid, halogenated acrylic acid and methacrylic acid are reacted with lactones such as α-bromo-γ-butyrolactone and α-bromo-δ-valerolactone.

For the above-described resins used in the present invention, a structure of a copolymer (c1-2) having a combination of a structure unit having an acrylic type resin as a main chain and having a γ-lactone or a derivative thereof or a δ-lactone or a derivative thereof in a side chain and a structure unit made of an acrylic resin can be formed.

[Chemical Formula 19]

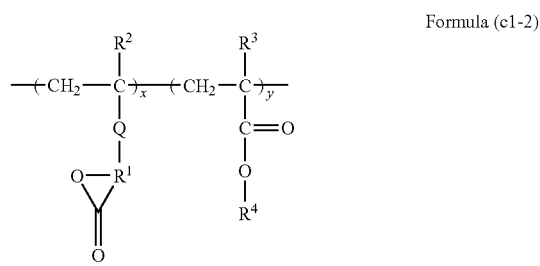

Formula (c1-2)

When the polymer (c1-2) is used as the organic antireflective film (layer C), dry etching rate is increased with the increase of an introduced amount of the structure unit made of γ-lactone structure, δ-lactone structure or a combination thereof. For a preferable ratio of this structure, a ratio of structure units derived from lactone rings having repeating units (x) is 1 to 76% (x/x+y), and a ratio of structure units corresponding to the acrylic resins having repeating units (y) is 99 to 24% (y/x+y).

In the (c1-2), x and y represent numbers of repeating units, x=5 to 5000, and y=2 to 5000; and Q and $R^1$ mean the same as defined in the (c1-1). $R^2$ and $R^3$ represent a hydrogen atom, a methyl group or a halogen atom, and $R^4$ represents a hydrogen atom, a substituted or unsubstituted alkyl group having carbon atom(s) of 1 to 10, a substituted or unsubstituted aralkyl group, a substituted or unsubstituted carbon ring type aromatic group, or a substituted or unsubstituted heterocyclic aromatic group.

Here, examples of preferable alkyl groups having carbon atom(s) of 1 to 10 for $R^4$ include methyl, ethyl, n-propyl, i-propyl, cyclopropyl, n-butyl, i-butyl, s-butyl, t-butyl, cyclobutyl, 1-methyl-cyclopropyl, 2-methyl-cyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethylcyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl. In addition, alkyl groups substituted with a hydroxy group, such as hydroxyethyl, hydroxypropyl, and hydroxybutyl, and alkyl groups substituted with a halogen atom, such as trichloroethyl, and trifluoroethyl, can be included.

Examples of preferable aralkyl groups having carbon atoms of 6 to 20 include a benzyl group, an o-methylbenzyl group, a m-methylbenzyl group, a p-methylbenzyl group, an o-chlorobenzyl group, a m-chlorobenzyl group, a p-chlorobenzyl group, an o-fluorobenzyl group, a p-fluorobenzyl group, an o-methoxybenzyl group, a p-methoxybenzyl group, a p-nitrobenzyl group, a p-cyanobenzyl group, a phenethyl group, an o-methylphenethyl group, a m-methylphenethyl group, a p-methylphenethyl group, an o-chlorophenethyl group, a m-chlorophenethyl group, a p-chlorophenethyl group, an o-fluorophenethyl group, a p-fluorophenethyl group, an o-methoxyphenethyl group, a p-methoxyphenethyl group, a p-nitrophenethyl group, a p-cyanophenethyl group, a 3-phenylpropyl group, a 4-phenylbutyl group, a 5-phenylpentyl group, a 6-phenylhexyl group, an α-naphthylmethyl group, a β-naphthylmethyl group, an o-biphenylylmethyl group, a m-biphenylylmethyl group, a p-biphenylylmethyl group, a 1-anthrylmethyl group, a 2-anthrylmethyl group, a 9-anthrylmethyl group, a 1-phenanthrylmethyl group, a 2-phenanthrylmethyl group, a 3-phenanthrylmethyl group, a 4-phenanthrylmethyl group, a 9-phenanthrylmethyl group, an α-naphthylethyl group, a β-naphthylethyl group, an o-biphenylylethyl group, a m-biphenylylethyl group, a p-biphenylylethyl group, a 1-anthrylethyl group, a 1-anthrylmethyl group, a 2-anthrylethyl group, a 9-anthrylethyl group, a 1-phenanthrylethyl group, a 2-phenanthrylethyl group, a 3-phenanthrylethyl group, a 4-phenanthrylethyl group, and a 9-phenanthrylethyl group.

Examples of preferable carbon ring type aromatic groups having carbon atoms of 6 to 20 include a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of preferable heterocyclic type aromatic groups include a 2-thienyl group, a 3-thienyl group, a 2-furyl group, a 3-furyl group, a 2-pyranyl group, a 3-pyranyl group, a 4-pyranyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 4-isobenzofuranyl group, a 5-isobenzofuranyl group, a 2-benzothienyl group, a 3-benzothienyl group, a 4-benzothienyl group, a 5-benzothienyl group, a 6-benzothienyl group, a 7-benzothienyl group, a 1-isobenzothienyl group, a 4-isobenzothienyl group, a 5-isobenzothienyl group, a 2-chromenyl group, a 3-chromenyl group, a 4-chromenyl group, a 5-chromenyl group, a 6-chromenyl group, a 7-chromenyl group, an 8-chromenyl group, a 1-pyrrolyl group, a 2-pyrrolyl group, a 3-pyrrolyl group, a 1-imidazolyl group, a 2-imidazolyl group, a 4-imidazolyl group, a 1-pyrazolyl group, a 3-pyrazolyl group, a 4-pyrazolyl group, a 2-thiazolyl group, a 4-thiazolyl group, a 5-thiazolyl group, a 3-isothiazolyl group, a 4-isothiazolyl group, a 5-isothiazolyl group, a 2-oxazolyl group, a 4-oxazolyl group, a 5-oxazolyl group, a 3-isooxazolyl group, a 4-isooxazolyl group, a 5-isooxazolyl group, a 2-pyridyl group, a 3-pyridyl group, a 4-pyridyl group, a 2-pyrazinyl group, a 2-pyrimidinyl group, a 4-pyrimidinyl group, a 5-pyrimidinyl group, a 3-pyridazinyl group, a 4-pyridazinyl group, a 1-indolyzinyl group, a 2-indolyzinyl group, a 3-indolyzinyl group, a 5-indolyzinyl group, a 6-indolyzinyl group, a 7-indolyzinyl group, an 8-indolyzinyl group, a 1-isoindolyl group, a 4-isoindolyl group, a 5-isoindolyl group, a 1-indolyl group, a 2-indolyl group, a 3-indolyl group, a 4-indolyl group, a 5-indolyl group, a 6-indolyl group, a 7-indolyl group, a 1-indazolyl group, a 2-indazolyl group, a 3-indazolyl group, a 4-indazolyl group, a 5-indazolyl group, a 6-indazolyl group, a 7-indazolyl group, a 1-purinyl group, a 2-purinyl group, a 3-purinyl group, a 6-purinyl group, a 7-purinyl group, an 8-purinyl group, a 2-quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 1-phthalazinyl group, a 5-phthalazinyl group, a 6-phthalazinyl group, a 2-naphthylidinyl group, a 3-naphthylidinyl group, a 4-naphthylidinyl group, a 2-quinoxalinyl group, a 5-quinoxalinyl group, a 6-quinoxalinyl group, a 2-quinazolinyl group, a 4-quinazolinyl group, a 5-quinazolinyl group, a 6-quinazolinyl group, a 7-quinazolinyl group, an 8-quinazolinyl group, a 3-cinnolinyl group, a 4-cinnolinyl group, a 5-cinnolinyl group, a 6-cinnolinyl group, a 7-cinnolinyl group, an 8-cinnolinyl group, a 2-pteridinyl group, a 4-pteridinyl group, a 6-pteridinyl group, a 7-pteridinyl group, and a 3-furazanyl group. $R^4$ can be used singly or in combination.

The resin having the structure of the formula (c1-1) and the resin of the formula (c1-2) may be any of a random copolymer, a block copolymer or a graft copolymer. The polymer forming the organic antireflective film (layer C) according to the present invention can be synthesized by methods such as radical polymerization, anion polymerization, and cation polymerization. Various methods such as solution polymerization, suspension polymerization, emulsion polymerization, and bulk polymerization are possible in the polymerization forms.

The polymer forming the organic antireflective film (layer C) can contain a triazinetrione compound having a hydroxyalkyl structure as a substituent on the nitrogen atom, a triazinetrione oligomer compound having a hydroxyalkyl structure as a substituent on the nitrogen atom or a triazinetrione polymer compound (c2) having a hydroxyalkyl structure as a substituent on the nitrogen atom.

The organic antireflective film (layer C) forming composition for forming the organic antireflective film (layer C) is made of the triazinetrione compound having a hydroxyalkyl structure as a substituent on the nitrogen atom, the triazinetrione oligomer compound having a hydroxyalkyl structure as a substituent on the nitrogen atom or the triazinetrione polymer compound having a hydroxyalkyl structure as a substituent on the nitrogen atom, and a solvent. The composition optionally contains a cross-linking catalyst, surfactant and the like. The solid content of the antireflective film forming composition according to the present invention is, for example, 0.1 to 50% by mass, or for example, 0.5 to 30% by mass. Here, the solid content means components in which the solvent component is removed from the total components of the antireflective film forming composition.

In addition, a formulation amount of the triazinetrione compound having a hydroxyalkyl structure as a substituent on the nitrogen atom, the triazinetrione oligomer compound having a hydroxyalkyl structure as a substituent on the nitrogen atom or the triazinetrione polymer compound having a hydroxyalkyl structure as a substituent on the nitrogen atom is 10% by mass or more per 100% by mass of the total solid contents, for example, 30% by mass to 99% by mass, for example, 50% by mass to 99% by mass, or further for example, 60% by mass to 95% by mass.

Examples of triazinetrione compounds having a hydroxyalkyl structure as a substituent on the nitrogen atom can include compounds represented by a formula (c2-1).

[Chemical Formula 20]

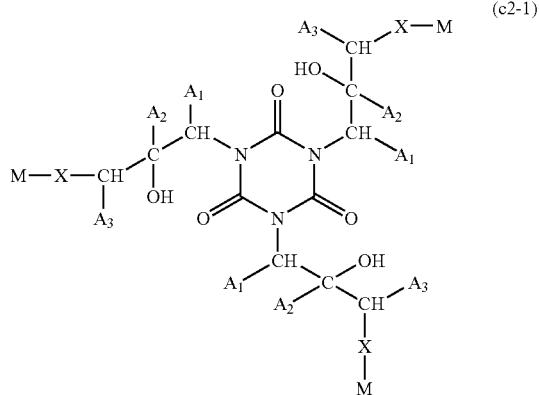

(c2-1)

In the formula (c2-1), each of $A_1$, $A_2$ and $A_3$ independently represents a hydrogen atom, a methyl group or an ethyl group; X represents —OC(=O)—, —S—, —O— or —NR—, in which R represents a hydrogen atom or a methyl group; M represents a benzene ring, a naphthalene ring or an anthracene ring which may be substituted with an alkyl group having carbon atom(s) of 1 to 6, a phenyl group, a naphthyl group, a halogen atom, an alkoxy carbonyl group having carbon atom(s) of 1 to 6, a nitro group, a cyano group, an alkoxy group having carbon atom(s) of 1 to 6 or an alkylthio group having carbon atom(s) of 1 to 6.

A compound of such a formula (c2-1) can be obtained by, for example, the reaction of a compound represented by a formula (c2-8),

[Chemical Formula 21]

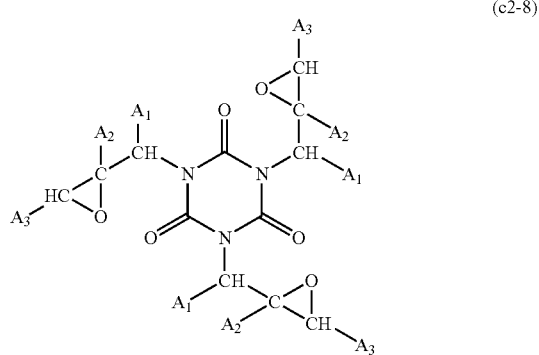

(c2-8)

with a compound represented by a formula (c2-15).

[Chemical Formula 22]

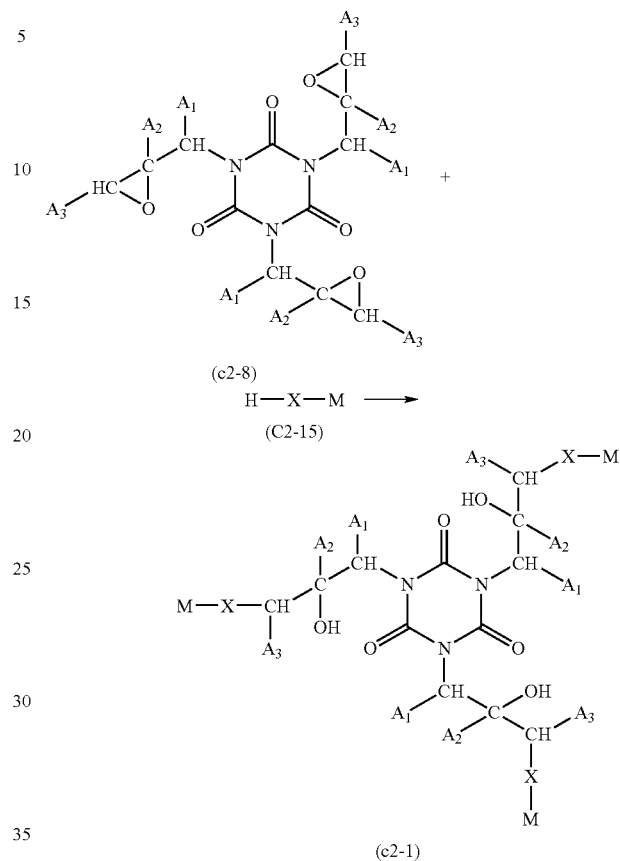

In the formula (c2-15), X represents —OC(=O)—, —S—, —O— or —NR—, in which R represents a hydrogen atom or a methyl group, and M represents a benzene ring, a naphthalene ring or an anthracene ring which may be substituted with an alkyl group having carbon atom(s) of 1 to 6, a phenyl group, a naphthyl group, a halogen atom, an alkoxy carbonyl group having carbon atom(s) of 1 to 6, a nitro group, a cyano group, an alkoxy group having carbon atom(s) of 1 to 6 or an alkylthio group having carbon atom(s) of 1 to 6.

Such a reaction of the compound represented by the formula (c2-8) with the compound represented by the formula (c2-15) is preferably preformed in the solution state in which these compounds are dissolved in organic solvents such as benzene, toluene, xylene, ethyl lactate, butyl lactate, propylene glycol monomethyl ether, propylene glycol monomethyl ether acetate, and N-methylpyrrolidone. In this reaction, although each of the compound of the formula (c2-8) and the compound of the formula (c2-15) can be used singly, the compounds can also be used in combination of two or more. In this reaction, quaternary ammonium salts such as benzyltriethylammonium chloride, tetrabutylammonium chloride and tetraethylammonium bromide can be used as catalysts of this reaction. Although the reaction time and the reaction temperature of this reaction depend on compounds used, a concentration and the like, they are appropriately selected from the range of the reaction time of 0.1 to 100 hours and the reaction temperature of 20° C. to 200° C. When a catalyst is used, it can be used in a range of 0.001 to 50% by mass to the total mass of compounds used.

For the antireflective film forming composition containing the compound represented by the formula (c2-1), properties of the antireflective film formed from the antireflective film forming composition, particularly light absorbance property, attenuation coefficient, refractive index and the like to irradiated light used for a lithographic process, significantly depend on a type of the compound of the formula (c2-15) used in the present reaction. In addition, a type of the compound of the formula (c2-15) used affects a required time for removing the antireflective film formed with the antireflective film forming composition by etching the film. Particularly, a type and the number of the substituents on a benzene ring, a naphthalene ring or an anthracene ring in the compound of the formula (c2-15) affect the required time for removing the antireflective film by etching the film. The required time for removing the film by etching can be shortened in a manner that substituents containing hetero atoms such as halogen atoms, nitrogen atoms, oxygen atoms, and sulfur atoms are introduced or the number of the substituents is increased.

When the antireflective film forming composition according to the present invention containing the compound represented by the formula (c2-1) is applied for a process using light having a wavelength of 248 nm (KrF excimer laser), a compound having naphthalene rings or anthracene rings (M is a naphthalene ring or an anthracene ring) as a compound of the formula (c2-15) is preferably used. In addition, when the composition is applied for a process using light having a wavelength of 193 nm (ArF excimer laser) and a wavelength of 157 nm (F2 excimer laser), a compound having benzene rings (M is a benzene ring) is preferably used.

Examples of compounds of the formula (c2-8) used in the reaction in order to obtain the compound of the formula (c2-1) can include tris(2,3-epoxypropyl)-isocyanurate, tris(2-methyl-2,3-epoxypropyl)-isocyanurate, and tris(2,3-epoxybutyl)-isocyanurate.

Examples of compounds of the formula (c2-15) used in the reaction in order to obtain the compound of the formula (c2-1) can include benzoic acid, monoethyl isophthalate, 2,4-dibromo benzoic acid, 4-methylbenzoic acid, 2-methoxybenzoic acid, 2,3,5-triiodobenzoic acid, 2-chloro-4-nitrobenzoic acid, 4-fluorobenzoic acid, 4-iodobenzoic acid, 4-bromobenzoic acid, 4-t-butylbenzoic acid, 3-trifluoromethylbenzoic acid, 2-nitrobenzoic acid, 4-isopropoxybenzoic acid, 3-cyanobenzoic acid, 3-phenylbenzoic acid, 3-bromo-4-methylbenzoic acid, 2,4,6-tri bromobenzoic acid, 4-methylthiobenzoic acid, and 2-bromo-4-fluorobenzoic acid.

In addition, examples of compounds of the formula (c2-15) can include naphthalene-2-carboxylic acid, 1-bromo-naphthalene-2-carboxylic acid, 4-bromo-3-methoxy-naphthalene-2-carboxylic acid, 3-methyl-naphthalene-2-carboxylic acid, 4-fluoro-naphthalene-1-carboxylic acid, 4-nitro-naphthalene-1-carboxylic acid, 5-bromo-naphthalene-1-carboxylic acid, 8-iodo-naphthalene-1-carboxylic acid, anthracene-9-carboxylic acid, anthracene-2-carboxylic acid, and 10-bromo-anthracene-9-carboxylic acid.

Moreover, examples of compounds of the formula (c2-15) can include phenol, 4-methylphenol, 4-chlorophenol, 4-bromophenol, 4-nitrophenol, 2,3,4,5-tetrabromophenol, pentabromophenol, 4-bromo-2-fluorophenol, 4-iodophenol, 2,4,6-triiodophenol, 2,5-dimethyl-4-iodophenol, 4-methylthiophenol, 3-methoxyphenol, 3-bromophenol, 2-cyanophenol, 2,6-diiodo-4-cyanophenol, methyl 3-hydroxybenzoate, 2-naphthol, 1-bromo-2-naphthol, 2-nitro-1-naphthol, 2-methyl-1-naphthol, 4-methoxy-1-naphthol, 2,4-dichloro-1-naphthol, methyl 2-hydroxy-naphthalene-3-carboxylate, 2-hydroxyanthracene, and 9-hydroxyanthracene.

In addition, examples of compounds of the formula (c2-15) can include aniline, 3-chloroaniline, 2-bromoaniline, 4-iodoaniline, 3-methoxyaniline, 3-methylthioaniline, 4-nitroaniline, 3-isopropylaniline, 3,5-dibromoaniline, 2-floro-4-iodoaniline, methyl 2-amino-5-iodobenzoate, 2,4,6-tribromoaniline, 4-bromo-3-methylaniline, 2-bromo-4-nitroaniline, 2-bromo-5-trifluoromethylaniline, 3-phenylaniline, 1-aminonaphthalene, 1-amino-4-bromonaphthalene, 1-amino-2-nitronaphthalene, 1-aminoanthracene, and 9-aminoanthracene.

Furthermore, examples of compounds of the formula (c2-15) can include thiophenol, 2-methylthiophenol, 4-chlorothiophenol, pentachlorothiophenol, 3-methoxythiophenol, 3-bromothiophenol, methyl 2-mercaptobenzoate, 4-nitrothiophenol, 3-iodothiophenol, 1-naphthalenethiol, and 9-mercaptoanthracene.

Moreover, for compounds reacted with the compounds of the formula (c2-8), in addition to the compounds of the formula (c2-15), for example, compounds having carboxyl groups or hydroxy groups such as 2-thiophene carboxylic acid, 5-bromothiophene carboxylic acid, phenylacetic acid, 4-bromophenoxyacetic acid, benzyl alcohol, 2,4-dibromobenzyl alcohol, 3-bromocinnamic acid, 9-hydroxymethyl anthracene, thiazole-2-carboxylic acid, and 2-amino-5-bromothiazole can also be used.

Examples of compounds of the formula (c2-1) can include compounds of the following formula (c2-16) (compound number 1 in the following Table 1) and the following formula (c2-17) (compound number 15 in Table 1).

[Chemical Formula 23]

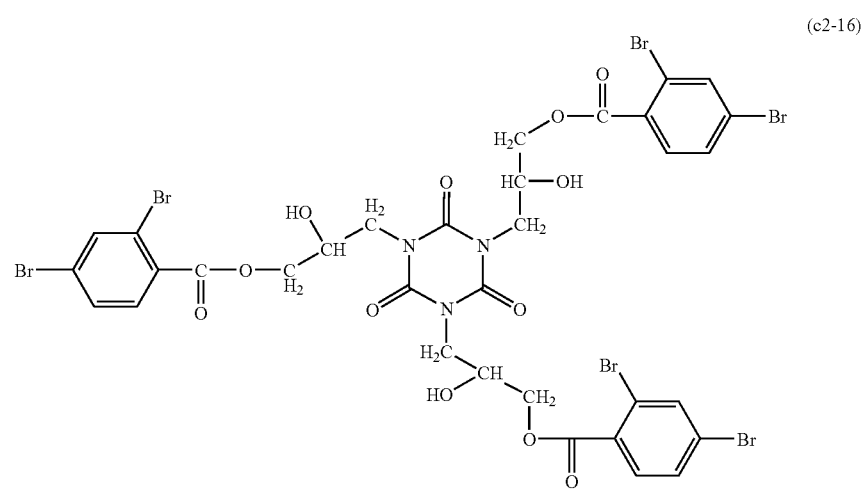

[Chemical Formula 24]

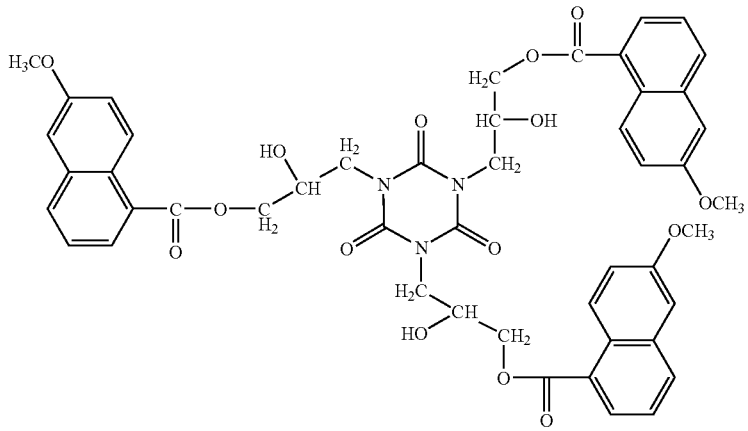

(c2-17)

Similarly, compounds listed in Table 1 can be included (in Table 1, Ph represents a phenyl group; 1-Nap represents a 1-naphthyl group; 2-Nap represents a 2-naphthyl group; and 9-Ant represents a 9-anthryl group).

TABLE 1

| Compound number | $A_1$ | $A_2$ | $A_3$ | X | M |
|---|---|---|---|---|---|
| 1 | H | H | H | OC(=O) | Ph-2,4-(Br)$_2$ |
| 2 | H | H | H | OC(=O) | Ph |
| 3 | H | H | H | OC(=O) | Ph-4-NO$_2$ |
| 4 | H | CH$_3$ | H | OC(=O) | Ph |
| 5 | H | H | H | OC(=O) | Ph-3-CN |
| 6 | H | H | H | OC(=O) | Ph-3-CH$_3$ |
| 7 | H | H | H | OC(=O) | Ph-2-OCH$_3$ |
| 8 | H | H | H | OC(=O) | Ph-2,3,5-(I)$_3$ |
| 9 | H | CH$_3$ | H | OC(=O) | Ph-3-Br-5-I |
| 10 | H | H | H | OC(=O) | Ph-2,3,4,5-(I)$_4$ |
| 11 | H | H | H | OC(=O) | Ph-3-SCH$_3$ |
| 12 | H | H | H | OC(=O) | Ph-2,4-(Cl)$_3$ |
| 13 | H | H | H | OC(=O) | Ph-2-Br-4-CH$_3$ |
| 14 | H | H | H | OC(=O) | Ph-3-Br-5-I |
| 15 | H | H | H | OC(=O) | 1-Nap-6-OCH$_3$ |
| 16 | H | H | H | OC(=O) | 2-Nap-3-CH$_3$ |
| 17 | H | CH$_3$ | H | OC(=O) | 1-Nap |
| 18 | H | H | H | OC(=O) | 2-Nap-6-F |
| 19 | H | H | H | OC(=O) | 9-Ant |
| 20 | H | H | H | OC(=O) | 9-Ant-10-Br |
| 21 | H | H | H | S | Ph-4-F |
| 22 | H | H | H | S | Ph |
| 23 | H | H | H | S | Ph-3-CH$_3$ |
| 24 | H | H | H | S | Ph-2,4-(Cl)$_3$ |
| 25 | H | H | H | S | Ph-2,4-(Br)$_2$ |
| 26 | H | H | H | S | 1-Nap |
| 27 | H | H | H | S | 2-Nap-6,7-(Br)$_2$ |
| 28 | H | H | H | S | 9-Ant |
| 29 | H | H | H | NH | Ph |
| 30 | H | CH$_3$ | H | NH | Ph |
| 31 | H | H | H | NH | Ph-4-CH$_3$ |
| 32 | H | H | H | NH | Ph-2-Br |
| 33 | H | H | H | NH | Ph-3,5-(Br)$_2$ |
| 34 | H | H | H | NH | Ph-3-CN |
| 35 | H | H | H | NH | Ph-3-COOCH$_3$ |
| 36 | H | H | H | NH | Ph-3,4,5-(Cl)$_3$ |
| 37 | H | H | H | NH | Ph-4-SCH$_3$ |
| 38 | H | H | H | NH | Ph-2-F-4-Cl |
| 39 | H | H | H | NH | Ph-3-CH$_3$ |
| 40 | H | H | H | NH | 1-Nap |
| 41 | H | H | H | O | Ph-2-Br |
| 42 | H | CH$_3$ | H | O | Ph |

TABLE 1-continued

| Compound number | $A_1$ | $A_2$ | $A_3$ | X | M |
|---|---|---|---|---|---|
| 43 | H | H | H | O | Ph-2,4-Br$_2$ |
| 44 | H | H | H | O | Ph-4-CH$_3$ |
| 45 | H | H | H | O | Ph-3-I |
| 46 | H | H | H | O | Ph-2-F |
| 47 | H | H | H | O | Ph-3-OCH$_3$ |
| 48 | H | H | H | O | Ph-3-NO$_2$ |
| 49 | H | H | H | O | 1-Nap-2-Cl |
| 50 | H | CH$_3$ | H | O | 1-Nap |
| 51 | H | H | H | O | 2-Nap |
| 52 | H | H | H | O | 9-Ant |

The compound represented by the formula (c2-1) can be used singly or in combination of two or more types. A formulation amount of such compounds of the formula (c2-1) is 10% by mass or more per 100% by mass of the total solid content, for example, 30% by mass to 99% by mass, for example, 50% by mass to 99% by mass, or furthermore, for example, 60% by mass to 95% by mass.

Examples of triazinetrione compounds having a hydroxyalkyl structure as a substituent on the nitrogen atom also include triazinetrione compounds having a substituent represented by a formula (c2-2) as a substituent on the nitrogen atom, and triazinetrione oligomer compounds or triazinetrione polymer compounds having a structure in which at least two triazinetrione ring structures are linked by the linking group represented by a formula (c2-3) through the nitrogen atom. In the formulae (c2-2) and (c2-3), each of $A_1$, $A_2$ and $A_3$ independently represents a hydrogen atom, a methyl group or an ethyl group; Y represents a direct bonding or —C(=O)—; Ar represents a benzene ring or a naphthalene ring which may be substituted with an alkyl group having carbon atom(s) of 1 to 6, a phenyl group, a naphthyl group, a halogen atom, an alkoxycarbonyl group having carbon atom(s) of 1 to 6, a nitro group, a carboxyl group, a cyano group, an alkoxy group having carbon atom(s) of 1 to 6, a hydroxy group, a thiol group, an alkylthio group having carbon atom(s) of 1 to 6 or an amino group.

[Chemical Formula 25]

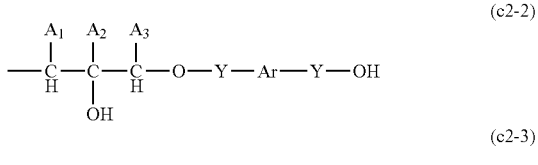

(c2-2)

(c2-3)

For the triazinetrione compound having substituents on the nitrogen atom represented by the formula (c2-2), a compound having a structure represented by a formula (c2-4) can be used.

[Chemical Formula 26]

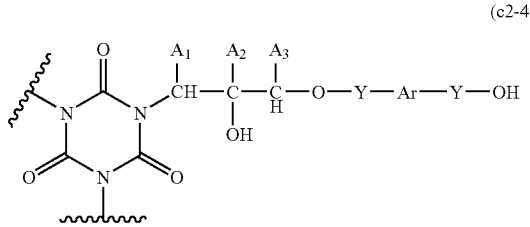

(c2-4)

In the formula (c2-4), each of $A_1$, $A_2$ and $A_3$ independently represents a hydrogen atom, a methyl group or an ethyl group; Y represents a direct bonding or —C(=O)—; Ar represents a benzene ring or a naphthalene ring which may be substituted with an alkyl group having carbon atom(s) of 1 to 6, a phenyl group, a naphthyl group, a halogen atom, an alkoxycarbonyl group having carbon atom(s) of 1 to 6, a nitro group, a carboxyl group, a cyano group, an alkoxy group having carbon atom(s) of 1 to 6, a hydroxy group, a thiol group, an alkylthio group having carbon atom(s) of 1 to 6 or an amino group.

The compound of the formula (c2-4) can be obtained in a manner that a triazinetrione compound having substituents on the nitrogen atom represented by a formula (c2-6):

[Chemical Formula 27]

(c2-6)

(where each of $A_1$, $A_2$ and $A_3$ independently represents a hydrogen group, a methyl group or an ethyl group), is reacted with a phenyl compound or a naphthalene compound represented by a formula (c2-7):

[Chemical Formula 28]

HO—Y—Ar—Y—CH          (c 2-7)

(where Y represents a direct bonding or —C(=O)—; Ar represents a benzene ring or a naphthalene ring which may be substituted with an alkyl group having carbon atom(s) of 1 to 6, a phenyl group, a naphthyl group, a halogen atom, an alkoxycarbonyl group having carbon atom(s) of 1 to 6, a nitro group, a carboxyl group, a cyano group, an alkoxy group having carbon atom(s) of 1 to 6, a hydroxy group, a thiol group, an alkylthio group having carbon atom(s) of 1 to 6 or an amino group). In this reaction, although the compound represented by the formula (c2-7) can be used singly, the compounds can also be used in combination of two or more types. This reaction is preferably performed in the solution state in which these compounds are dissolved in organic solvents such as benzene, toluene, xylene, ethyl lactate, butyl lactate, propylene glycol monomethyl ether, propylene glycol monomethyl ether acetate, and N-methylpyrrolidone. In addition, quaternary ammonium salts such as benzyltriethylammonium chloride, tetrabutylammonium chloride, tetraethylammonium bromide can be used as catalysts of this reaction. Although the reaction time and the reaction temperature of this reaction depend on compounds, a concentration and the like to be used, they are appropriately selected from the range of the reaction time of 0.1 to 100 hours and the reaction temperature of 20° C. to 200° C. When a catalyst is used, it can be used in a range of 0.001 to 50% by mass to the total mass of compounds used.

For triazinetrione compounds having substituents represented by the formula (c2-6) on the nitrogen atom(s), compounds having one, two or three nitrogen atom(s) having substituent(s) on the nitrogen atom(s) represented by the formula (c2-6) are considered in this reaction, and any of the compounds can be used. In addition, the compounds can also be used in combination thereof. The compound having three substituents of the formula (c2-6), that is, the compound represented by the formula (c2-8) is preferably used. In the formula (c2-8), $A_1$, $A_2$ and $A_3$ represent hydrogen atoms, methyl groups or ethyl groups. The compound in which $A_1$, $A_2$ and $A_3$ are hydrogen atoms, or $A_1$ and $A_3$ are hydrogen atoms and $A_2$ is a methyl group is preferably used.

When the triazinetrione compound having two or three nitrogen atoms having substituents represented by the formula (c2-6) is used, the case that all of the substituents are reacted with the compounds of the formula (c2-7), or the case that only one or two substituent(s) in these groups are reacted with the compounds of the formula (c2-7) can be considered. The triazinetrione compounds used in the antireflective film forming composition according to the present invention include both cases. In the antireflective film forming composition according to the present invention, the compound obtained in a manner that all of the substituents in the compound of the formula (c2-8) having three substituents of the formula (c2-6) are reacted with the compound of the formula (c2-7), is preferably used, so that the compound represented by a formula (c2-18) is preferably used (in the formula (c2-18), Y represents a direct bonding or —C(=O)—; Ar represents a benzene ring or a naphthalene ring which may be substituted with an alkyl group having carbon atom(s) of 1 to 6, a phenyl group, a naphthyl group, a halogen atom, an alkoxycarbonyl group having carbon atom(s) of 1 to 6, a nitro group, a carboxyl group, a cyano group, an alkoxy group having carbon atom(s) of 1 to 6, a hydroxy group, a thiol group, an alkylthio group having carbon atom(s) of 1 to 6 or an amino group).

[Chemical Formula 29]

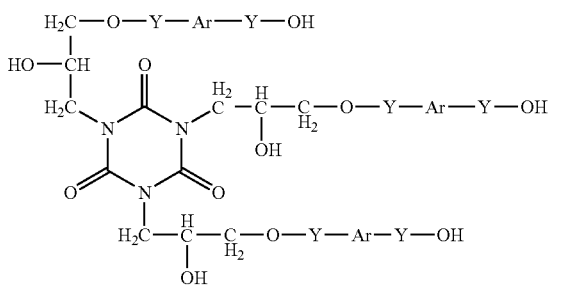

(c2-18)

Examples of compounds of the formula (c2-7) used for the reaction with triazinetrione compounds having substituents represented by the formula (c2-6) on the nitrogen atoms can include the compounds represented by formulae (c2-9) to (c2-14):

described triazinetrione ring structure have a linked structure through the nitrogen atoms with the linking group represented by the formula (c2-3), triazinetrione oligomer compounds or triazinetrione polymer compounds having structures represented by the formula (c2-5) can be used:

[Chemical Formula 31]

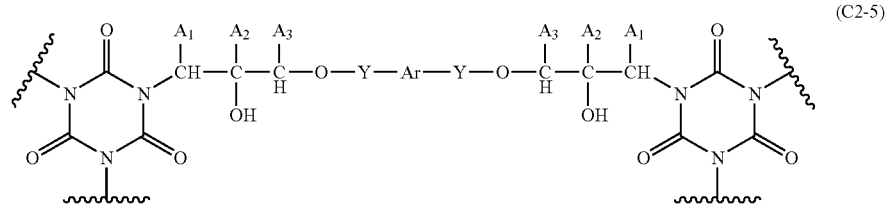

(C2-5)

[Chemical Formula 30]

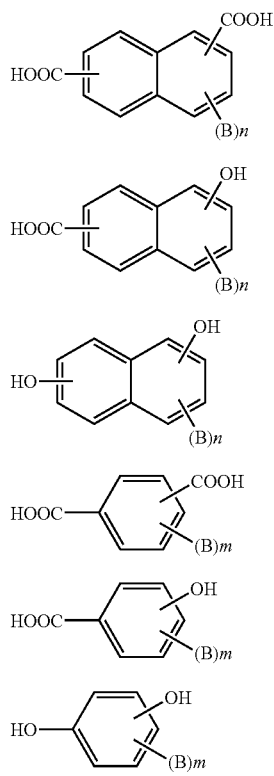

(where B represents a hydrogen atom, an alkyl group having carbon atom(s) of 1 to 6, a phenyl group, a naphthyl group, a halogen atom, an alkoxycarbonyl group having carbon atom(s) of 1 to 6, a nitro group, a carboxyl group, a cyano group, an alkoxy group having carbon atom(s) of 1 to 6, a hydroxy group, a thiol group, an alkylthio group having carbon atom(s) of 1 to 6 or an amino group; n represents the number of 1 to 6; m represents the number of 1 to 4, and when n and m are 2 or more, B may be the same or different). In the reaction, although the compounds of the formulae (c2-9) to (c2-14) can be used singly, the compounds can also be used in combination of two or more types.

For triazinetrione oligomer compounds or triazinetrione polymer compounds in which at least two of the above- In the formula (c2-5), each of $A_1$, $A_2$ and $A_3$ independently represents a hydrogen atom, a methyl group or an ethyl group; Y represents a direct bonding or —C(=O)—; Ar represents a benzene ring or a naphthalene ring which may be substituted with an alkyl group having carbon atom(s) of 1 to 6, a phenyl group, a naphthyl group, a halogen atom, an alkoxycarbonyl group having carbon atom(s) of 1 to 6, a nitro group, a carboxyl group, a cyano group, an alkoxy group having carbon atom(s) of 1 to 6, a hydroxy group, a thiol group, an alkylthio group having carbon atom(s) of 1 to 6 or an amino group.

Although a molecular weight of the triazinetrione oligomer compounds or the triazinetrione polymer compounds having structures represented by the formula (c2-5) is not particularly limited, weight average molecular weights thereof are, for example, 700 to 200000, or for example 1000 to 50000.

The triazinetrione oligomer compounds or the triazinetrione polymer compounds having structures represented by the formula (c2-5) can be obtained in a manner that the triazinetrione compound having two or three nitrogen atoms having substituents represented by the formula (c2-6) on the nitrogen atoms is reacted with an aromatic compound represented by the formula (c2-7). In the reaction, although the compound represented by the formula (c2-7) can be used singly, the compounds can also be used in combination of two or more types.

In the reaction, although triazinetrione compounds having two or three nitrogen atoms having substituents represented by the formula (c2-6) on the nitrogen atoms can be used singly, the compounds can also be used in combination thereof. The compound having three substituents of the formula (c2-6), that is, the compound represented by the formula (c2-8) is preferably used.

In the reaction, the case that all of the substituents of the triazinetrione compound having two or three nitrogen atoms having substituents of the formula (c2-6) are reacted with the compounds of the formula (c2-7) to participate in formation of the linking group of the formula (c2-3), or the case that one or two substituent(s) of the formula (c2-6) participates in formation of the linking group of the formula (c2-3), and the remaining substituent of the formula (c2-6) is not reacted or participates in formation of the substituent of the formula (c2-2) can be considered. For the triazinetrione oligomer compounds or the triazinetrione polymer compounds obtained by this reaction, the case that one or two substituent(s) of the formula (c2-6) in the triazine compounds which is raw materials for the production of these oligomer compounds or polymer compounds participates in formation of the linking group of the formula (c2-3), that is, in the formation of the oligomer structure or the polymer structure, and the remaining substituents of the formula (c2-6) is not reacted or participates in formation of the substituent of the formula (c2-2) is considered. In addition, the case that all (that is, two or three) substituents of the formula (c2-6) participates in formation of the linking group of the formula (c2-3), that is, in the formation of the oligomer structure or the polymer structure is also considered.

In the production of the triazinetrione oligomer compounds or the triazinetrione polymer compounds, the compound of the formula (c2-8) which is the compound having three substituents of the formula (c2-6) is preferably used, and particularly the compound of a formula (c2-19) is preferably used (in which $A_4$ represents a hydrogen atom or alkyl group).

[Chemical Formula 32]

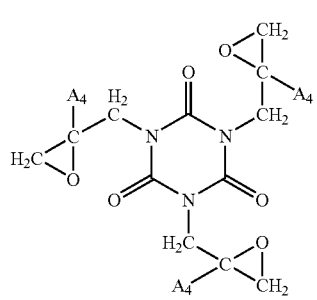

(c2-19)

For a compound of the formula (c2-7) used for producing the triazinetrione oligomer compounds or the triazinetrione polymer compounds having a structure represented by the formula (c2-5), the compound having a naphthalene ring or the compound having a benzene ring represented by the formulae (c2-9) to (c2-14) can be included. Although these compounds can be used singly, these compounds can also be used in combination of two or more types.

The triazinetrione compounds, the triazinetrione oligomer compounds and the triazinetrione polymer compounds obtained by the reaction of a triazinetrione compound having substituents represented by the formula (c2-6) on the nitrogen atoms with the phenyl compound or the naphthalene compound represented by the formula (c2-7) are included. The antireflection film forming composition according to the present invention contains any composition of a composition only containing such a triazinetrione compound, a composition only containing a triazinetrione oligomer compound and a composition only containing a triazinetrione polymer compound. In addition, any compositions of a composition made of a mixture of such a triazinetrione compound and a triazinetrione oligomer compound, a composition made of a mixture of such a triazinetrione compound and a triazinetrione polymer compound, a composition made of a mixture of such a triazinetrione oligomer compound and a triazinetrione polymer compound, and a composition made of a mixture of such a triazinetrione compound, a triazinetrione oligomer compound and a triazinetrione polymer compound are contained.

Moreover, a polymer forming the organic antireflective film (layer C) contains a polymer having a structure represented by a formula (c3-1).

[Chemical Formula 33]

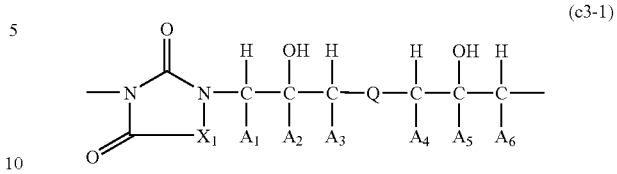

(c3-1)

In the organic antireflective film (layer C) forming composition for forming the organic antireflective film (layer C), the polymer having a structure represented by the formula (c3-1) is an essential component. A ratio of the polymer having a structure represented by the formula (c3-1) in the solid content in the antireflection film forming composition is 50% by mass or more, preferably 60% by mass or more, from a viewpoint of an antireflection effect. Although a ratio of the solid content in the antireflection film forming composition is not particularly limited as long as each component is uniformly dissolved in a solvent, the ratio is, for example, 0.5 to 50% by mass, or 1 to 30% by mass, or 5 to 25% by mass. Here, the solid content means components in which the solvent component is removed from the total components of the antireflective film forming composition.

In the formula (c3-1), each of $A_1$, $A_2$, $A_3$, $A_4$, $A_5$ and $A_6$ independently represents a hydrogen, a methyl group or an ethyl group. $X_1$ represents a formula (c3-2), a formula (c3-3) or a formula (c3-4).

[Chemical Formula 34]

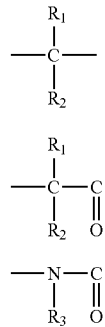

(c3-2)

(c3-3)

(c3-4)

Q represents a formula (c3-5) or a formula (c3-6).

[Chemical Formula 35]

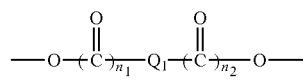

(c3-5)

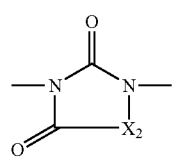

(c3-6)

In the formula (c3-2) and the formula (c3-3), each of $R_1$ and $R_2$ independently represent a hydrogen atom, an alkyl group having carbon atom(s) of 1 to 6, an alkenyl group having carbon atoms of 3 to 6, a benzyl group or a phenyl group. Specific examples of the alkyl groups include a methyl group, an ethyl group, an isopropyl group, a normalbutyl group, and a cyclohexyl group. Specific examples of the alkenyl groups include a 2-propenyl group and a 3-butenyl group. The phenyl group may be substituted with a group selected from a group consisting of an alkyl group having carbon atom(s) of 1 to 6, a halogen atom, an alkoxy group having carbon atom(s) of 1 to 6, a nitro group, a cyano group, a hydroxy group, and an alkylthio group having carbon atom(s) of 1 to 6. In addition, $R_1$ and $R_2$ may be bonded to each other to form a ring having carbon atoms of 3 to 6. Such rings include a cyclobutane ring, a cyclopentane ring and a cyclohexane ring.

In the formula (c3-4), $R_3$ represents an alkyl group having carbon atom(s) of 1 to 6, an alkenyl group having carbon atoms of 3 to 6, a benzyl group or a phenyl group. The phenyl group may be substituted with a group selected from a group consisting of an alkyl group having carbon atom(s) of 1 to 6, a halogen atom, an alkoxy group having carbon atom(s) of 1 to 6, a nitro group, a cyano group, a hydroxy group, and an alkylthio group having carbon atom(s) of 1 to 6. Specific examples of the alkyl groups and alkenyl groups include the same group as described above.

In the formula (c3-5), $Q_1$ represents an alkylene group having carbon atom(s) of 1 to 10, a phenylene group, a naphthylene group or an anthrylene group. Each of the phenylene group, the naphthylene group and the anthrylene group may be substituted with a group selected from a group consisting of an alkyl group having carbon atom(s) of 1 to 6, a halogen atom, an alkoxy group having carbon atom(s) of 1 to 6, a nitro group, a cyano group, a hydroxy group, and an alkylthio group having carbon atom(s) of 1 to 6. Specific examples of the alkylene groups include a methylene group, an ethylene group, a propylene group, a normalpentylene group, a cyclohexylene group, and a 2-methylpropylene group.

Each of $n_1$ and $n_2$ represents the number of 0 or 1, and $X_2$ represents the formula (c3-2) or the formula (c3-3).

Specific examples of the structures represented by the formula (c3-1) include structures represented by a formula (c3-13) to a formula (c3-31).

[Chemical Formula 36]

(c3-13)
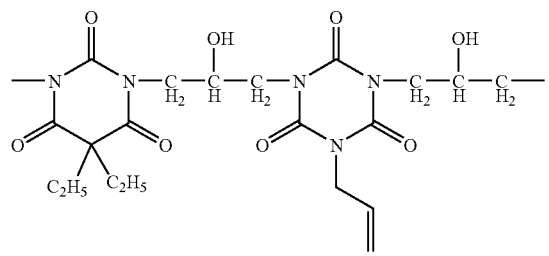

(c3-14)
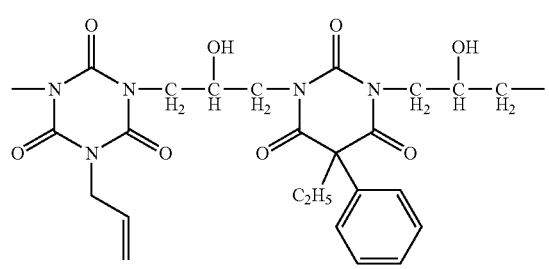

-continued (c3-15)
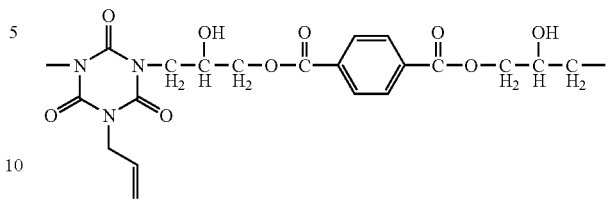

(c3-16)
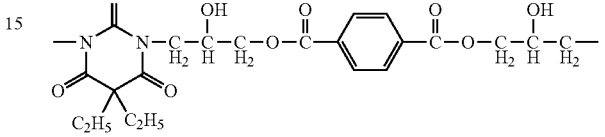

[Chemical Formula 37]

(c3-17)
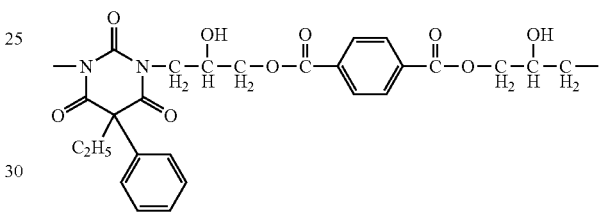

(c3-18)
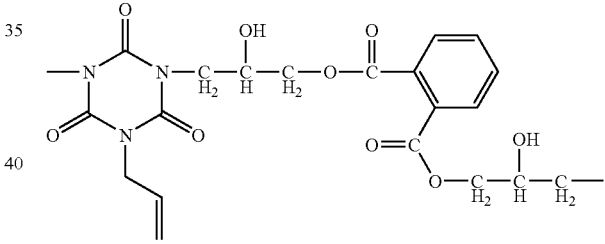

(c3-19)
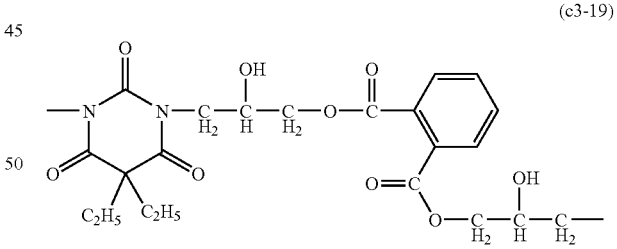

(c3-20)
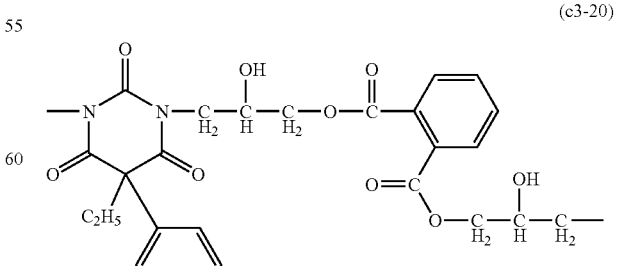

-continued

[Chemical Formula 38]

(c3-21)
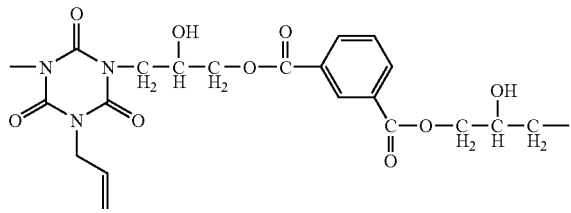

(c3-22)
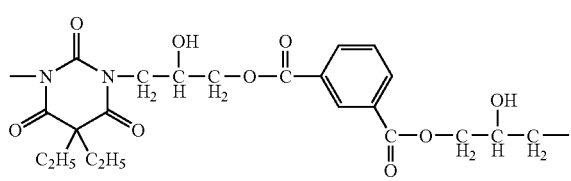

(c3-28)
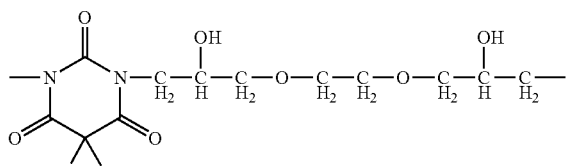

[Chemical Formula 40]

(c3-29)
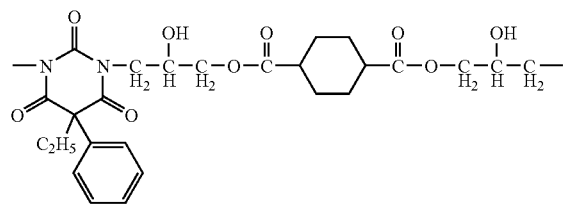

(c3-23)
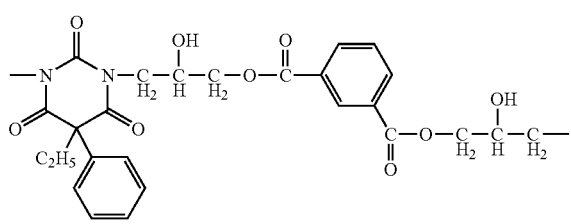

(c3-30)
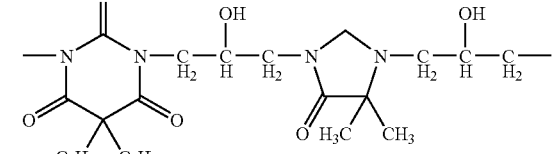

(c3-24)
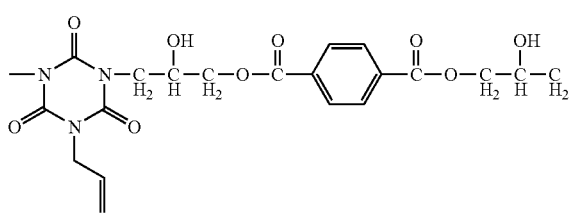

(c3-31)

[Chemical Formula 39]

(c3-25)
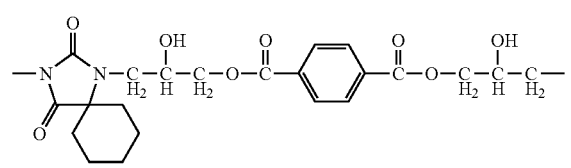

The polymer having a structure represented by the formula (c3-1) can be produced by the reaction of a compound represented by a formula (c3-7) with a compound represented by a formula (c3-8).

[Chemical Formula 41]

(c3-7)

(c3-26)
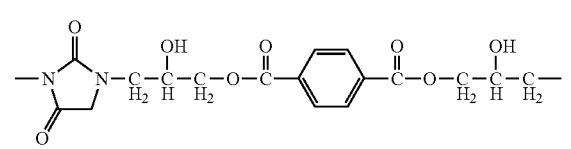

(c3-8)
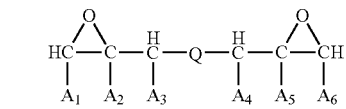

(c3-27)
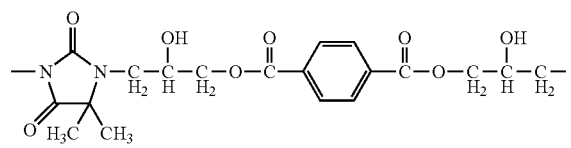

The reaction of the compound represented by the formula (c3-7) with the compound represented by the formula (c3-8) is preferably preformed in the solution state in which these compounds are dissolved in organic solvents such as benzene, toluene, xylene, ethyl lactate, butyl lactate, propylene glycol monomethyl ether, propylene glycol monomethyl ether acetate, and N-methylpyrrolidone. Moreover, in this reaction, quaternary ammonium salts such as benzyltriethylammonium chloride, tetrabutylammonium chloride and tetraethylammonium bromide can be used as catalysts. Although the reaction time and the reaction temperature of this reaction depend on compounds, a concentration and the like to be used, they are appropriately selected from the range of the reaction time of 0.1 to 100 hours and the reaction temperature of 20° C. to 200° C. When the catalyst is used, it can be used in a range of 0.001 to 30% by mass to the total mass of compounds used.

In addition, a ratio of the compound represented by the formula (c3-7) and the formula (c3-8) used for the reaction is, in molar ratio, 3:1 to 1:3 and preferably 3:2 to 2:3 as the compound represented by the formula (c3-7): the compound represented by the formula (c3-8).

In the reaction of the compound represented by the formula (c3-7) with the compound represented by the formula (c3-8), each two reaction sites (N—H sites) in the compound of the formula (c3-7) causes an epoxy ring opening reaction with the epoxy ring portions in different compounds of the formula (c3-8). As a result, the polymer having a structure represented by the formula (c3-1) is produced. It is considered that the polymer is made of repeating structures represented by the formula (c3-1).

Specific examples of the compound represented by the formula (c3-7) used for producing the polymer having the structure represented by the formula (c3-1) include hydantoin compounds such as hydantoin, 5,5-diphenylhydantoin, 5,5-dimethylhydantoin, 5-ethylhydantoin, 5-benzylhydantoin, 5-ethyl-5-phenylhydantoin, 5-methylhydantoin, 5,5-tetramethylenehydantoin, 5,5-pentamethylenehydantoin, 5-(4-hydroxybenzyl)hydantoin, 5-phenylhydantoin, 5-hydroxymethylhydantoin and 5-(2-cyanoethyl)hydantoin.

In addition, specific examples of the compound represented by the formula (c3-7) include barbituric acid compounds such as 5,5-diethylbarbituric acid, 5,5-diallylmalonylurea, 5-ethyl-5-isoamylbarbituric acid, 5-allyl-5-isobutylbarbituric acid, 5-allyl-5-isopropylbarbituric acid, 5-p-bromoallyl-5-sec-butylbarbituric acid, 5-ethyl-5-(1-methyl-1-butenyl)barbituric acid, 5-isopropyl-5-β-bromoallyl-barbituric acid, 5-(1-cyclohexyl)-5-ethylmalonylurea, 5-ethyl-5-(1-methyl butyl) malonylurea, 5,5-dibromobarbituric acid, 5-phenyl-5-ethylbarbituric acid and 5-ethyl-5-normalbutylbarbituric acid Moreover, specific examples of the compound represented by the formula (c3-7) include isocyanuric acid compounds such as monoallylisocyanuric acid, monomethylisocyanuric acid, monopropylisocyanuric acid, monoisopropylisocyanuric acid, monophenylisocyanuric acid, monobenzylisocyanuric acid, monochloroisocyanuric acid and monoethylisocyanuric acid.

Specific examples of the compound represented by the formula (c3-8) used for producing the polymer having the structure represented by the formula (c3-1) include diglycidyl compounds such as diglycidyl terephthalate, diglycidyl isophthalate, diglycidyl phthalate, diglycidyl 2,5-dimethylterephthalate, diglycidyl 2,5-diethylterephthalate, diglycidyl 2,3,5,6-tetrachloroterephthalate, diglycidyl 2,3,5,6-tetrabromoterephthalate, diglycidyl 2-nitroterephthalate, diglycidyl 2,3,5,6-tetrafluoroterephthalate, diglycidyl 2,5-dihydroxyterephthalate, diglycidyl 2,6-dimethylterephthalate, diglycidyl 2,5-dichloroterephthalate, diglycidyl 2,3-dichloroisophthalate, diglycidyl 3-nitroisophthalate, diglycidyl 2-bromoisophthalate, diglycidyl 2-hydroxyisophthalate, diglycidyl 3-hydroxyisophthalate, diglycidyl 2-methoxyisophthalate, diglycidyl 5-phenylisophthalate, diglycidyl 3-nitrophthalate, diglycidyl 3,4,5,6-tetrachlorophthalate, diglycidyl 4,5-dichlorophthalate, diglycidyl 4-hydroxyphthalate, diglycidyl 4-nitrophthalate, diglycidyl 4-methylphthalate, diglycidyl 3,4,5,6-tetrafluorophthalate, diglycidyl 2,6-naphthalenedicarboxylate, diglycidyl 1,2-naphthalenedicarboxylate, diglycidyl 1,4-naphthalenedicarboxylate, diglycidyl 1,8-naphthalenedicarboxylate, diglycidyl anthracene-9,10-dicarboxylate and ethylene glycol diglycidyl ether.

In addition, specific examples of the compound represented by the formula (c3-8) include diglycidylhydantoin compounds such as 1,3-diglycidylhydantoin, 1,3-diglycidyl-5,5-diphenylhydantoin, 1,3-diglycidyl-5,5-dimethylhydantoin, 1,3-diglycidyl-5-methylhydantoin, 1,3-diglycidyl-5-ethyl-5-phenylhydantoin, 1,3-diglycidyl-5-benzylhydantoin, 1,3-diglycidyl-5-hydantoin acetic acid, 1,3-diglycidyl-5-ethyl-5-methylhydantoin, 1,3-diglycidyl-5-methylhydantoin, 1,3-diglycidyl-5,5-tetramethylenehydantoin, 1,3-diglycidyl-5,5-pentamethylenehydantoin, 1,3-diglycidyl-5-(4-hydroxy benzyl)hydantoin, 1,3-diglycidyl-5-phenylhydantoin, 1,3-diglycidyl-5-hydroxymethylhydantoin and 1,3-diglycidyl-5-(2-cyanoethyl)hydantoin.

Moreover, specific examples of the compound represented by the formula (c3-8) include diglycidylbarbituric acid compounds such as 1,3-diglycidyl-5,5-diethylbarbituric acid, 1,3-diglycidyl-5-phenyl-5-ethylbarbituric acid, 1,3-diglycidyl-5-ethyl-5-isoamylbarbituric acid, 1,3-diglycidyl-5-allyl-5-isobutylbarbituric acid, 1,3-diglycidyl-5-allyl-5-isopropylbarbituric acid, 1,3-diglycidyl-5-β-bromoallyl-5-sec-butylbarbituric acid, 1,3-diglycidyl-5-ethyl-5-(1-methyl-1-butenyl)barbituric acid, 1,3-diglycidyl-5-isopropyl-5-O-bromoallylbarbituric acid, 1,3-diglycidyl-5-(1-cyclohexyl)-5-ethylmalonylurea, 1,3-diglycidyl-5-ethyl-5-(1-methylbutyl)malonylurea, 1,3-diglycidyl-5,5-diallylmalonylurea diglycidyl and 1,3-diglycidyl-5-ethyl-5-normalbutylbarbituric acid.

In the production of the polymer having the structure represented by the formula (c3-1), although each compounds represented by the formula (c3-7) and the formula (c3-8) can be used singly, the compounds can also be used in combination of two or more types.

For example, when monoallylisocyanuric acid is used as the compound of the formula (c3-7) and diglycidyl terephthalate is used as the compound of the formula (c3-8), it is considered that the obtained polymer is a polymer made of the structure of the formula (c3-15). In addition, for example, 5,5-diethylbarbituric acid is used as the compound of the formula (c3-7), and diglycidyl terephthalate and ethylene glycol diglycidyl ether are used as the two types of the compounds of the formula (c3-8), it is considered that the obtained polymer is a polymer made of the structure of the formula (c3-16) and the structure of the formula (c3-27).

The polymer having the structure represented by the formula (c3-1) can be produced by the reaction of a compound represented by a formula (c3-9) with a compound represented by a formula (c3-10).

[Chemical Formula 42]

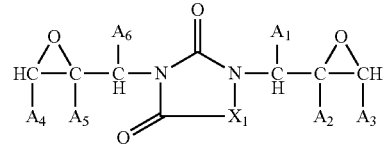

(c3-9)

H-Q-H (c3-10)

The reaction of the compound represented by the formula (c3-9) and the formula (c3-10) can be performed in a similar condition to the reaction of the compound represented by the formula (c3-7) and the formula (c3-8).

In addition, a ratio of the compound represented by the formula (c3-9) and the formula (c3-10) used for the reaction is, in molar ratio, 3:1 to 1:3 and preferably 3:2 to 2:3 as the formula (c3-9): the formula (c3-10).

In the reaction of the compound represented by the formula (c3-9) with the compound represented by the formula (c3-10), each of two reaction sites (N—H sites or O—H sites) in the compound of the formula (c3-10) causes an epoxy ring opening reaction with the epoxy ring portions in different compounds of the formula (c3-9). As a result, a polymer having a structure represented by the formula (c3-1) is produced. It is considered that the polymer is made of the repeating structures represented by the formula (c3-1).

Specific examples of the compounds represented by the formula (c3-9) which are used for producing the polymer having the structure represented by the formula (c3-1) include the diglycidylhydantoin compounds and the diglycidylbarbituric acid compounds in the specific examples of the formula (c3-8). In addition, diglycidylisocyanuric acid compounds such as monoallyldiglycidylisocyanuric acid, monoethyldiglycidylisocyanuric acid, monopropyldiglycidylisocyanuric acid, monoisopropyldiglycidylisocyanuric acid, monophenyldiglycidylisocyanuric acid, monobromodiglycidylisocyanuric acid and monomethyldiglycidylisocyanuric acid can further be included.

Specific examples of the compounds represented by the formula (c3-10) which are used for producing the polymer having the structure represented by the formula (c3-1) can include the hydantoin compounds and the barbituric acid compounds in the specific examples of the formula (c3-7). In addition, compounds such as terephthalic acid, isophthalic acid, phthalic acid, 2,5-dimethylterephthalic acid, 2,5-diethylterephthalic acid, 2,3,5,6-tetrachloroterephthalic acid, 2,3,5,6-tetrabromoterephthalic acid, 2-nitroterephthalic acid, 2,3,5,6-tetrafluoroterephthalic acid, 2,5-dihydroxyterephthalic acid, 2,6-dimethylterephthalic acid, 2,5-dichloroterephthalic acid, 2,3-dichloroisophthalic acid, 3-nitroisophthalic acid, 2-bromoisophthalic acid, 2-hydroxyisophthalic acid, 3-hydroxyisophthalic acid, 2-methoxyisophthalic acid, 5-phenylisophthalic acid, 3-nitrophthalic acid, 3,4,5,6-tetrachlorophthalic acid, 4,5-dichlorophthalic acid, 4-hydroxyphthalic acid, 4-nitrophthalic acid, 4-methylphthalic acid, 3,4,5,6-tetrafluorophthalic acid, 2,6-naphthalenedicarboxylic acid, 1,2-naphthalenedicarboxylic acid, 1,4-naphthalenedicarboxylic acid, 1,8-naphthalenedicarboxylic acid, anthracene-9,10-dicarboxylic acid, ethylene glycol, 1,3-propanedicarboxylic acid, and 4-hydroxybenzoic acid.

In the production of the polymer having a structure represented by the formula (c3-1), although each compound represented by the formula (c3-9) and the formula (c3-10) can be used singly, the compound can also be used in combination of two or more types. For example, when monoallyldiglycidylisocyanuric acid is used as the compound of the formula (c3-9) and 5,5-diethylbarbituric acid is used as the compound of the formula (c3-10), it is considered that the obtained polymer is a polymer made of the structure of the formula (c3-13).

For example, when monoallyldiglycidylisocyanuric acid is used as the compound of the formula (c3-9), and terephthalic acid and 5,5-diethylbarbituric acid are used as the two types of the compound of the formula (c3-10) are used, it is considered that the obtained polymer is a polymer made of the structures of the formula (c3-13) and the structures of the formula (c3-24).

In the antireflection film forming composition according to the present invention, for a polymer having the structure represented by the formula (c3-1), polymers can be used singly or in combination of two or more types.

A molecular weight of the polymer having the structure represented by the formula (c3-1) contained in the antireflection film forming composition according to the present invention is, for example, 1000 to 200000, or for example 3000 to 100000, or 5000 to 20000 as a weight average molecular weight.

In addition, the polymer forming the organic antireflective film (layer C) contains a polymer having the repeating unit structures represented by a formula (c4-1) or a formula (c4-2).

[Chemical Formula 43]

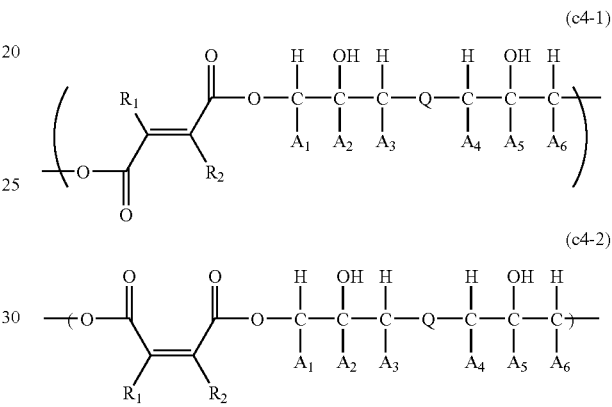

In the organic antireflective film (layer C) forming composition for forming the organic antireflective film (layer C), a ratio of the polymer having the repeating unit structures represented by the formula (c4-1) or the formula (c4-2) in the solid content of the antireflection film forming composition is, from a viewpoint of antireflection effect, 50% by mass or more, preferably 60% by mass or more, for example 50 to 100% by mass, or 60 to 99% by mass, or 70 to 95% by mass. Although a ratio of the solid content in the antireflection film forming composition according to the present invention is not particularly limited as long as each component is uniformly dissolved in a solvent, the ratio is, for example, 1 to 50% by mass, or 5 to 30% by mass, or 10 to 25% by mass. Here, the solid content means components in which the solvent component is removed from the total components of the antireflective film forming composition for lithography.

[Chemical Formula 44]

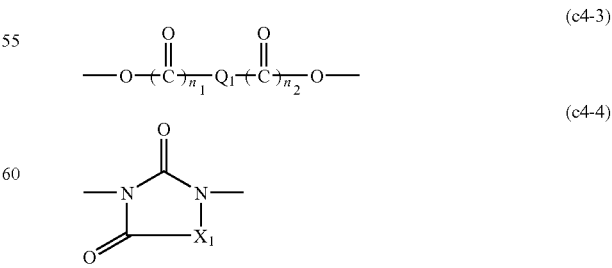

In the formula (c4-1) and the formula (c4-2), each of $R_1$ and $R_2$ independently represents a hydrogen atom, a methyl group, an ethyl group or a halogen atom; each of $A_1$, $A_2$, $A_3$, $A_4$, $A_5$ and $A_6$ independently represents a hydrogen atom, a methyl group or an ethyl group; Q represents the formula (c4-3) or the formula (c4-4). The halogen atom is a fluorine atom, a chlorine atom, a bromine atom or an iodine atom.

In the formula (c4-3), $Q_1$ represents an alkylene group having carbon atom(s) of 1 to 15, a phenylene group, a naphthylene group or an anthrylene group. Each of the phenylene group, the naphthylene group and the anthrylene group may be substituted with a group selected from a group consisting of an alkyl group having carbon atom(s) of 1 to 6, a halogen atom, an alkoxy group having carbon atom(s) of 1 to 6, a nitro group, a cyano group, a hydroxy group, and an alkylthio group having carbon atom(s) of 1 to 6.

Specific examples of the alkyl groups include a methyl group, an ethyl group, an isopropyl group, a normalbutyl group, and a cyclohexyl group. Specific examples of the alkoxy groups include a methoxy group, an ethoxy group, a normalpentyloxy group, an isopropoxy group, and a cyclohexyloxy group. Specific examples of the alkylthio groups include a methylthio group, an ethylthio group, a normalpentylthio group, an isopropylthio group, and a cyclohexylthio group. The halogen atom is a fluorine atom, a chlorine atom, a bromine atom or an iodine atom.

Specific examples of the alkylene groups include linear alkylene groups such as a methylene group, an ethylene group, a normalpropylene group, a normalpentylene group and a normaloctylene group; branched alkylene groups such as a 2-methylpropylene group, and a 1,4-dimethylbutylene group; and cyclic alkylene groups such as a cyclopentylene group, a cyclobutylene group, a cyclohexylene group and a 2-methylcyclohexylene group. Moreover, when $Q_1$ is a phenylene group, a naphthylene group and an anthrylene group, bonding positions thereof are not particularly limited. That is, for example, the case that the phenylene group is bonded at the first position and the second position; the case that the phenylene group is bonded at the first position and the third position; or the case that the phenylene group is bonded at the first position and the fourth position; the case that the naphthylene group is bonded at the first position and the second position; the case that the naphthylene group is bonded at the first position and the fourth position; the case that the naphthylene group is bonded at the first position and the fifth position; or the case that the naphthylene group is bonded at the second position and the third position; the case that the anthrylene group is bonded at the first position and the second position; the case that the anthrylene group is bonded at the first position and the fourth position; or the case that the anthrylene group is bonded at ninth position and tenth position may exist, and any case is possible. In addition, each of $n_1$ and $n_2$ represents the number of 0 or 1.

In the formula (c4-4), $X_1$ represents a formula (c4-5), a formula (c4-6) or a formula (c4-7). When $X_1$ is the formula (c4-6) in the formula (c4-4), the structure thereof is a formula (c4-4-6), and when $X_1$ is the formula (c4-7), the structure thereof is a formula (c4-4-7).

[Chemical Formula 45]

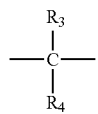

(c4-5)

-continued

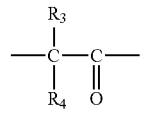

(c4-6)

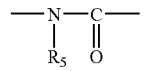

(c4-7)

[Chemical Formula 46]

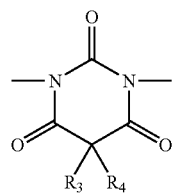

(c4-4-6)

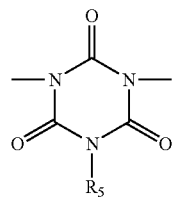

(c4-4-7)

In the formula (c4-5) and the formula (c4-6), each of $R_3$ and $R_4$ independently represents a hydrogen atom, an alkyl group having carbon atom(s) of 1 to 6, an alkenyl group having carbon atoms of 3 to 6, a benzyl group or a phenyl group. Specific examples of alkyl groups include the same groups as described above. Specific examples of alkenyl groups include a 2-propenyl group and a 3-butenyl group. In addition, the phenyl group may be substituted with a group selected from a group consisting of an alkyl group having carbon atom(s) of 1 to 6, a halogen atom, an alkoxy group having carbon atom(s) of 1 to 6, a nitro group, a cyano group, a hydroxy group, and an alkylthio group having carbon atom(s) of 1 to 6. Specific examples of alkyl groups, alkoxy groups and alkylthio groups include the same groups as described above. In addition, $R_3$ and $R_4$ are bonded to each other and may form a ring having carbon atoms of 3 to 6 including the carbon atoms to which $R_3$ and $R_4$ are bonded. Such rings include a cyclobutane ring, a cyclopentane ring and a cyclohexane ring.

In the formula (c4-7), $R_5$ represents an alkyl group having carbon atom(s) of 1 to 6, an alkenyl group having carbon atoms of 3 to 6, a benzyl group or a phenyl group. The phenyl group may be substituted with a group selected from a group consisting of an alkyl group having carbon atom(s) of 1 to 6, a halogen atom, an alkoxy group having carbon atom(s) of 1 to 6, a nitro group, a cyano group, a hydroxy group, and an alkylthio group having carbon atom(s) of 1 to 6. Specific examples of alkyl groups, alkenyl groups, alkoxy groups and alkylthio groups include the same groups as described above.

Specific examples of the repeating unit structure represented by the formula (c4-1) or the formula (c-4-2) include structures of a formula (c4-19) to a formula (c4-34).

[Chemical Formula 47]
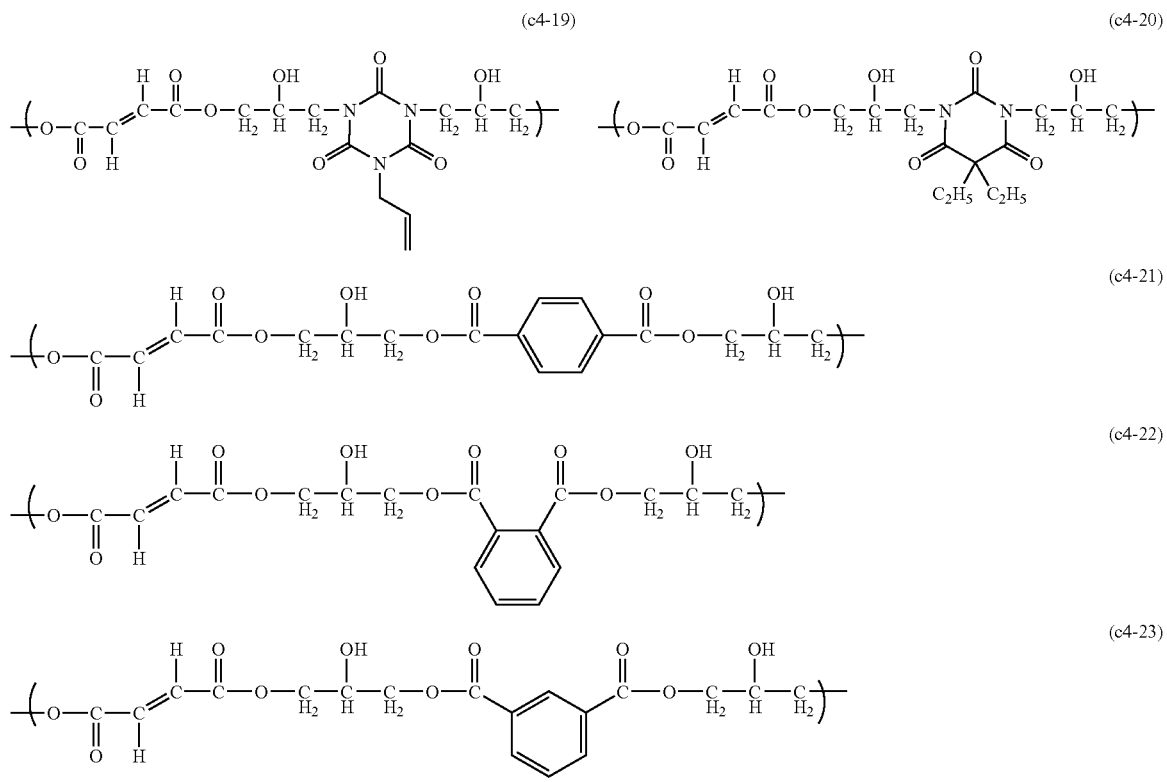
[Chemical Formula 48]
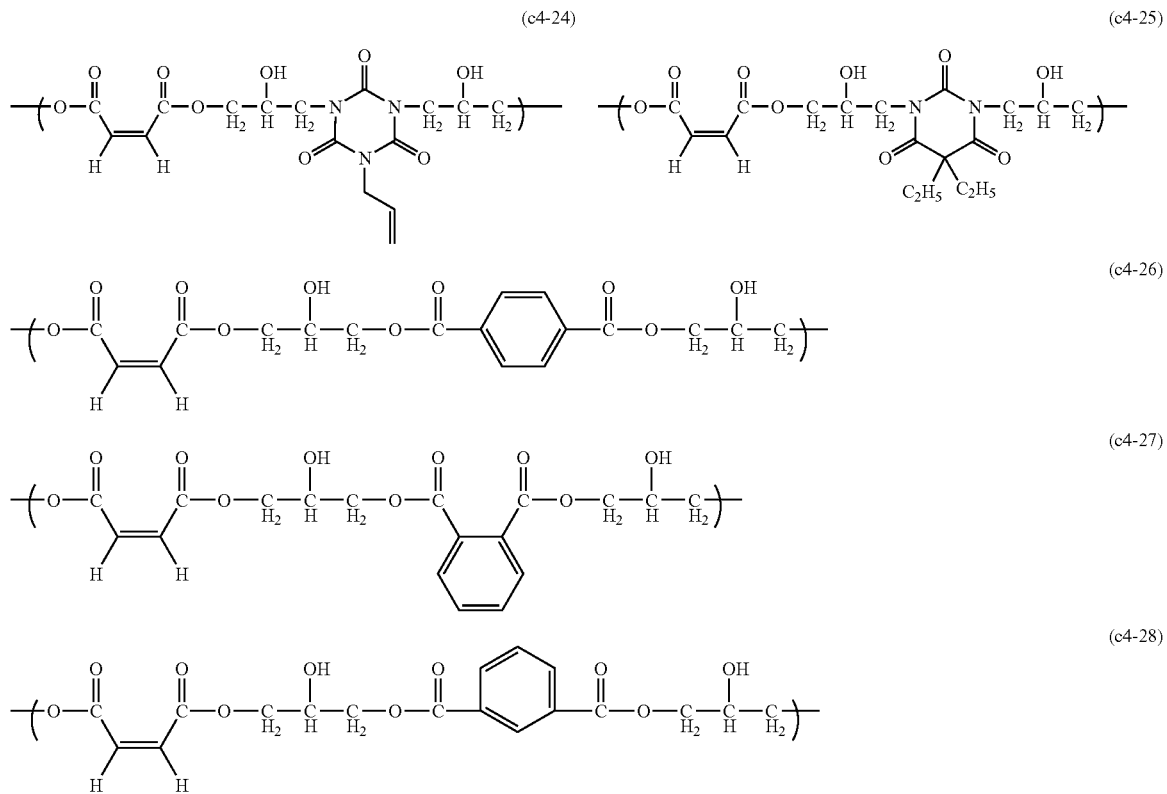

[Chemical Formula 49]

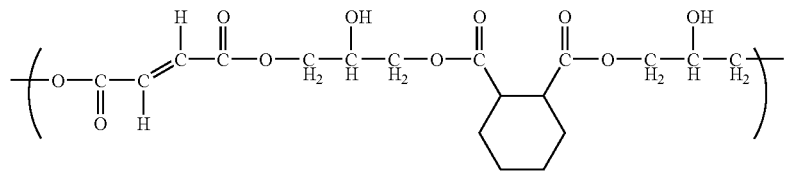
(c4-29)

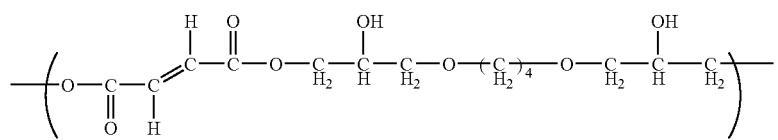
(c4-30)

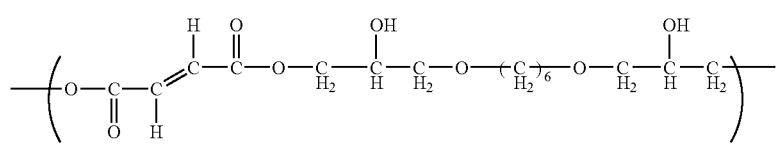
(c4-31)

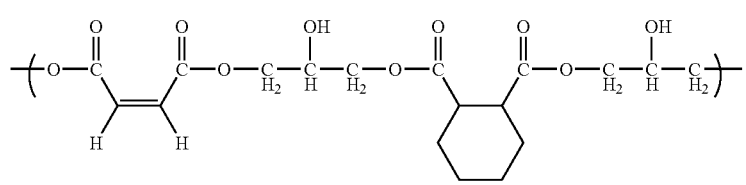
(c4-32)

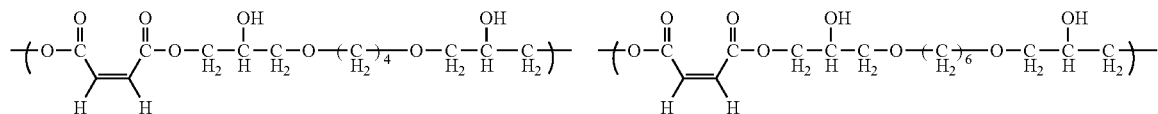

(c4-33)      (c4-34)

The polymer having the repeating unit structure represented by the formula (c4-1) or the formula (c4-2) can be produced by, for example, a polyaddition reaction of the compound represented by a formula (c4-8) or a formula (c4-9) with the compound represented by a formula (c4-10).

The polymer having the repeating unit structure represented by the formula (c4-1) can be produced by, for example, a polyaddition reaction of the compound represented by the formula (c4-8) (a dicarboxylic acid compound) with the compound represented by the formula (c4-10) (a diepoxy compound) (the following reaction formula (R-1)). The polymer having the repeating unit structure represented by the formula (c4-2) can be produced by, for example, a polyaddition reaction of the compound represented by the formula (c4-9) (a dicarboxylic acid compound) with the compound represented by the formula (c4-10) (a diepoxy compound) (the following reaction formula (R-2)).

[Chemical Formula 50]

(R-1)

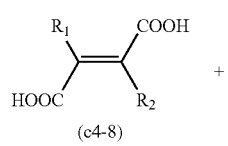

(c4-8)

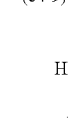

-continued

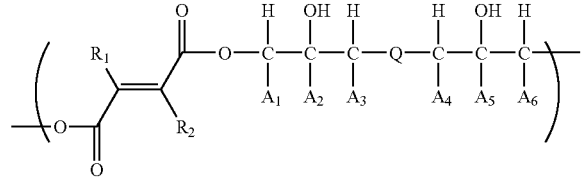

(c4-10)

(c4-1)

(R-2)

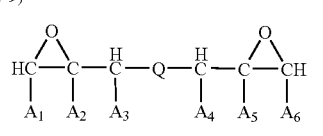

(c4-9)

-continued

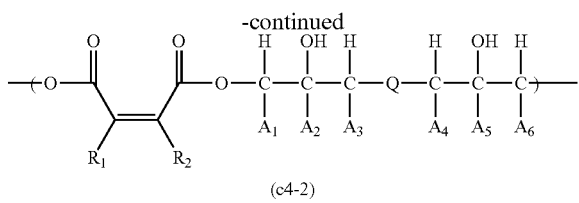

(c4-2)

When only the compound represented by the formula (c4-8) and the compound represented by the formula (c4-10) are used for producing the polymer having the repeating unit structure represented by the formula (c4-1), it is considered that the obtained polymer is a polymer having the structure substantially represented by the formula (c4-1) only as repeating unit structures except terminal parts of the polymer. When only the compound represented by the formula (c4-9) and the compound represented by the formula (c4-10) are used for producing the polymer having the repeating unit structure represented by the formula (c4-2), it is considered that the obtained polymer is a polymer having the structure substantially represented by the formula (c4-2) only as repeating unit structures except terminal parts of the polymer.

The reaction of the compound represented by the formula (c4-8) or the formula (c4-9) with the compound represented by the formula (c4-10) is preferably performed in the solution state in which these compounds are dissolved in organic solvents such as benzene, toluene, xylene, ethyl lactate, butyl lactate, propylene glycol monomethyl ether, propylene glycol monomethyl ether acetate, and N-methylpyrrolidone. Moreover, in this reaction, quaternary ammonium salts such as benzyltriethylammonium chloride, tetrabutylammonium chloride and tetraethylammonium bromide can be used as catalysts. Although the reaction time and the reaction temperature of this reaction depend on compounds, a concentration and the like to be used, they are appropriately selected from the range of the reaction time of 0.1 to 100 hours and the reaction temperature of 20° C. to 200° C. When the catalyst is used, it can be used in a range of 0.001 to 30% by mass to the total mass of compounds used.

In addition, a ratio of the compound represented by the formula (c4-8) or the formula (c4-9) used for the reaction and the compound represented by the formula (c4-10) is, in molar ratio, 3:1 to 1:3, preferably 3:2 to 2:3, or 5:4 to 4:5, or 1, as the compound represented by the formula (c4-8) or the formula (c4-9): the compound represented by the formula (c4-10).

In addition, the polymer obtained by the reaction of the mixture of the compounds of the formula (c4-8) and the formula (c4-9) with the compounds of the formula (c4-10) can also be used. In this case, the polymer is a polymer having the repeating unit structure represented by the formula (c4-1) and the repeating unit structure represented by the formula (c4-2). When the mixture of the compound of the formula (c4-8) and the formula (c4-9) is used, the used ratio of the mixture is, in molar ratio, 3:1 to 1:3, preferably 3:2 to 2:3, or 5:4 to 4:5, or 1:1, as the mixture of the compound of the formula (c4-8) and the formula (c4-9): the compound of the formula (c4-10).

The reaction of the compound represented by the formula (c4-8) or the formula (c4-9) with the compound represented by the formula (c4-10) is, for example, preformed as follows. The compound represented by the formula (c4-8) or the formula (c4-9) and the compound represented by the formula (c4-10) are dissolved in appropriate organic solvents in a molar ratio of 5:4 to 4:5 or 1:1, and in a concentration of the total of both compounds of 10 to 40% by mass or 15 to 35% by mass. Then, a quaternary ammonium salt such as benzyltriethylammonium chloride is added in a ratio of 0.1 to 5% by mass or 0.5 to 3% by mass to the total mass of the compound represented by the formula (c4-8) or the formula (c4-9) and the compound represented by the formula (c4-10). Thereafter, the reaction can be performed at a reaction temperature of 80° C. to 150° C. and a reaction time of 5 to 30 hours.

Examples of the compounds represented by the formula (c4-8) include fumaric acid, hydroxyfumaric acid, and chlorofumaric acid.

Examples of the compounds represented by the formula (c4-9) include maleic acid, methylmaleic acid, bromomaleic acid, dibromomaleic acid, isopropylmaleic acid, and phenylmaleic acid.

Examples of the compounds represented by the formula (c4-10) include diglycidyl terephthalate compounds such as diglycidyl terephthalate, diglycidyl 2,5-dimethylterephthalate, diglycidyl 2,5-diethylterephthalate, diglycidyl 2,3,5,6-tetrachloroterephthalate, diglycidyl 2,3,5,6-tetrabromoterephthalate, diglycidyl 2-nitroterephthalate, diglycidyl 2,3,5,6-tetrafluoroterephthalate, diglycidyl 2,5-dihydroxyterephthalate, diglycidyl 2,6-dimethylterephthalate and diglycidyl 2,5-dichloroterephthalate. In addition, examples of the compounds include diglycidyl isophthalate compounds such as diglycidyl isophthalate, diglycidyl 2,3-dichloroisophthalate, diglycidyl 3-nitroisophthalate, diglycidyl 2-bromoisophthalate, diglycidyl 2-hydroxyisophthalate, diglycidyl 3-hydroxyisophthalate, diglycidyl 2-methoxyisophthalate and diglycidyl 5-phenylisophthalate. Moreover, examples of the compounds include diglycidyl phthalate compounds such as diglycidyl phthalate, diglycidyl 3-nitrophthalate, diglycidyl 3,4,5,6-tetrachlorophthalate, diglycidyl 4,5-dichlorophthalate, diglycidyl 4-hydroxyphthalate, diglycidyl 4-nitrophthalate, diglycidyl 4-methylphthalate, and diglycidyl 3,4,5,6-tetrafluorophthalate.

In addition, examples of the compounds represented by the formula (c4-10) include diglycidylhydantoin compounds such as 1,3-diglycidylhydantoin, 1,3-diglycidyl-5,5-diphenylhydantoin, 1,3-diglycidyl-5,5-dimethylhydantoin, 1,3-diglycidyl-5-methylhydantoin, 1,3-diglycidyl-5-ethyl-5-phenylhydantoin, 1,3-diglycidyl-5-benzylhydantoin, 1,3-diglycidyl-5-hydantoin acetic acid, 1,3-diglycidyl-5-ethyl-5-methylhydantoin, 1,3-diglycidyl-5-methylhydantoin, 1,3-diglycidyl-5,5-tetramethylenehydantoin, 1,3-diglycidyl-5,5-pentamethylenehydantoin, 1,3-diglycidyl-5-(4-hydroxybenzyl)hydantoin, 1,3-diglycidyl-5-phenylhydantoin, 1,3-diglycidyl-5-hydroxymethylhydantoin and 1,3-diglycidyl-5-(2-cyanoethyl)hydantoin.

Moreover, examples of the compounds represented by the formula (c4-10) include diglycidylbarbituric acid compounds such as 1,3-diglycidyl-5,5-diethylbarbituric acid, 1,3-diglycidyl-5-phenyl-5-ethylbarbituric acid, 1,3-diglycidyl-5-ethyl-5-isoamylbarbituric acid, 1,3-diglycidyl-5-allyl-5-isobutylbarbituric acid, 1,3-diglycidyl-5-allyl-5-isopropylbarbituric acid, 1,3-diglycidyl-5-β-bromoallyl-5-sec-butylbarbituric acid, 1,3-diglycidyl-5-ethyl-5-(1-methyl-1-butenyl)barbituric acid, 1,3-diglycidyl-5-isopropyl-5-p-bromoallylbarbituric acid, 1,3-diglycidyl-5-(1-cyclohexyl)-5-ethylmalonylurea, 1,3-diglycidyl-5-ethyl-5-(1-methylbutyl)malonylurea, 1,3-diglycidyl-5,5-diallylmalonylurea diglycidyl and 1,3-diglycidyl-5-ethyl-5-normalbutylbarbituric acid.

In addition, examples of the compounds represented by the formula (c4-10) can include diglycidylisocyanuric acid compounds such as allyldiglycidylisocyanuric acid, ethyldiglycidylisocyanuric acid, propyldiglycidylisocyanuric acid, isopropyldiglycidylisocyanuric acid, phenyldiglycidylisocyanuric acid, 2-chlorophenyldiglycidylisocyanuric acid, benzyldiglycidylisocyanuric acid and methyldiglycidylisocyanuric acid.

Examples of the compounds represented by the formula (c4-10) include diglycidyl naphthalenedicarboxylate compounds such as diglycidyl 2,6-naphthalenedicarboxylate, diglycidyl 1,2-naphthalenedicarboxylate, diglycidyl 1,4-naphthalenedicarboxylate and diglycidyl 1,8-naphthalenedicarboxylate.

Examples of the compounds represented by the formula (c4-10) include, for example, diglycidyl anthracenedicarboxylate compounds such as diglycidyl anthracene-9,10-dicarboxylate.

In addition, examples of the compounds represented by the formula (c4-10) include diglycidyl aliphatic dicarboxylate compounds such as diglycidyl 1,2-cyclohexanedicarboxylate, diglycidyl 1,3-cyclohexanedicarboxylate, diglycidyl 1,4-cyclohexanedicarboxylate, diglycidyl 1,5-pentanedicarboxylate, diglycidyl 1,4-pentanedicarboxylate, diglycidyl 1,3-pentanedicarboxylate, diglycidyl 1,3 propanedicarboxylate, diglycidyl 1,4-butanedicarboxylate, diglycidyl 1,3-butanedicarboxylate, diglycidyl 1,6-hexanedicarboxylate, diglycidyl 1,5-hexanedicarboxylate, diglycidyl 1,4-hexanedicarboxylate, diglycidyl 1,3-hexanedicarboxylate and diglycidyl 1,2-hexanedicarboxylate.

Moreover, examples of the compounds represented by the formula (c4-10) include diglycidyl ether compounds such as 1,5-naphthalenediol diglycidyl ether, 2,6-naphthalenediol diglycidyl ether, 1,2-naphthalenediol diglycidyl ether, 1,4-naphthalenediol diglycidyl ether, 1,8-naphthalenediol diglycidyl ether, anthracen-9,10-diol diglycidyl ether, diglycidyl resorcinol, diglycidyl catechol, 1,4-benzenediol diglycidyl ether, 1,4-butanediol diglycidyl ether, 1,6-hexanediol diglycidyl ether, 1,3-propanediol diglycidyl ether, 1,5-pentanediol diglycidyl ether and ethylene glycol diglycidyl ether.

Examples of the compounds represented by the formula (c4-10) include the compounds represented by a formula (c4-11).

[Chemical Formula 51]

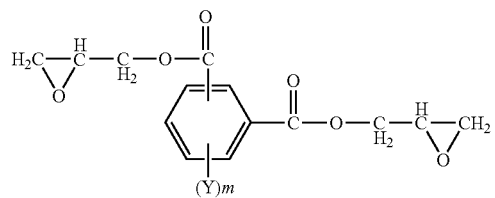

(c4-11)

In the formula (c4-11), Y represents an alkyl group having carbon atom(s) of 1 to 6, a halogen atom, an alkoxy group having carbon atom(s) of 1 to 6, a nitro group, a cyano group, a hydroxy group or an alkylthio group having carbon atom(s) of 1 to 6. m represents an integer of 0 to 4. When m is 2 to 4, the Y may be the same or different. When m is 0 to 3, the other (4-m) positions are hydrogen atoms. Specific examples of the alkyl group, the alkoxy group and the alkylthio group include the same groups as described above. Specific examples of the compounds represented by the formula (c4-11) include the above-described diglycidyl terephthalate compounds, diglycidyl isophthalate compounds and diglycidyl phthalate compounds.

When fumaric acid is used as the compound of the formula (c4-8) and diglycidyl terephthalate is used as the compound of the formula (c4-10), it is considered that the obtained polymer is a polymer having the structure represented by the formula (c4-21) as a repeating unit structure. In addition, for example, when fumaric acid is used as the compound of the formula (c4-8) and diglycidyl terephthalate and 1,4-butanediol diglycidyl ether are used as the two types of the compounds of the formula (c4-10), it is considered that the obtained polymer is a polymer having the structures represented by the formula (c4-21) and the formula (c4-30) as repeating unit structures.

In addition, the polymer (c4) includes a polymer having the repeating unit structure represented by a formula (c4-12).

[Chemical Formula 52]

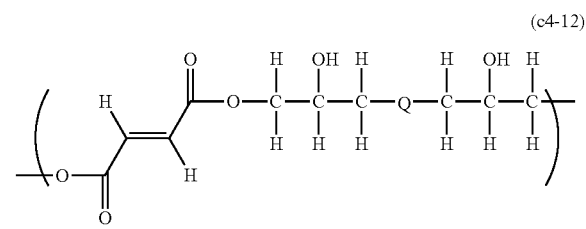

(c4-12)

Such a polymer can be produced by a polyaddition reaction of fumaric acid with the compound represented by the formula (c4-10).

Moreover, the polymer (c4) includes a polymer having the repeating unit structure represented by a formula (c4-13) and a formula (c4-14).

[Chemical Formula 53]

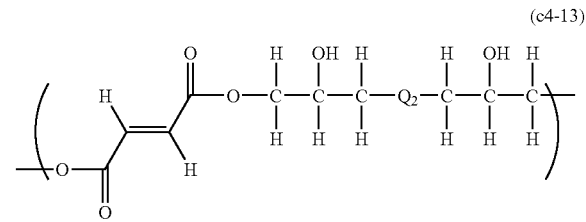

(c4-13)

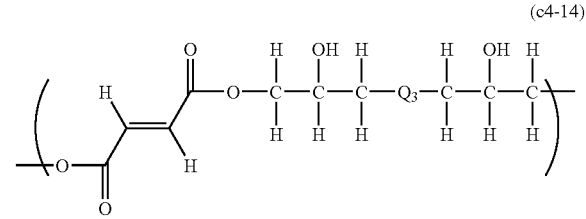

(c4-14)

In the formulae, $Q_2$ represents a structure represented by a formula (c4-15), a formula (c4-16) or a formula (c4-17), and $Q_3$ represents a structure represented by a formula (c4-18).

[Chemical Formula 54]

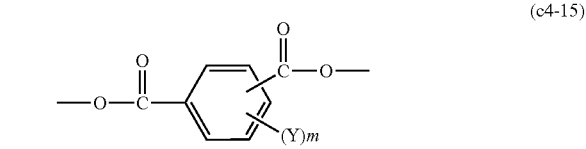

(c4-15)

-continued (c4-16)
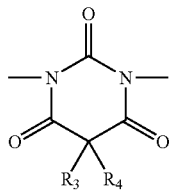

(c4-17)
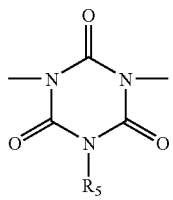

[Chemical Formula 55]

(c4-18)
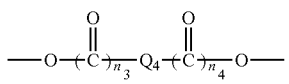

Here, Y, m, $R_3$, $R_4$ and $R_5$ mean the same as defined above. In the formula (c4-18), $Q_4$ represents an alkylene group having carbon atom(s) of 1 to 15, and each of $n_3$ and $n_4$ represents the number of 0 or 1. Examples of the alkylene groups include linear alkylene groups such as a methylene group, an ethylene group, a normalpropylene group and a normalpentylene group; branched alkylene groups such as a 2-methylpropylene group and a 1,4-dimethylbutylene group; and cyclic alkylene groups such as a cyclopentylene group, a cyclobutylene group and a cyclohexylene group.

The polymer having such a repeating unit structure represented by the formula (c4-13) and such a repeating unit structure represented by the formula (c4-14) can be produced by reacting fumaric acid with a compound selected from a group consisting of compounds represented by the formula (c4-11), diglycidyl barbituric acid compounds and diglycidyl isocyanuric acid compounds, and with a compound represented by a formula (c4-35).

[Chemical Formula 56]

(c4-35)
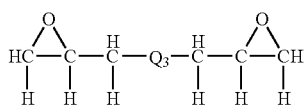

For example, when fumaric acid, and 1,3-diglycidyl-5,5-diethylbarbituric acid and diglycidyl 1,2-cyclohexanedicarboxylate are used for producing the polymer, it is considered that the obtained polymer is a polymer having the structures represented by the formula (c4-20) (in the formula (c4-13), $Q_2$ is the formula (c4-16) (in which both $R_3$ and $R_4$ are ethyl groups)) and the formula (c4-29) (in the formula (c4-14), $Q_3$ is the formula (c4-18) (in which both $n_3$ and $n_4$ are 1 and $Q_4$ is a 1,2-cyclohexylene group)), as repeating unit structures.

Polymers having the repeating unit structures represented by the formula (c4-1) or the formula (c4-2) contained in the antireflection film forming composition can be produced by the reaction of the compound represented by the formula (c4-8) or the formula (c4-9) with the compound represented by the formula (c4-10). In these reactions, compounds such as a compound having one to four group(s), which can react with an epoxy group, such as a hydroxy group, a thiol group, a carboxyl group and an amino group, and a compound having one to four epoxy group(s) other than the compounds of the formula (c4-8) to the formula (c4-10) can additionally be used, as necessary. When these other compounds are used, these other compounds can be used in an amount of, for example, 1 to 100 part(s) by mass, or 5 to 50 parts by mass, or 10 to 25 parts by mass per 100 parts by mass of the total amount of the compounds of the formula (c4-8) to (c4-10) used in the reaction.

Examples of the compound having one to four group(s), which can react with an epoxy group, such as a hydroxy group, a thiol group, a carboxyl group and an amino group include ethanedithiol, 1,3-propanedithiol, 1,4-benzenedithiol, 2-dimethylamino-1,3,5-triazine-4,6-dithiol, tris-2-carboxyethylisocyanuric acid, tris-3-carboxypropylisocyanuric acid, ethylenediamine, phenylenediamine, glycerol, triethanolamine, aminophenol, and 4,4'-dihydroxydiphenylsulfone.

Examples of the compound having one to four epoxy group(s) include tris(2,3-epoxypropyl)isocyanuric acid, tetraglycidyldiaminodiphenylmethane, bisphenol-A-diglycidyl ether, and bisphenol-5-diglycidyl ether.

The polymers having the repeating unit structures represented by the formula (c4-1) or the formula (c4-2) may be used singly or in combination of two or more types. A molecular weight of the polymer having the repeating unit structure represented by the formula (c4-1) or the formula (c4-2) is, for example, 1000 to 200000, or for example 3000 to 100000, or 4000 to 30000, or 5000 to 25000 as a weight average molecular weight.

In order to avoid intermixing with a photoresist film (layer D) to be overcoated, the organic antireflective film (layer C) forming composition is preferably cross-linked by heating after the application. The organic antireflective film (layer C) forming composition can further contain a cross-linking agent component. Examples of the cross-linking agents include melamine types, substituted urea types, and their polymer types. Preferably, the cross-linking agents have at least two cross-link forming substituents and are compounds such as methoxymethylated glycoluryl, butoxymethylated glycoluryl, methoxymethylated melamine, butoxymethylated melamine, methoxymethylbenzoguanamine, butoxymethylbenzoguanamine, methoxymethylurea, butoxymethylurea, methoxymethylthiourea or methoxymethylthiourea. In addition, condensates of these compounds can also be used. Although an added amount of the cross-linking agent varies depending on an application solvent used, a base substrate used, a required solution viscosity, a required film shape and the like, the amount of the cross-linking agent to the total solid content is 0.001 to 80% by mass, preferably 0.01 to 50% by mass, and more preferably 0.05 to 40% by mass. These cross-linking agents may cause cross-linking reaction due to self-condensation. However, when crosslinkable substituents exist in the above-described polymer according to the present invention, these agents can cause a cross-linking reaction with these crosslinkable substituents.

For catalysts promoting the above-described cross-linking reaction, acidic compounds such as p-toluenesulfonic acid, trifluoromethanesulfonic acid, pyridinium-p-toluenesulfonic acid, salicylic acid, sulfosalicylic acid, citric acid, benzoic acid, hydroxybenzoic acid and naphthalene carboxylic acid and/or heat acid generators such as 2,4,4,6-tetrabromocyclohexadienone, benzoin tosylate, 2-nitrobenzyl tosylate and other organic sulfonic acid alkyl esters can be formulated.

Formulation amount to the total solid content is 0.0001 to 20% by mass, preferably 0.0005 to 10% by mass.

Photoacid generators can be added to the organic antireflective film (layer C) forming composition used in the present invention, in order to match the acidity to a photoresist to be overcoated on the upper later of the forming composition during a lithographic process. Examples of preferable photoacid generators include onium salt type photoacid generators such as bis(4-t-butylphenyl)iodonium trifluoromethanesulfonate and triphenylsulfonium trifluoromethanesulfonate, halogen containing compound type photoacid generators such as phenyl-bis(trichloromethyl)-s-triazine, sulfonic acid type photoacid generators such as benzoin tosylate and N-hydroxysuccinimide trifluoromethanesulfonate. A content of the above-described photoacid generators to the total solid content is 0.2 to 10% by mass, preferably 0.4 to 5% by mass.

For solvents dissolving the above-mentioned polymers (c), cross-linking agent components, cross-linking catalysts and the like, ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate and the like can be used. These organic solvents can be used singly or in combination of two or more types.

Moreover, high boiling point solvents such as propylene glycol monobutyl ether and propylene glycol monobutyl ether acetate can be used by mixing them. In these solvents, propylene glycol monomethyl ether, propylene glycol monomethyl ether acetate, ethyl lactate, butyl lactate, cyclohexanone and the like are preferable for improvement of leveling property.

As for the polymer (c) used in the organic antireflective film (layer C) forming composition used in the present invention, when the polymer is formed, the monomer forming the structure unit can further be copolymerized with a non-crosslinkable monomer, and whereby fine adjustment of a dry etching rate, reflection coefficient and the like can be performed. Examples of such copolymerizable monomers include following compounds. For example, these monomers are compounds having one addition-polymerizable unsaturated bond selected from acrylates, acrylamides, methacrylates, methacrylamides, allyl compounds, vinyl ethers, vinyl esters, styrenes, crotonates, and the like.

Examples of acrylates include alkyl acrylates in which the number of carbon atoms of the alkyl group is 1 to 10.

Examples of methacrylates include alkyl methacrylates in which the number of carbon atoms of the alkyl group is 1 to 10.

Examples of acrylamides include acrylamide, N-alkylacrylamides, N-arylacrylamides, N,N-dialkylacrylamides, N,N-diarylacrylamides, N-methyl-N-phenylacrylamide, and N-2-acetamideethyl-N-acetyl acrylamide.

Examples of methacrylamides include methacrylamide, N-alkylmethacrylamides, N-arylmethacrylamides, N,N-dialkylmethacrylamides, N,N-diarylmethacrylamides, N-methyl-N-phenylmethacrylamide, and N-ethyl-N-phenylmethacrylamide.

Examples of vinyl ethers include alkyl vinyl ethers and vinyl aryl ethers.

Examples of vinyl esters include vinyl butylate, vinyl isobutylate and vinyl trimethylacetate.

Examples of styrenes include styrene, alkylstyrenes, alkoxystyrenes, halogenated styrenes and carboxystyrenes.

Examples of crotonates include alkyl crotonates such as butyl crotonate, hexyl crotonate and glycerin monocrotonate.

In addition, such copolymerizable monomers include dialkyl itaconates, dialkyl esters or monoalkyl esters of maleic acid or fumaric acid, crotonic acid, itaconic acid, maleic anhydride, lactones, acrylonitrile, methacrylonitrile, and maleilonitrile. Other monomers can generally be used as long as the monomers are copolymerizable addition-polymerizable unsaturated compounds.

In the present invention, in common to each layer of forming composition, light-absorption agents, rheology control agents, adhesion auxiliary agents, surfactants and the like can further be added to the organic underlayer film (layer A) forming composition, the silicon-containing hard mask (layer B) forming composition and the organic antireflective film (layer C) forming composition.

For light absorption agents, for example, commercially available light absorption agents described in "Kogyouyou Shikiso no Gijutu to Shijyo (Technology and Market of Industrial Pigment)" (published by CMC Publishing Co., Ltd.) and "Senryo Binran (Dye Handbook)" (edited by The Society of Synthetic Organic Chemistry, Japan), for example, C. I. Disperse Yellow 1, 3, 4, 5, 7, 8, 13, 23, 31, 49, 50, 51, 54, 60, 64, 66, 68, 79, 82, 88, 90, 93, 102, 114 and 124; C. I. Disperse Orange 1, 5, 13, 25, 29, 30, 31, 44, 57, 72 and 73; C. I. Disperse Red 1, 5, 7, 13, 17, 19, 43, 50, 54, 58, 65, 72, 73, 88, 117, 137, 143, 199 and 210; C. I. Disperse Violet 43; C. I. Disperse Blue 96; C. I. Fluorescent Brightening Agent 112, 135 and 163; C. I. Solvent Orange 2 and 45; C. I. Solvent Red 1, 3, 8, 23, 24, 25, 27 and 49; C. I. Pigment Green 10; and C. I. Pigment Brown 2 can preferably be used. The above-described light absorption agents are formulated in a ratio of 10% by mass or less, preferably 5% by mass or less to the total solid contents.

Rheology control agents are added for the purpose of improving flowability of the film forming compositions and particularly of improving uniformity of film thicknesses during a baking process. Specific examples of rheology control agents can include phthalic acid derivatives such as dimethyl phthalate, diethyl phthalate, diisobutyl phthalate, dihexyl phthalate and butylisodecyl phthalate; adipic acid derivatives such as dinormalbutyl adipate, diisobutyl adipate, diisooctyl adipate and octyldecyl adipate; maleic acid derivatives such as dinormalbutyl maleate, diethyl maleate and dinonyl maleate; oleic acid derivatives such as methyl oleate, butyl oleate and tetrahydrofurfuryl oleate; or stearic acid derivatives such as normalbutyl stearate and glyceryl stearate. These rheology control agents are usually formulated in a ratio of less than 30% by mass to the total solid content.

Adhesion auxiliary agents are added for the purpose of mainly improving adherence to a substrate or an underlayer film, and particularly of preventing a photoresist from peeling during development. Specific examples of the adhesion auxiliary agents can include chlorosilanes such as trimethylchlorosilane, dimethylvinylchlorosilane, and methyldiphenylchlorosilane, chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, and dimethyltrimethylsilylamine, trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzthiazole, 2-mercaptobenzoxazole, urazole, thiouracil, mercaptoimidazole, and mercaptopyrimidine; and ureas such as 1,1-dimethylurea and 1,3-dimethylurea, or thiourea compounds. These adhesion auxiliary agents are usually formulated in a ratio of less than 5% by mass, preferably less than 2% by mass to the total solid content.

In order to prevent generation of pinholes, striations or the like, and to further improve application property against surface irregularity, surfactants can be formulated in the film forming composition used in the present invention. Examples of surfactants include nonionic surfactants of, for example, polyoxyethylene alkyl ethers such as a polyoxyethylene lauryl ether, a polyoxyethylene stearyl ether, a polyoxyethylene cetyl ether and a polyoxyethylene oleyl ether; polyoxyethylene alkyl aryl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine type surfactants such as Eftop EF301, EF303, EF352 (manufactured by JEMCO Inc.), Megafac F171, F173 (manufactured by DIC Corporation), Fluorad FC430, FC431 (manufactured by Sumitomo 3M Limited), and AsahiGuard AG710, Surflon S-382, SC101, SC102, SC103, SC104, SC105, SC106 (manufactured by AGC SEIMI CHEMICAL CO., LTD.); and a organosiloxane polymer KP341 (manufactured by Shin-Etsu Chemical Co., Ltd.). A formulated amount of these surfactants is usually 0.2% by mass or less, preferably 0.1% by mass or less to the total solid content. These surfactants can be added singly or in combination of two or more types.

Both a negative type and a positive type can be used for the photoresist film (layer D) according to the present invention. Examples of photoresists include a positive type photoresist made of a novolac resin and 1,2-naphthoquinonediazide sulfonic acid ester; a chemical amplification type photoresist made of a binder having a group which increases an alkaline dissolution rate by decomposition with an acid and a photoacid generator; a chemical amplification type photoresist made of an alkaline soluble binder, a low molecular weight compound which increases an alkaline dissolution rate of the photoresist by decomposition with an acid, and a photoacid generator; and a chemical amplification type photoresist made of a binder having a group which increases an alkaline dissolution rate by decomposition with an acid, a low molecular weight compound which increases an alkaline dissolution rate of the photoresist by decomposition with an acid, and a photoacid generator; a photoresist having Si atoms in the skeleton. For example, APEX-E (trade name) manufactured by Rohm and Haas Company, PAR 710 (trade name) manufactured by Sumitomo Chemical Co., Ltd., and SEPR 430 (trade name) manufactured by Shin-Etsu Chemical Co., Ltd. can be included. In addition, a fluorine atom-containing polymer type photoresist described in, for example, Proc. SPIE, Vol. 3999, 330-334 (2000), Proc. SPIE, Vol. 3999, 357-364 (2000), and Proc. SPIE, Vol. 3999, 365-374 (2000) can be included.

For developing solutions of the photoresist film (layer D) according to the present invention, aqueous solutions of alkalis that are, for example, inorganic alkalis such as sodium hydroxide, potassium hydroxide, sodium carbonate, sodium silicate, sodium metasilicate and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide and choline; cyclic amines such as pyrrole and piperidine can be used. In addition, alcohols such as isopropyl alcohol or surfactants such as nonion types may be added to the aqueous solutions of alkalis in an adequate amount to be used. In these developing solutions, preferable developing solutions are quaternary ammonium salts, more preferably tetramethylammonium hydroxides and cholines.

A method for manufacturing a semiconductor device according to the present invention includes: forming an organic underlayer film (layer A) on a semiconductor substrate, forming a silicon-containing hard mask (layer B) on the top thereof, forming an organic antireflective film (layer C) on the top thereof, forming a photoresist film (layer D) on the top thereof, forming a resist pattern in the photoresist film (layer D) by exposure and development, etching the organic antireflective film (layer C) with the resist pattern, etching the silicon-containing hard mask (layer B) with the patterned organic antireflective film (layer C), etching the organic underlayer film (layer A) with the patterned silicon-containing hard mask (layer B), and processing the semiconductor substrate with the patterned organic underlayer film (layer A).

In the processes, the organic underlayer film (layer A) has a film thickness of 50 to 500 nm; the silicon-containing hard mask (layer B) has a film thickness of 50 to 200 nm; the organic antireflective film (layer C) has a film thickness of 10 to 100 mm; and a film thickness ratio of layer A:layer B:layer C is preferably 1 to 10:1 to 5:1.

The organic underlayer film (layer A) forming composition used in the present invention is applied on a substrate (for example, a silicon wafer substrate, silicon/silicon dioxide coated substrate, a silicon nitride substrate, a glass substrate, an ITO substrate, a polyimide substrate, and a low-dielectric constant material (a low-k material) coated substrate) used for manufacturing a semiconductor device by use of adequate application methods with a spinner and a coater, for example, and then the applied composition is baked to form the organic underlayer film (layer A). Baking conditions are appropriately selected form a baking temperature of 80° C. to 250° C. and a baking time of 0.3 to 60 minutes. Preferably, a baking temperature is 150° C. to 250° C. and a baking time is 0.5 to 2 minutes. Then, a silicon-containing hard mask (layer B) forming composition is applied on the organic underlayer film (layer A), and the silicon-containing hard mask (layer B) is formed with the above-described baking conditions. After that, an organic antireflective film (layer C) forming composition is applied on the silicon-containing hard mask (layer B), and the organic antireflective film (layer C) is formed with the above-described baking conditions. Furthermore, a photoresist film (layer D) forming composition is applied on the organic antireflective film (layer C), and the photoresist film (layer D) is formed with the above-described baking conditions.

A film thickness of the photoresist film (layer D) is, for example, 50 to 10000 nm, or 100 to 2000 nm, or 200 to 1000 mm.

Then, an exposure is performed through a predetermined mask. A KrF excimer laser (wavelength: 248 nm), an ArF excimer laser (wavelength: 193 nm), an F2 excimer laser (wavelength: 157 nm) and the like can be used for the exposure. After the exposure, a post exposure bake can also be performed, as necessary. The post exposure bake is preformed under appropriately selected conditions from a heating temperature of 70° C. to 150° C. and a heating time of 0.3 to 10 minutes.

Then, a development is performed with a developing solution. By the development, for example, when a positive type photoresist is used, an exposed part of the photoresist is removed to form a photoresist pattern.

Development conditions are appropriately selected form a temperature of 5° C. to 50° C. and a time of 10 to 300 seconds.

The organic antireflective film (layer C) is removed by using the pattern of thus formed photoresist film (layer D) as a protective film. Then, the silicon-containing hard mask (layer B) is removed by using the patterned organic antireflective film (layer C) as a protective film. After that, the organic underlayer film (layer A) is removed by using the patterned silicon-containing hard mask (layer B) as a protective film. Finally, the semiconductor substrate is processed by using the patterned organic underlayer film (layer A) as a protective film. A part of the underlayer film (intermediate layers) in which the photoresist film is removed is removed by dry etching and the semiconductor substrate is exposed.

First, the organic antireflective film (layer C) is removed by using the patterned photoresist film (layer D) as a protective film. The removal of the organic antireflective film (layer C) is preferably performed by dry etching with an oxygen type gas or fluorine type gas (for example, $CF_4$ gas). The photoresist film (layer D) is also removed by use of the oxygen type gas or the fluorine type gas (for example, $CF_4$ gas). However, since the organic antireflective film (layer C) has a faster dry etching rate, the resist pattern can be precisely transferred to the organic antireflective film (layer C).

After that, for dry etching of the silicon-containing hard mask (layer B), gases such as tetrafluoromethane ($CF_4$), perfluorocyclobutane ($C_4F_8$), perfluoropropane ($C_3F_8$), trifluoromethane, carbon monoxide, argon, oxygen, nitrogen, sulfurhexafluoride, difluoromethane, nitrogen trifluoride and chlorine trifluoride, chlorine, trichloroborane, and dichloroborane can be used. Particularly, a chlorine type gas and fluorine type gas are preferably used. In dry etching with a chlorine type gas and fluorine type gas, the photoresist made of organic substances are basically difficult to remove. On the contrary, the silicon-containing hard mask (layer B) containing many silicon atoms is rapidly removed by use of a chlorine type gas and fluorine type gas. Accordingly, reduction of film thickness of the photoresist film (layer D) and the organic antireflective film (layer C) accompanied with dry etching of the silicon-containing hard mask (layer B) can be suppressed. As a result, the photoresist can be used in thin film. Examples of chlorine type gasses include dichloroborane, trichloroborane, chlorine, carbon tetrachloride, and chloroform.

After that, the organic underlayer film (layer A) is removed by using the film made of the patterned photoresist film (layer D), the organic antireflective film (layer C) and the silicon-containing hard mask (layer B) as protective films. The organic underlayer film (layer A) is preferably dry etched with the oxygen type gas. The reason is because the silicon-containing hard mask (layer B) containing many silicon atoms is difficult to be removed by dry etching with the oxygen type gas.

Finally, the semiconductor substrate is processed. The process of the semiconductor substrate is preferably performed by dry etching with the fluorine type gas.

Examples of fluorine type gasses include tetrafluoromethane ($CF_4$), perfluorocyclobutane ($C_4F_8$), perfluoropropane ($C_3F_8$), trifluoromethane ($CHF_3$), and difluoromethane ($CH_2F_2$). These gasses can be used as a mixed gas with inert gasses.

According to the present invention, after the organic underlayer film (layer A) is formed on the substrate, the silicon-containing hard mask (layer B) and the organic antireflective film (layer C) are formed on the top thereof, and the photoresist film (layer D) is further coated on the top thereof. By the application, a pattern width of the photoresist film (layer D) becomes narrow. Even when the photoresist film (layer D) is thinly coated in order to avoid pattern collapse, the substrate can be processed by selecting an adequate etching gas. For example, the silicon-containing hard mask (layer B) can be processed by use of a chlorine type gas or fluorine type gas having a sufficiently rapid etching rate to the photoresist film (layer D) and the organic antireflective film (layer C) as an etching gas. In addition, the organic underlayer film (layer A) can be processed by use of an oxygen type gas having a sufficiently rapid etching rate to the silicon-containing hard mask as an etching gas. Furthermore, the semiconductor substrate can be processed by use of a fluorine type gas having a sufficiently rapid etching rate to the organic underlayer film (layer A) as an etching gas.

In addition, the substrate may also have an inorganic type antireflective film formed by CVD method and the like on the surface thereof, and an organic underlayer film (layer A) may also be formed on the top thereof.

Moreover, depending on a wavelength of the light used during a lithographic process, the organic underlayer film (layer A), the silicon-containing hard mask (layer B) and the organic antireflective film (layer C) according the invention may absorb the light. In such a case, these films can function as an antireflective film having the effect to prevent the reflected light from the substrate. In addition, the organic antireflective film (layer C) according to the present invention can be used as a layer for preventing interaction between the substrate and the photoresist; a layer having a function of preventing adverse effects to the substrate caused by a material used for the photoresist or a substance generated during exposure to the photoresist; a layer having a function of preventing diffusion of a material generated from the substrate during heating and baking to the upper layer of photoresist; a barrier layer for decreasing a poisoning effect of the photoresist layer caused by a semiconductor substrate dielectric layer; and the like. In order to realize a thin film resist which is required for forming fine patterns, a quadruple-layer structure in which the organic antireflective film (layer C) having good affinity to the silicon-containing hard mask (layer B) and the photoresist (layer D) is placed between (layer B) and (layer D) is formed. Each layer of the quadruple-layer structure provides effective functions, and efficient influence to form the fine patterns compared with a conventional triple-layer structure (made of an organic underlayer film (layer A), a silicon-containing hard mask (layer B) and photoresist (layer D)).

The present invention is more specifically described by the following examples. However, the present invention is not limited by these examples.

EXAMPLES

Synthesis Example 1

Production of an Organic Antireflective Film (Layer C) Forming Composition

[Chemical Formula 57]

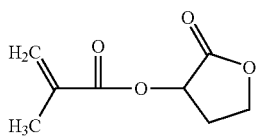

Formula (1)

After 6.6 g (0.039 mole) of butyrolactone methacrylate of the above formula (1), 6.6 g (0.046 mole) of hydroxypropyl methacrylate and 6.8 g (0.039 mole) of benzyl methacrylate were dissolved in 64.4 g of tetrahydrofuran, an atmosphere in the flask was replaced with nitrogen and the temperature of the mixture was raised to the reflux temperature. After starting the reflux, 0.2 g of azo-bis-isobutyronitrile (AIBN) dissolved in 10 g of tetrahydrofuran were added under nitrogen pressure, and the mixture was reacted for 24 hours. After cooling the reaction solution, the solution was poured into diethyl ether to reprecipitate a polymer, and the polymer was dried by heating to obtain the resin of a formula (2). The obtained resin had a degree of polymerization of 490 and a weight average molecular weight (Mw) of 80000 (polystyrene conversion). A ratio of x:y1:y2 was 31%:38%:31% and a yield was 90%.

[Chemical Formula 58]

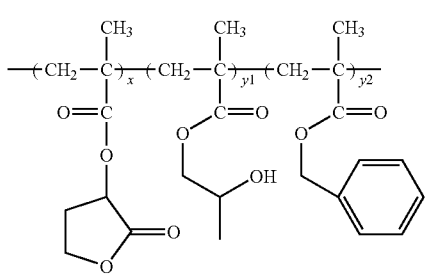

Formula (2)

4 g of hexamethoxymethylol melamine as a cross-linking agent and 0.4 g of p-toluenesulfonic acid as a cross-linking catalyst were mixed in 80 g of propylene glycol monomethyl ether solution containing 16 g of the resin obtained in Synthesis Example 1. The mixture was dissolved into 565 g of a solvent of propylene glycol monomethyl ether to be a 3.1% solution. Then, the solution was filtrated by using a microfilter made of polyethylene having a pore diameter of 0.10 μm and then, the filtered solution was filtrated by using a microfilter made of polyethylene having a pore diameter of 0.05 μm to prepare the organic antireflective film (layer C) forming composition.

Synthesis Example 2

Production of a Silicon-Containing Hard Mask (Layer B) Forming Composition 4.00 g of phenyltrimethoxysilane, 10.99 g of methyltriethoxysilane, 15.35 g of tetramethoxysilane, 7.08 g of water and 0.365 g of p-toluenesulfonic acid were added to 40.71 g of propylene glycol monomethyl ether. The mixture was stirred for 1 hour at 80° C. to obtain the resin of a formula (3). In the formula (3), a ratio of S1:S2:S3 is 11%:33%:56%. The obtained polysiloxane resin in the formula (3) had a weight average molecular weight of 11000 and a number average molecular weight of 3400.

[Chemical Formula 59]

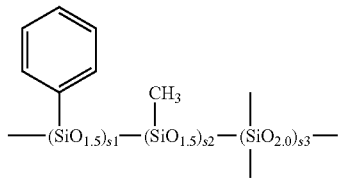

Formula (3)

Then, 0.195 g of p-toluenesulfonic acid, 2.68 g of propylene glycol monomethyl ether, 8.78 g of propylene glycol monomethyl ether acetate and 17.5 g of cyclohexanone were added to 10 g of the reaction solution having a concentration of solid content of 39% by mass to be a 10.0% by mass solution. The solution was filtrated by using a microfilter made of polyethylene having a pore diameter of 0.2 μm to obtain the solution of the silicon-containing hard mask (layer B) forming composition.

Synthesis Example 3

Production of a Silicon-Containing Hard Mask (Layer B) Forming Composition 5.0 g of a polysilane compound SI-2020 (manufactured by Osaka Gas Chemicals Co., Ltd., a weight average molecule weight: 5900, number average molecule weight: 1800, a ratio of X:Y in the polysilane of a formula (4) is 50%:50%, both terminals have silanol groups) having the unit structure of the formula (4),

[Chemical Formula 60]

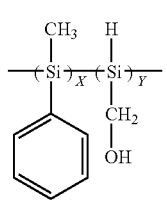

Formula (4)

5.0 g of KN 030 (manufactured by Osaka Organic Chemical Industry Ltd., a component is a copolymer of naphthol novolac and cresol novolac, and a ratio of copolymer is naphthol novolac of 70 mol % and cresol novolac of 30 mol %, and a weight average molecule weight is 1500), and 2.50 g of tetramethoxymethyl glycoluryl and 0.125 g of pyridinium-p-toluenesulfonic acid were added to 114.5 g of propylene glycol monomethyl ether acetate to be a 10.0% by mass solution. The solution was filtrated by using a microfilter made of polyethylene having a pore diameter of 0.2 μm to prepare the solution of the silicon-containing hard mask (layer B) forming composition.

Synthesis Example 4

Production of an Organic Underlayer Film (Layer A) Forming Composition

After 35 g (0.227 mole) of 2-vinylnaphthalene and 2.9 g (0.025 mole) of 2-hydroxyethyl acrylate were dissolved into 112 g of cyclohexanone, an atmosphere in the flask was replaced with nitrogen and a temperature of the mixture was raised to 60° C. After the temperature rose, 1.9 g of azo-bis-isobutyronitrile dissolved in 47 g of cyclohexanone were added to the mixture under nitrogen pressure, and the mixture was reacted for 24 hours at 60° C. After cooling the reaction solution, the reaction solution was poured into methanol to reprecipitate a polymer and the polymer was dried by heating to obtain the polymer of a formula (5). The obtained polymer had a weight average molecular weight (Mw) of 12000 (polystyrene conversion).

[Chemical Formula 61]

Formula (5)

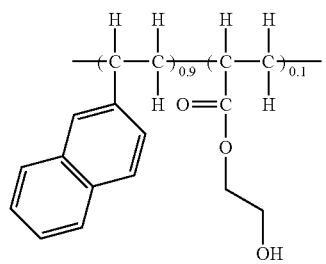

0.5 g of tetrabutoxymethyl glycoluryl and 0.05 g of pyridinium-p-toluenesulfonic acid were mixed to 6 g of the above obtained polymer, and the mixture was dissolved in 126 g of cyclohexanone and 54 g of propylene glycol monomethyl ether to be a solution. Then, the solution was filtrated by using a microfilter made of polyethylene having a pore diameter of 0.10 μm, and further filtrated by using a microfilter made of polyethylene having a pore diameter of 0.05 μm to prepare the solution of the organic underlayer film (layer A) forming composition.

Synthesis Example 5

Production of a Silicon-Containing Hard Mask (Layer B) Forming Composition 62.47 g of tetraethoxysilane, 8.49 g of phenyltrimethoxysilane, 6.35 g of vinyltrimethoxysilane, 7.64 g of methyltriethoxysilane and 84.95 g of ethanol were poured into 300 mL flask, and the mixture was dissolved. The obtained mixed solution was heated with stirring by using a magnetic stirrer and refluxed. An aqueous solution made by dissolving 1.56 g of hydrochloric acid into 28.55 g of ion-exchanged water was added to the mixed solution. After reacting the solution for 2 hours, the obtained reaction solution was cooled to room temperature. Then, 200 g of propylene glycol monomethyl ether acetate were added to the reaction solution, and reaction by-products of ethanol, water and hydrochloric acid were removed under reduced pressure to obtain the hydrolyzed condensated solution. A molecular weight (Mw) of the obtained polymer measured by GPC is 6000 in polystyrene conversion. 242.50 g of propylene glycol monomethyl ether and 181.79 g of propylene glycol monomethyl ether acetate were added to 75.28 g of this solution to prepare the silicon-containing hard mask (layer B) forming composition.

Example 1

The organic underlayer film (layer A) forming composition obtained in Synthesis Example 4 was applied on a silicon wafer, and the wafer was heated on the hot plate at 240° C. for 1 minute to obtain the organic underlayer film (layer A) having a film thickness of 200 nm. The silicon-containing hard mask (layer B) forming composition obtained in Synthesis Example 2 was applied on the top thereof, and the coated sample was heated on the hot plate at 240° C. for 1 minute to obtain the silicon-containing hard mask (layer B) having a film thickness of 70 nm. The organic antireflective film (layer C) forming composition obtained in Synthesis Example 1 was applied on the top thereof, and the coated sample was heated on the hot plate at 240° C. for 1 minute to obtain the organic antireflective film (layer C) having a film thickness of 30 nm. The commercially available photoresist solution (PAR 855 (trade name), manufactured by Sumitomo Chemical Co., Ltd.) was applied on the top thereof with a spinner, and the coated sample was heated on the hot plate at 100° C. for 1 minute to form the photoresist film (layer D) having a film thickness of 150 nm.

Example 2

The organic underlayer film (layer A) forming composition obtained in Synthesis Example 4 was applied on a silicon wafer, and the wafer was heated on the hot plate at 240° C. for 1 minute to obtain the organic underlayer film (layer A) having a film thickness of 200 nm. The silicon-containing hard mask (layer B) forming composition obtained in Synthesis Example 3 was applied on the top thereof, and the coated sample was heated on the hot plate at 240° C. for 1 minute to obtain the silicon-containing hard mask (layer B) having a film thickness of 70 nm. The organic antireflective film (layer C) forming composition obtained in Synthesis Example 1 was applied on the top thereof, and the coated sample was heated on the hot plate at 240° C. for 1 minute to obtain the organic antireflective film (layer C) having a film thickness of 30 nm. The commercially available photoresist solution (PAR 855 (trade name), manufactured by Sumitomo Chemical Co., Ltd.) was applied on the top thereof with a spinner, and the coated sample was heated on the hot plate at 100° C. for 1 minute to form the photoresist film (layer D) having a film thickness of 150 nm.

Example 3

The organic underlayer film (layer A) forming composition obtained in Synthesis Example 4 was applied on a silicon wafer, and the wafer was heated on the hot plate at 240° C. for 1 minute to obtain the organic underlayer film (layer A) having a film thickness of 200 nm. The silicon-containing hard mask (layer B) forming composition obtained in Synthesis Example 5 was applied on the top thereof, and the coated sample was heated on the hot plate at 240° C. for 1 minute to obtain the silicon-containing hard mask (layer B) having a film thickness of 40 nm. The organic antireflective film (layer C) forming composition obtained in Synthesis Example 1 was applied on the top thereof, and the coated sample was heated on the hot plate at 205° C. for 1 minute to obtain the organic antireflective film (layer C) having a film thickness of 30 nm. The commercially available photoresist solution (TARF-P6111 (trade name), manufactured by TOKYO OHKA KOGYO CO., LTD.) was applied on the top thereof with a spinner, and the coated sample was heated on the hot plate at 130° C. for 90 seconds to form the photoresist film (layer D) having a film thickness of 160 nm. This film was exposed through a mask that is set to form lines in which a line width of the photoresist and a width between the lines were 0.075 μm after development, that is, 0.075 μmL/S (dense lines), by using the FPA-6000AS4 scanner (trade name) manufactured by Canon Inc. (wavelength: 193 nm, NA, σ: 0.93/0.814 (Dipole)). Then, the film was baked on a hot plate at 130° C. for 90 seconds. After cooling the film, the film was developed by 0.26 N of tetramethylammonium hydroxide developing solution according to a 60-second single paddle process that is an industrial standard. From the result of cross-sectional SEM observations, when the evaluated lamination structure was used, sufficient resolution was obtained even in fine patterns of 75 nm, and the resist pattern was a rectangular shape.

Comparative Example 1

The organic underlayer film (layer A) forming composition obtained in Synthesis Example 4 was applied on a silicon wafer, and the wafer was heated on the hot plate at 240° C. for 1 minute to obtain the organic underlayer film (layer A) having a film thickness of 200 nm. The silicon-containing hard mask (layer B) forming composition obtained in Synthesis Example 2 was applied on the top thereof, and the coated sample was heated on the hot plate at 240° C. for 1 minute to obtain the silicon-containing hard mask (layer B) having a film thickness of 70 nm. The commercially available photoresist solution (PAR 855 (trade name), manufactured by Sumitomo Chemical Co., Ltd.) was applied on the top thereof with a spinner, and the coated sample was heated on the hot plate at 100° C. for 1 minute to form the photoresist film (layer D) having a film thickness of 150 nm.

Comparative Example 2

The organic underlayer film (layer A) forming composition obtained in Synthesis Example 4 was applied on a silicon wafer, and the wafer was heated on the hot plate at 240° C. for 1 minute to obtain the organic underlayer film (layer A) having a film thickness of 200 nm. The silicon-containing hard mask (layer B) forming composition obtained in Synthesis Example 3 was applied on the top thereof, and the coated sample was heated on the hot plate at 240° C. for 1 minute to obtain the silicon-containing hard mask (layer B) having a film thickness of 70 nm. The commercially available photoresist solution (PAR 855 (trade name), manufactured by Sumitomo Chemical Co., Ltd.) was applied on the top thereof with a spinner, and the coated sample was heated on the hot plate at 100° C. for 1 minute to form the photoresist film (layer D) having a film thickness of 150 nm.

(Intermixing Test with Photoresist)

The solution of each of the film forming composition prepared in Synthesis Examples 1 to 4 was applied on a silicone wafer with a spinner. The coated wafers were heated on a hot plate at 205° C. for 1 minute to form underlayer films (film thickness: 0.10 μm). A commercially available photoresist solution (UV133 (trade name) and the like, manufactured by Shipley Co., LLC.) was applied as an upper layer of each underlayer film with a spinner. The coated samples were heated on a hot plate at 120° C. for 1 minute. After exposure of the photoresist, post exposure heating was performed to the exposed photoresist at 115° C. for 1 minute. After developing the photoresist, a film thickness of each underlayer film was measured. The result confirmed that each underlayer film obtained from the solutions of the film forming compositions prepared in Synthesis Examples 1 to 4 caused no intermixing with the photoresist layer.

(Measurement of Dry Etching Rate)

For measurement of a ratio of the dry etching rate of the organic antireflective film (layer C) to the resist film (layer D), the etching rates of both layers are compared by decreased amount of the film thicknesses in constant time in a manner that both layers were formed on silicon wafers (baking at 205° C. for 1 minute), and $CF_4$ gas was used as an etching gas.

For measurement of a ratio of the dry etching rate of the silicon-containing hard mask (layer B) to the organic antireflective film (layer C), the etching rates of both layers are compared by decreased amount of the film thicknesses in constant time in a manner that both layers were formed on silicon wafers (baking at 205° C. for 1 minute), and $CF_4$ gas was used as an etching gas.

For measurement of a ratio of the dry etching rate of the organic underlayer film (layer A) to the silicon-containing hard mask (layer B), the etching rates of both layers are compared by decreased amount of the film thicknesses in constant time in a manner that both layers were formed on silicon wafers (baking at 205° C. for 1 minute), and oxygen gas was used as an etching gas.

For measurement of a ratio of the dry etching rate of a processed film of $SiO_2$ film on the semiconductor substrate to the organic underlayer film (layer A), the etching rates of both layers are compared by decreased amount of the film thickness in constant time in a manner that both layers were formed on silicon wafers (baking at 205° C. for 1 minute), and $CHF_3$/Ar gas (mixed ratio: $CHF_3$:Ar=1:4) was used as an etching gas.

In addition, in Comparative Examples, for measurement of a ratio of the dry etching rate of the silicon-containing hard mask (layer B) to the resist film (layer D), the etching rates of both layers are compared by decreased amount of the film thicknesses in constant time in a manner that both layers were formed on silicon wafers (baking at 240° C. for 1 minute), and $CF_4$ gas was used as an etching gas.

(Table 3)

TABLE 2

| | Ratios of dry etching rate | | | |
|---|---|---|---|---|
| | Layer C/ Layer D | Layer B/ Layer C | Layer A/ Layer B | $SiO_2$ on substrate/ Layer A |
| Example 1 | 1.3 | 1.4 | 25 | 15 |
| Example 2 | 1.3 | 1.3 | 20 | 15 |

(Table 4)

TABLE 3

| | Ratios of dry etching rate | | |
|---|---|---|---|
| | Layer B/ Layer D | Layer A/ Layer B | $SiO_2$ on substrate/ Layer A |
| Comparative Example 1 | 1.4 | 25 | 15 |
| Comparative Example 2 | 1.4 | 25 | 15 |

Focus depth margin was evaluated according to the following method. Laminated films were formed on silicon wafers in the same manner as Examples 1 and 2 and Comparative Examples 1 and 2.

These films were exposed through a mask that is set to form nine lines in which a line width of the photoresist and a width between the lines were 0.09 μm after development, that is, 0.09 μmL/S (dense lines), by using the PAS5500/1100 scanner (trade name) manufactured by ASML (wavelength: 193 nm, NA, σ: 0.75, 0.89/0.59 (Annular)). Then, the film was baked on a hot plate at 100° C. for 60 seconds. After cooling the film, the film was developed with 0.26 N of tetramethylammonium hydroxide developing solution according to a 60-second single paddle process that is an industrial standard. The focus depth margin was determined as follows. That is, the above-described exposure was performed in a manner that the focus position was moved up and down in steps of 0.1 μm from the optimum focus position as reference position, and resist patterns were formed by a subsequent development process. When seven or more lines in nine photoresist lines, which were supposed to be formed, were formed, the sample was determined to pass the evaluation, and when remaining lines were six or less, the sample was determined to fail. A width of displacement between upper and lower focus positions where the sample can obtain the passing result was defined as a focus depth margin.

(Table 5)

TABLE 4

Measurement of focus depth margin

| | Focus depth margin (μm) | Limiting resolution (nm) | Bottom shape of resist |
|---|---|---|---|
| Example 1 | 0.7 | 80 | Good |
| Example 2 | 0.7 | 80 | Good |
| Comparative Example 1 | — | 100 | Skirt shape |
| Comparative Example 2 | — | 100 | Skirt shape |

In Table 4, (---) means that focus depth margin could not be calculated because the resist profile was a skirt shape.

It was confirmed that the laminates obtained from Examples 1 and 2 according to the present invention had wider focus depth margin and limiting resolution than those of Comparative Examples 1 and 2. The result shows that laminates of Examples have wide focus depth margin and limiting resolution when using exposure irradiating light having a wavelength of 193 nm, while maintaining a practical refractive index and attenuation coefficient.

The present invention is a method for manufacturing a semiconductor device which is achieved in a manner that a resist underlayer film having wide focus depth margin and high resolution is formed. The obtained laminate is effective for improvement of adherence of a photoresist as well as for prevention effect of reflection from a substrate.

Examples 1 and 2 have smaller values of limiting resolution than those of Comparative Examples 1 and 2, so that an excellent patterning shape can be formed without pattern collapse even in micro processing.

According to the present invention, a method for forming an excellent resist pattern made from a composition for a film material having high adherence to non-exposure parts of a resist layer, and high antireflection effect, and furthermore, causing no intermixing with the resist layer, having no diffusion substance to the resist during drying by heating, high resolution and excellent film thickness dependent property, can be provided.

INDUSTRIAL APPLICABILITY

A method for manufacturing a semiconductor device by using a laminate including each layer of an organic underlayer film, a silicon-containing hard mask, an organic antireflective film (layer C) and a photoresist film in this order on a semiconductor substrate. The semiconductor substrate can be processed by a fine and precise resist pattern formed in a manner that diffusion of acids during exposure of the photoresist is eliminated, focus depth margin of the photoresist is improved, and a shape of the resist pattern is set to a rectangular shape.

The invention claimed is:

1. The method for manufacturing a semiconductor device comprising:
    laminating each layer of an organic underlayer film (layer A), a silicon-containing hard mask (layer B), an organic antireflective film (layer C) and a photoresist film (layer D) in this order on a semiconductor substrate, wherein the organic underlayer film (layer A) is a layer including a polymer having an aromatic condensed ring in a main chain or a side chain bonded to the main chain.

2. The method for manufacturing a semiconductor device according to claim 1, wherein the organic underlayer film (layer A) has a film thickness of 50 to 500 nm;
    the silicon-containing hard mask (layer B) has a film thickness of 50 to 200 nm;
    the organic antireflective film (layer C) has a film thickness of 10 to 100 nm; and
    a film thickness ratio of layer A:layer B:layer C is 1 to 10:1 to 5:1.

3. The method for manufacturing a semiconductor device comprising:
    laminating each layer of an organic underlayer film (layer A), a silicon-containing hard mask (layer B), an organic antireflective film (layer C) and a photoresist film (layer D) in this order on a semiconductor substrate, wherein the organic underlayer film (layer A) is a layer including a polymer having a naphthalene ring in a main chain or a side chain bonded to the main chain.

4. The method for manufacturing a semiconductor device comprising:
    laminating each layer of an organic underlayer film (layer A), a silicon-containing hard mask (layer B), an organic antireflective film (layer C) and a photoresist film (layer D) in this order on a semiconductor substrate, wherein the silicon-containing hard mask (layer B) has a silicon content of 15 to 45% by mass in the silicon-containing hard mask (layer B).

5. The method for manufacturing a semiconductor device comprising:
    laminating each layer of an organic underlayer film (layer A), a silicon-containing hard mask (layer B), an organic antireflective film (layer C) and a photoresist film (layer D) in this order on a semiconductor substrate, wherein the silicon-containing hard mask (layer B) is a layer including a polymer containing a polysilane, a polysiloxane, a polycarbosilane or a combination thereof.

6. The method for manufacturing a semiconductor device comprising:
    laminating each layer of an organic underlayer film (layer A), a silicon-containing hard mask (layer B), an organic antireflective film (layer C) and a photoresist film (layer D) in this order on a semiconductor substrate, wherein the silicon-containing hard mask (layer B) is a layer including a polymer containing a polycarbosilane and a polysilane, a polysiloxane or a combination thereof.

7. The method for manufacturing a semiconductor device comprising:
laminating each layer of an organic underlayer film (layer A), a silicon-containing hard mask (layer B), an organic antireflective film (layer C) and a photoresist film (layer D) in this order on a semiconductor substrate, wherein the organic antireflective film (layer C) includes a polymer in which a molecular structure of the polymer contained in the organic antireflective film (layer C) is similar to a molecular structure of a polymer contained in the photoresist film (layer D).

8. The method for manufacturing a semiconductor device comprising:
laminating each layer of an organic underlayer film (layer A), a silicon-containing hard mask (layer B), an organic antireflective film (layer C) and a photoresist film (layer D) in this order on a semiconductor substrate, wherein the organic antireflective film (layer C) is a layer including a polymer having a benzene ring, a heterocyclic ring or a combination thereof in a main chain constituting the polymer or a side chain bonded to the main chain.

9. The method for manufacturing a semiconductor device according to claim 8, wherein the heterocyclic ring contained in the polymer of the organic antireflective film (layer C) is a lactone ring or a triazine ring.

10. The method for manufacturing a semiconductor device according to claim 1, comprising:
laminating each layer of an organic underlayer film (layer A), a silicon-containing hard mask (layer B), an organic antireflective film (layer C) and a photoresist film (layer D) in this order on a semiconductor substrate, wherein the organic antireflective film (layer C) includes a polymer having a content ratio of the benzene ring of 30 to 70% by mass.

* * * * *